(12) United States Patent
Tanikawa et al.

(10) Patent No.: US 12,721,189 B2
(45) Date of Patent: Aug. 25, 2026

(54) JUNCTION STRUCTURE AND SEMICONDUCTOR DEVICE

(71) Applicant: Rohm Co., Ltd., Kyoto (JP)

(72) Inventors: Kohei Tanikawa, Kyoto (JP); Oji Sato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 364 days.

(21) Appl. No.: 18/488,503

(22) Filed: Oct. 17, 2023

(65) Prior Publication Data

US 2024/0047312 A1 Feb. 8, 2024

Related U.S. Application Data

(63) Continuation of application No. PCT/JP2022/020467, filed on May 17, 2022.

(30) Foreign Application Priority Data

Jun. 8, 2021 (JP) ................................ 2021-095654

(51) Int. Cl.
*H01L 23/495* (2006.01)
*H01L 23/00* (2006.01)
(Continued)

(52) U.S. Cl.
CPC ....... *H10W 70/464* (2026.01); *H10W 70/481* (2026.01); *H10W 74/111* (2026.01); *H10W 90/811* (2026.01); *H10W 90/763* (2026.01)

(58) Field of Classification Search
CPC ........... H01L 23/49517; H01L 23/3107; H01L 23/49562; H01L 23/49575; H01L 24/40;
(Continued)

(56) References Cited

U.S. PATENT DOCUMENTS

2016/0380366 A1 12/2016 Onishi et al.
2020/0013703 A1* 1/2020 Matsuo .................. H01L 24/49

FOREIGN PATENT DOCUMENTS

DE 10 2018 200 830 A1 9/2018
DE 11 2018 001 927 T5 12/2019
(Continued)

OTHER PUBLICATIONS

Office Action issued in corresponding German Patent application No. 11 2022 002 286.8, Feb. 6, 2025, and machine translation (12 pages).

(Continued)

*Primary Examiner* — Tong-Ho Kim
(74) *Attorney, Agent, or Firm* — HSML P.C.

(57) ABSTRACT

A junction structure includes a conductive substrate having a conductive section, a terminal including an electro-conductive tubular holder, and a metal pin inserted into the holder, and a conductive bonding material bonding the conductive section and the holder. The metal pin includes a straight portion extending along a thickness direction of the conductive section. The holder includes a first through-hole extending in the thickness direction, and in which the straight portion of the metal pin is inserted. The conductive section includes a terminal bonding face to which the holder is bonded, and an opening formed in the terminal bonding face. At least a part of an outer peripheral edge of the opening is located on an inner side of an outer peripheral edge of the holder, as viewed in the thickness direction.

20 Claims, 31 Drawing Sheets

(51) Int. Cl.

| | |
|---|---|
| ***H01L 23/31*** | (2006.01) |
| ***H10W 70/40*** | (2026.01) |
| ***H10W 74/10*** | (2026.01) |
| ***H10W 90/00*** | (2026.01) |

(58) Field of Classification Search

CPC ......... H01L 2224/40137; H01L 25/072; H01L 23/3735; H01L 2224/0603; H01L 2224/40139; H01L 24/41; H01L 23/49811

USPC .......................................................... 257/666

See application file for complete search history.

(56) References Cited

FOREIGN PATENT DOCUMENTS

| | | | | |
|---|---|---|---|---|
| JP | 2010-129795 | | 6/2010 | |
| JP | 2012-004226 | | 1/2012 | |
| JP | 2012004226 A | * | 1/2012 | ............. H01L 24/32 |
| WO | 2018/168924 | | 9/2018 | |

OTHER PUBLICATIONS

International Search Report issued in International Application No. PCT/JP2022/020467, Aug. 16, 2022, 2 pages.

Written Opinion issued in International Application No. PCT/JP2022/020467, Aug. 16, 2022, 3 pages.

Office Action issued in corresponding Japanese Patent Application No. 2023-527587, Jan. 13, 2026, 6 pages w/translation.

* cited by examiner

A1
7
731
732
733
734
XIII
XIV
XVI
XVII
XVIII
XIX
XX
31B
(31)
31A
(31)
32A
(32)
34A(34,33)
34B(34,33)
34C(34,33)
34D(34,33)
35A(35,33)
35B(35,33)
35C(35,33)
51(5)
52(5)
521
522
523
524
53
240a
x
y

A1

31B(31)
31A(31)
31B(31)
732
732a
732a
734
733
72
23(2)
302
7
731
A1
32A(32)
32A(32)
x
y

A1
31B(31)
732
751
751a
592
72
76
240a
78
53
22A(22)
71
521
(52)
24A(2)
7
25A
25B
24B(2)
22B(22)
21
21a
21b
23
78
240a
76
2
751a
751
731
z
x

A1
34B(33)
35A(33)
31A
(31)
32A
(32)
751
751a
732
731
4A(4)
4B(4)
72
77
43
41
42
333
331
752
1A
(1)
1B
(1)
523
(52)
522
(52)
61A
(61)
61B
(61)
591
51
24A(2)
24B(2)
22A
(22)
22B
(22)
25A
25B
71
7
21
23
21a
21b
2
x
z

JUNCTION STRUCTURE AND SEMICONDUCTOR DEVICE

TECHNICAL FIELD

The present disclosure relates to a junction structure and a semiconductor device.

BACKGROUND ART

Semiconductor devices that include a power semiconductor element, such as a metal oxide semiconductor field effect transistor (MOSFET) or an insulated gate bipolar transistor (IGBT), are thus far known. Such semiconductor devices are applicable to a wide variety of electric devices, ranging from industrial apparatuses to home electric appliances, information terminals, automobile-related devices, and so forth. JP-A-2010-129795 discloses a conventional semiconductor device (power semiconductor module). The power semiconductor module according to JP-A-2010-129795 includes a ceramic circuit board, a power semiconductor element, a metal tube, an external terminal, and a transfer-molded resin (see FIG. 6 in JP-A-2010-129795). The ceramic circuit board includes a ceramic plate, and a conductive section (wiring pattern) formed of copper foil, and mounted on the ceramic plate. The power semiconductor element and the metal tube are located on the wiring pattern of the ceramic circuit board. The metal tube is bonded to the wiring pattern, for example via a solder. The external terminal is, for example, press-inserted into the metal tube. The external terminal is protruding from the upper face of the transfer-molded resin.

DETAILED DESCRIPTION OF EMBODIMENTS

Figure 1:
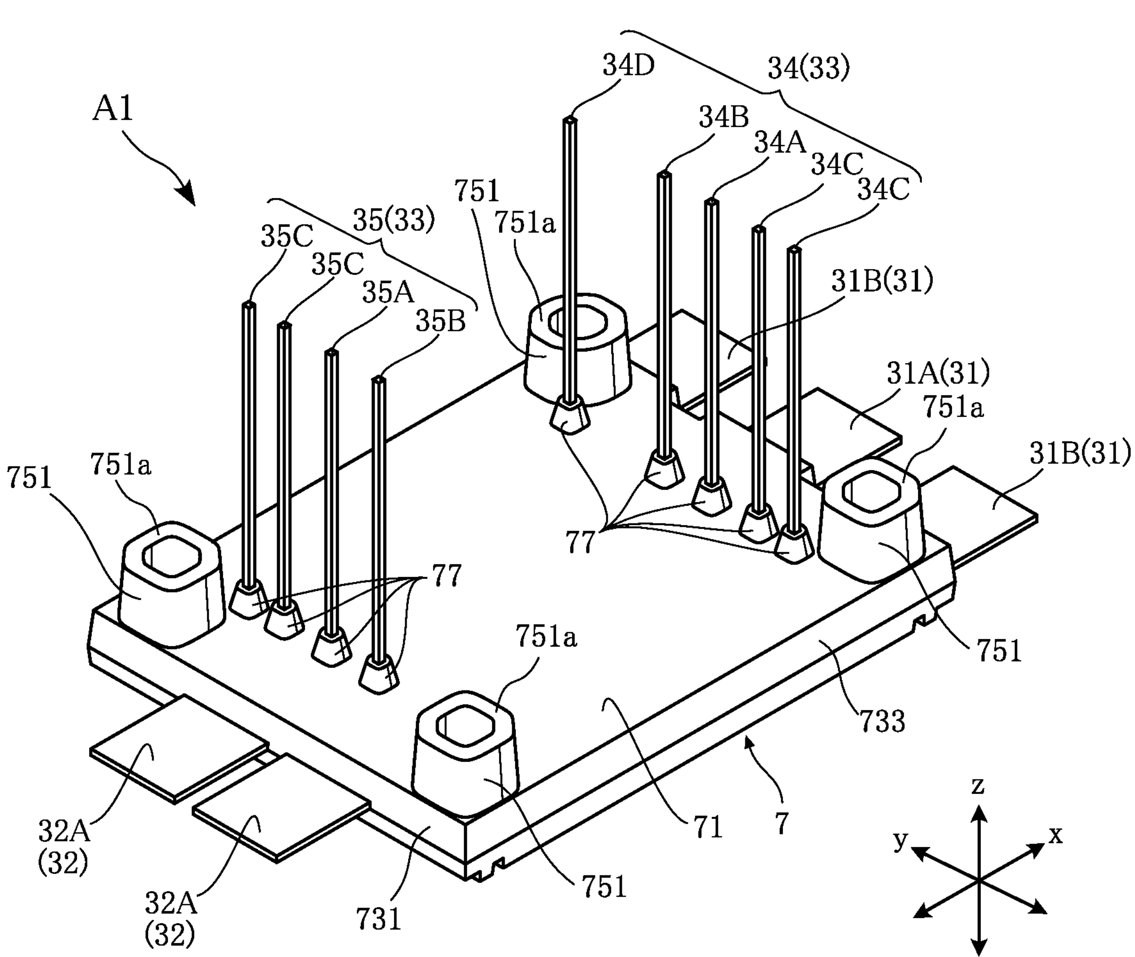
FIG. 1 is a perspective view showing a semiconductor device according to an embodiment.
Figure 2:
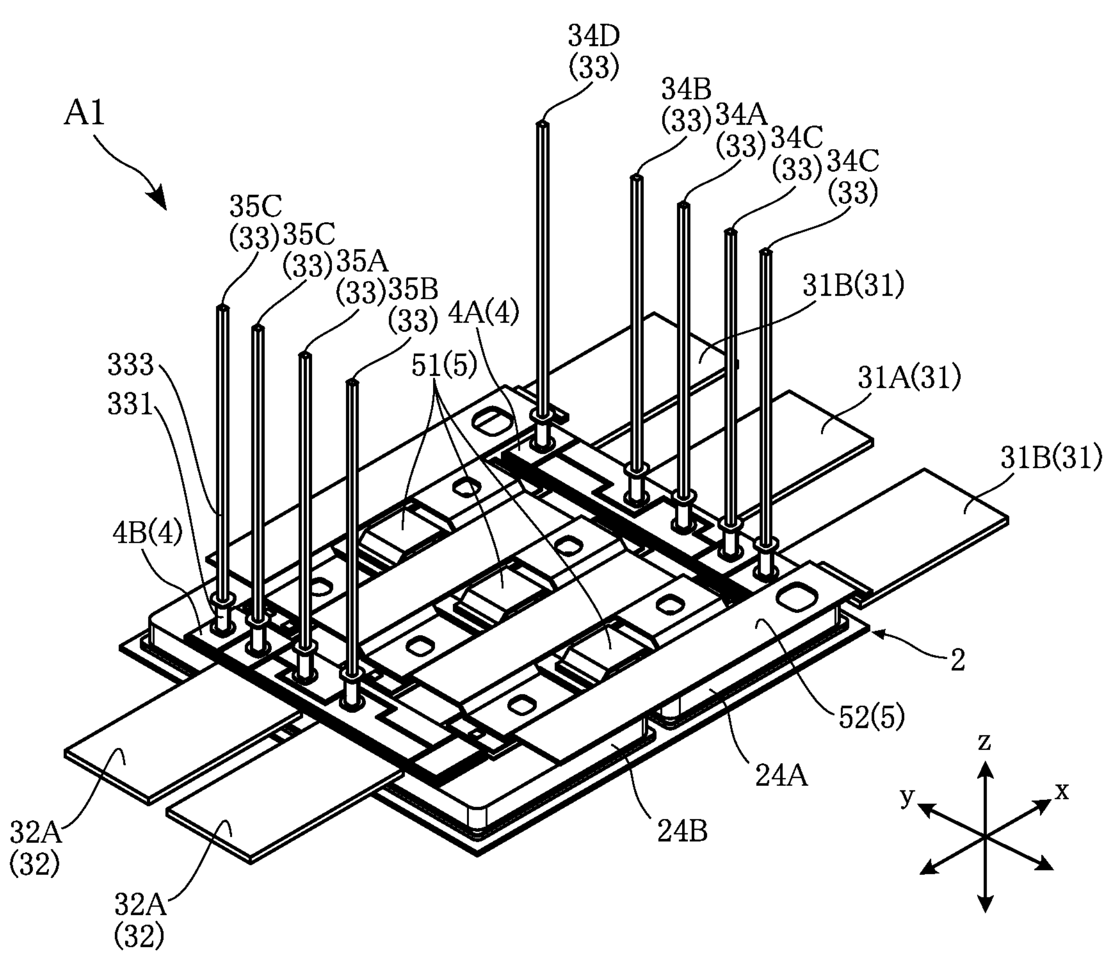
FIG. 2 is a perspective view corresponding to FIG. 1, from which a plurality of wires, a resin member, a resin portion, and a resin filling are excluded.

Hereafter, exemplary embodiments of a junction structure and a semiconductor device according to the present disclosure will be described, with reference to the drawings. In the drawings, the same or similar elements will be given the same numeral, and the description of such elements will not be repeated. The terms “first”, “second”, “third”, and so forth used in the present disclosure merely serve as a label, and are not intended to specify an order with respect to the objects accompanied with these terms.

In the description of the present disclosure, the expression “An object A is formed in an object B”, and “An object A is formed on an object B” imply the situation where, unless otherwise specifically noted, “the object A is formed directly in or on the object B”, and “the object A is formed in or on the object B, with something else interposed between the object A and the object B”. Likewise, the expression “An object A is arranged in an object B", and "An object A is arranged on an object B" imply the situation where, unless otherwise specifically noted, "the object A is arranged directly in or on the object B", and "the object A is arranged in or on the object B, with something else interposed between the object A and the object B". Further, the expression "An object A is located on an object B" implies the situation where, unless otherwise specifically noted, "the object A is located on the object B, in contact with the object B", and "the object A is located on the object B, with something else interposed between the object A and the object B". Further, the expression "An object A is overlapping with an object B as viewed in a certain direction" implies the situation where, unless otherwise specifically noted, "the object A is overlapping with the entirety of the object B", and "the object A is overlapping with a part of the object B".

FIG. 1 to FIG. 22 each illustrate an example of a semiconductor device A1 according to the present disclosure. The semiconductor device A1 includes a plurality of semiconductor elements 1, a base substrate 2, a first power terminal 31, a second power terminal 32, a plurality of control terminals 33, a conductive substrate 4, a conduction member 5, a plurality of conductive bonding materials 61 and 63, a plurality of wires 651 to 654, and a resin member 7. The conductive substrate 4 includes a first conductive substrate 4A and a second conductive substrate 4B. The conduction member 5 includes a first conduction member 51 and a second conduction member 52.

For the sake of convenience in description, the thickness direction of the semiconductor device A1 will be referred to as "thickness direction z". In the following description, one side in the thickness direction z may be referred to as upper side, and the other side as lower side. The expressions "upper", "lower", "upward", "downward", "upper face", "lower face", and so forth indicate relative positional relations between the components with respect to the thickness direction z, and are not necessarily intended to define the relation with the gravity direction. In addition, the term "in a plan view" refers to a view in the thickness direction z. A direction orthogonal to the thickness direction z will be referred to as "first direction x". For example, the first direction x corresponds to the left-right direction in the plan view of the semiconductor device A1 (see FIG. 4 and FIG. 5). A direction orthogonal to the thickness direction z and the first direction x will be referred to as "second direction y". For example, the second direction y corresponds to the up-down direction in the plan view of the semiconductor device A1 (see FIG. 4 and FIG. 5).

The plurality of semiconductor elements 1 each serve as a functional center of the semiconductor device A1. The semiconductor elements 1 each contain, for example, silicon carbide (SiC). The material of the semiconductor elements 1 may be silicon (Si), gallium arsenide (GaAs), or gallium nitride (GaN), without limitation to SiC. Each of the semiconductor elements 1 is, for example, a switching element. The semiconductor elements 1 each include a switching action unit Q1 (see FIG. 22), constituted of a metal-oxide-semiconductor field-effect transistor (MOSFET). The switching action unit Q1 may be constituted of a transistor other than the MOSFET, for example a field effect transistor including a metal-insulator-semiconductor FET (MISFET), or a bipolar transistor such as IGBT. The plurality of semiconductor elements 1 are of the same type as one another. Although the semiconductor elements 1 are configured as an n-channel MOSFET for example, the semiconductor elements 1 may be a p-channel MOSFET instead.

Figure 3:
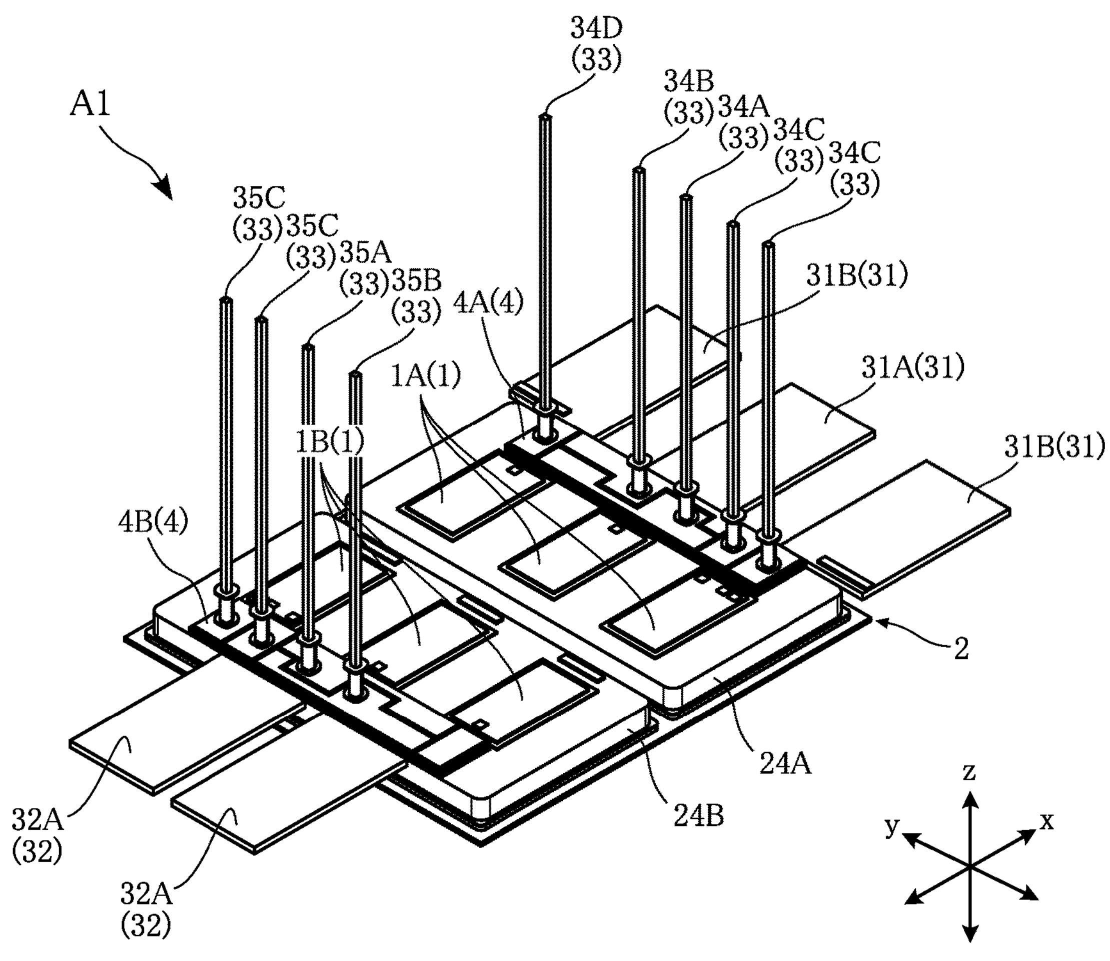
FIG. 3 is a perspective view corresponding to FIG. 2, from which a conduction member (first conduction member and second conduction member) is excluded.
Figure 7:
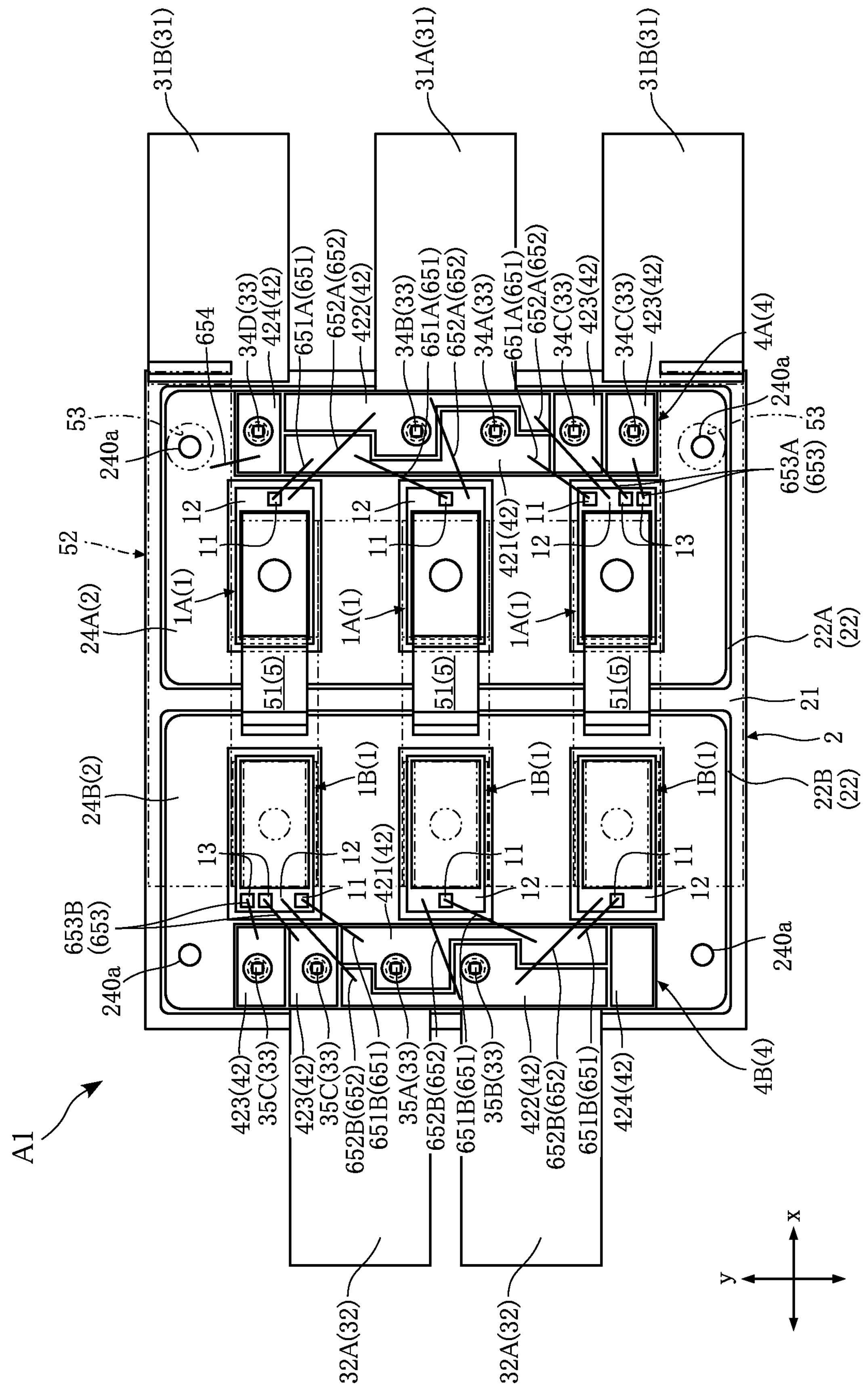
FIG. 7 is a plan view corresponding to FIG. 5, in which a part of a conduction member 5 (second conduction member) is indicated by imaginary lines.

The plurality of semiconductor elements 1 include, as shown in FIG. 3 and FIG. 7, at least one first semiconductor element 1A and at least one second semiconductor element 1B. In the illustrated example, the semiconductor device A1 includes a plurality (three) of the first semiconductor elements 1A, and a plurality (three) of the second semiconductor elements 1B. However, the number of first semiconductor elements 1A and the number of second semiconductor elements 1B are not limited to the above, but may be changed as desired, according to the performance required from the semiconductor device A1.

Figure 22:
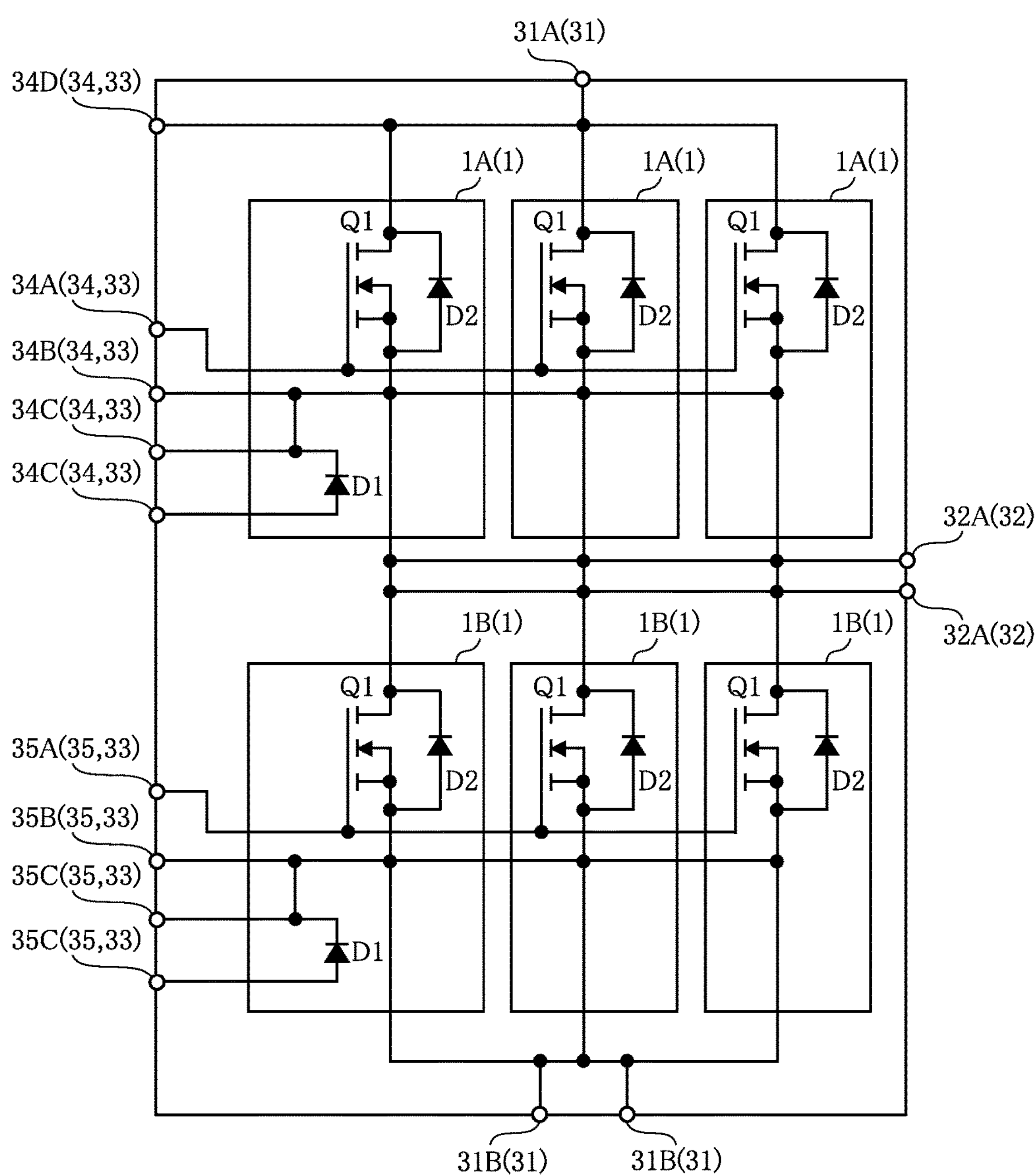
FIG. 22 is a circuit diagram showing an exemplary circuit configuration of the semiconductor device according to the embodiment.

The semiconductor device A1 is, for example, constituted in the form of a half-bridge circuit, as shown in FIG. 22. The plurality of first semiconductor elements 1A constitute an upper arm circuit of the semiconductor device A1, and the plurality of second semiconductor elements 1B constitute a lower arm circuit of the semiconductor device A1. In the upper arm circuit, as shown in FIG. 22, the plurality of first semiconductor elements 1A are connected in parallel to each other, and in the lower arm circuit, the plurality of second semiconductor elements 1B are connected in parallel to each other. The first semiconductor elements 1A are each connected in series to each of the second semiconductor elements 1B. In other words, each of the first semiconductor elements 1A is connected in series to each of the three second semiconductor elements 1B.

Figure 14:
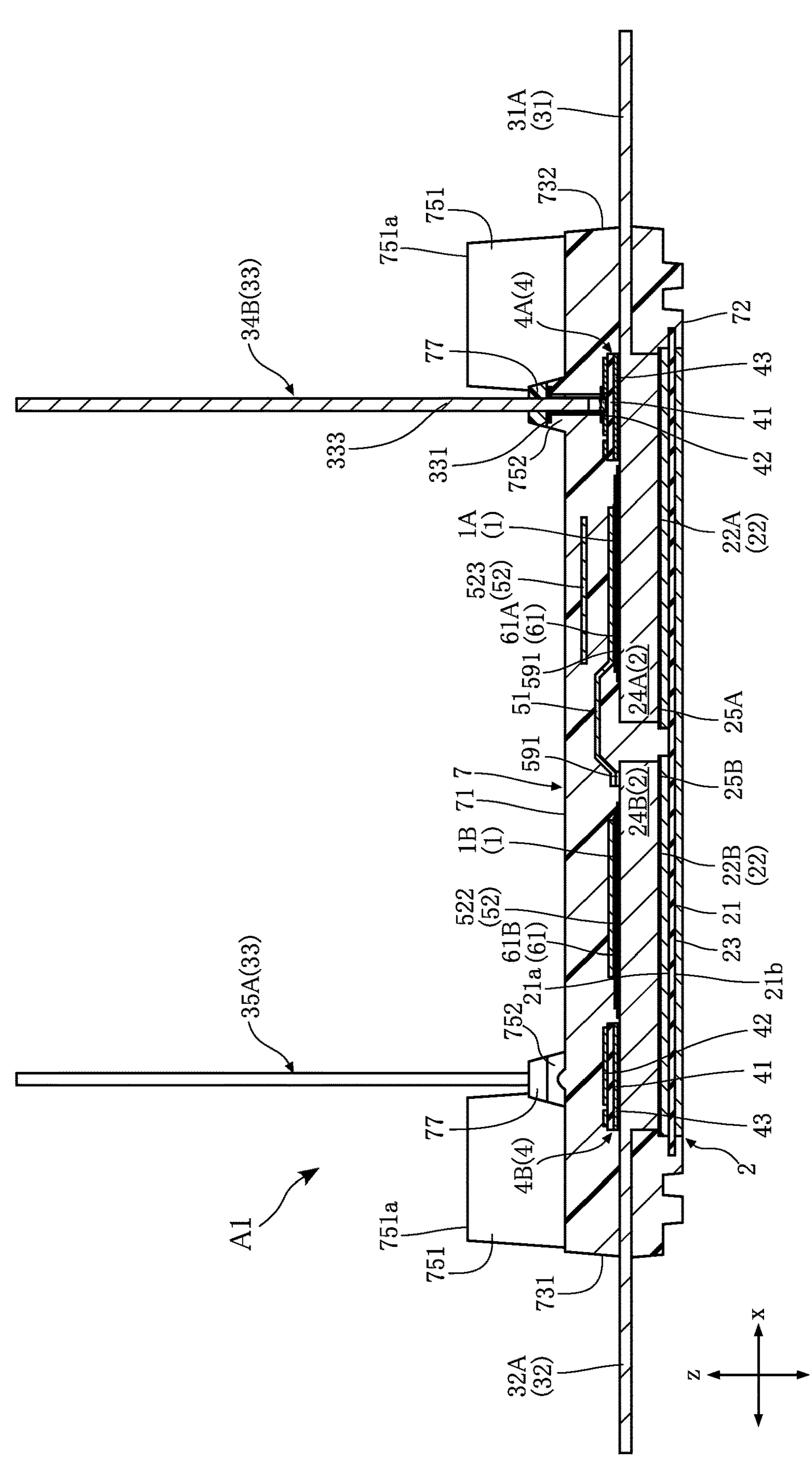
FIG. 14 is a cross-sectional view taken along a line XIV-XIV in FIG. 5.
Figure 15:
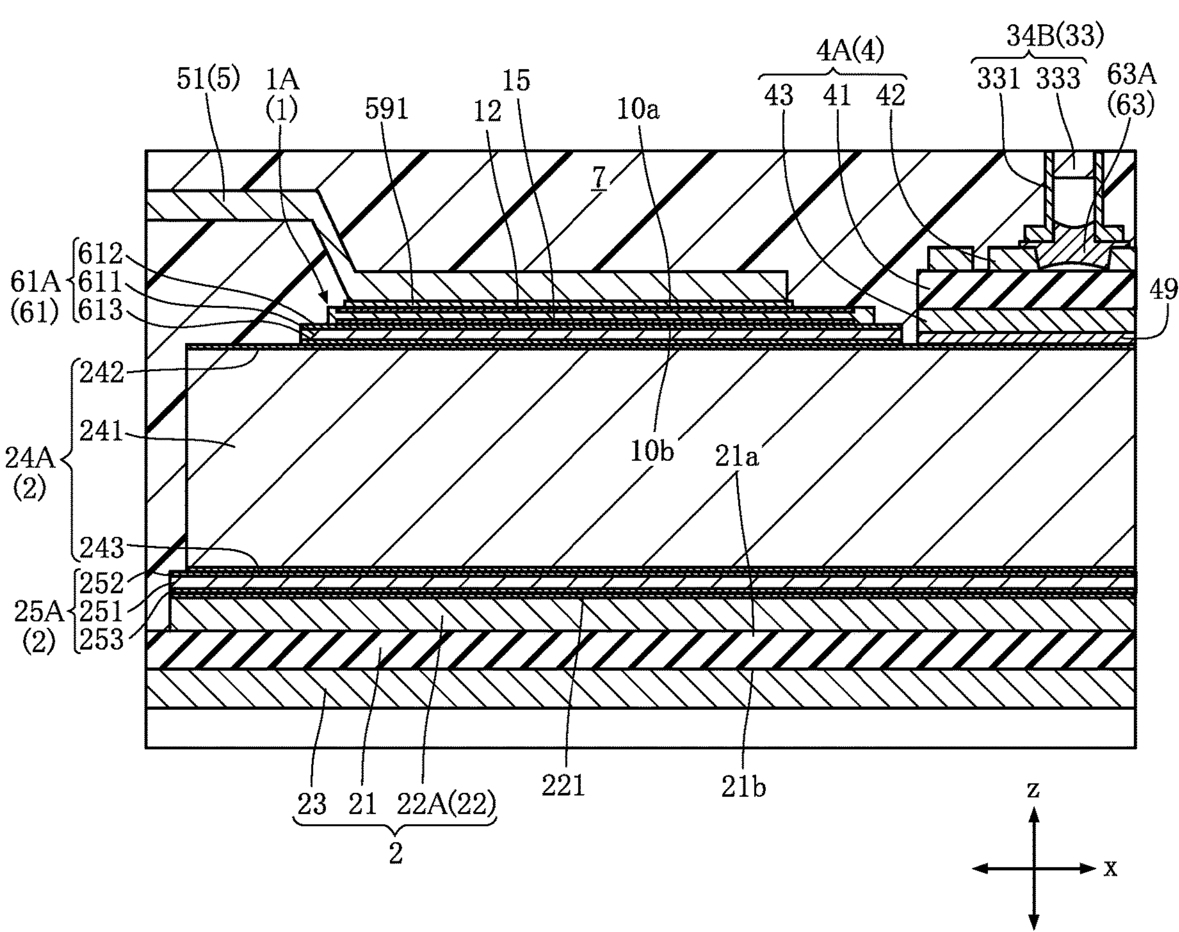
FIG. 15 is a partially enlarged cross-sectional view from FIG. 14.
Figure 16:
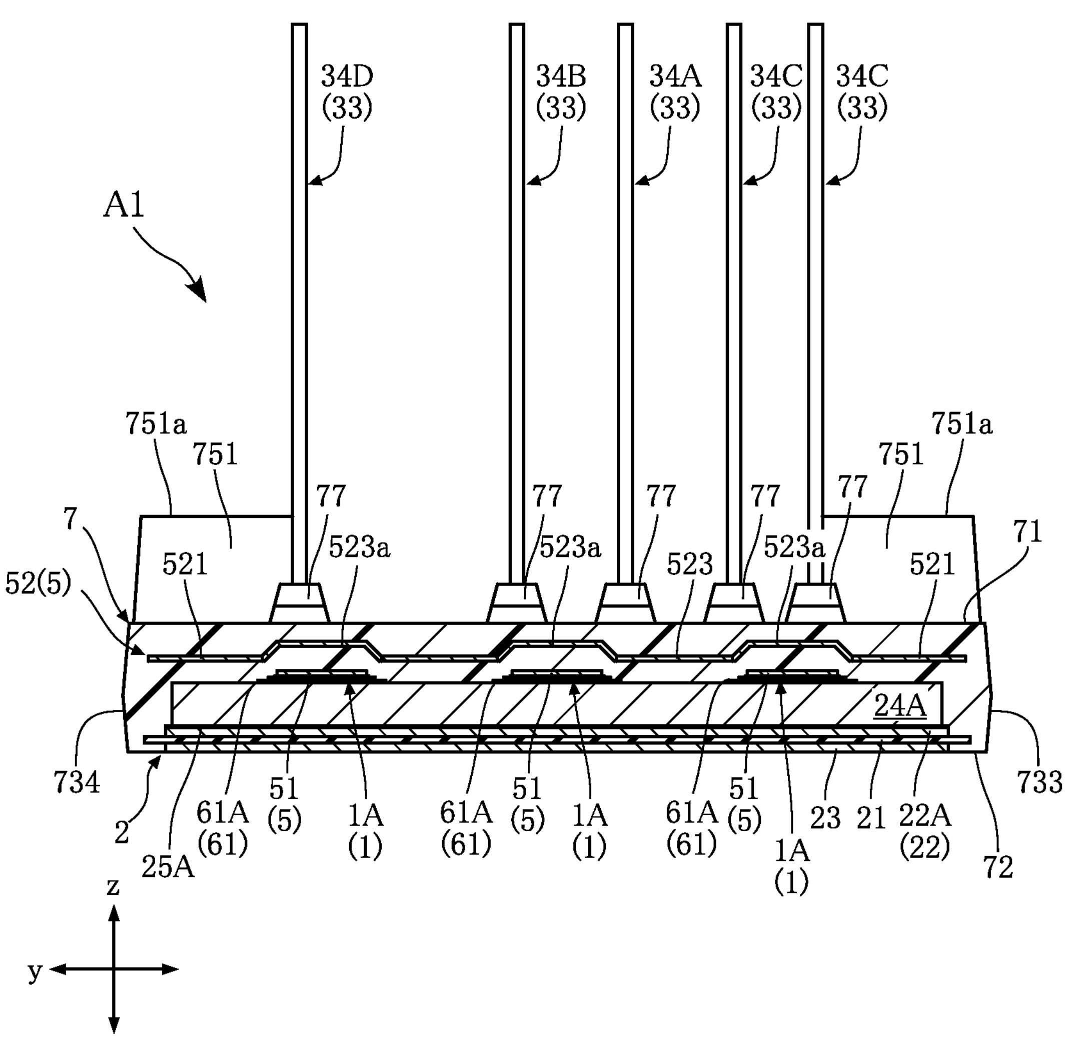
FIG. 16 is a cross-sectional view taken along a line XVI-XVI in FIG. 5.

The plurality of first semiconductor elements 1A are, as shown in FIG. 3, FIG. 7, and FIG. 16, mounted on the base substrate 2. In the example shown in FIG. 3, FIG. 7, and FIG. 16, the plurality of first semiconductor elements 1A are aligned in the second direction y, and spaced apart from each other. As shown in FIG. 14 and FIG. 15, the first semiconductor elements 1A are each conductively bonded to the base substrate 2 (first conductor 24A to be subsequently described), via the conductive bonding material 61 (conductive bonding material 61A to be subsequently described).

Figure 17:
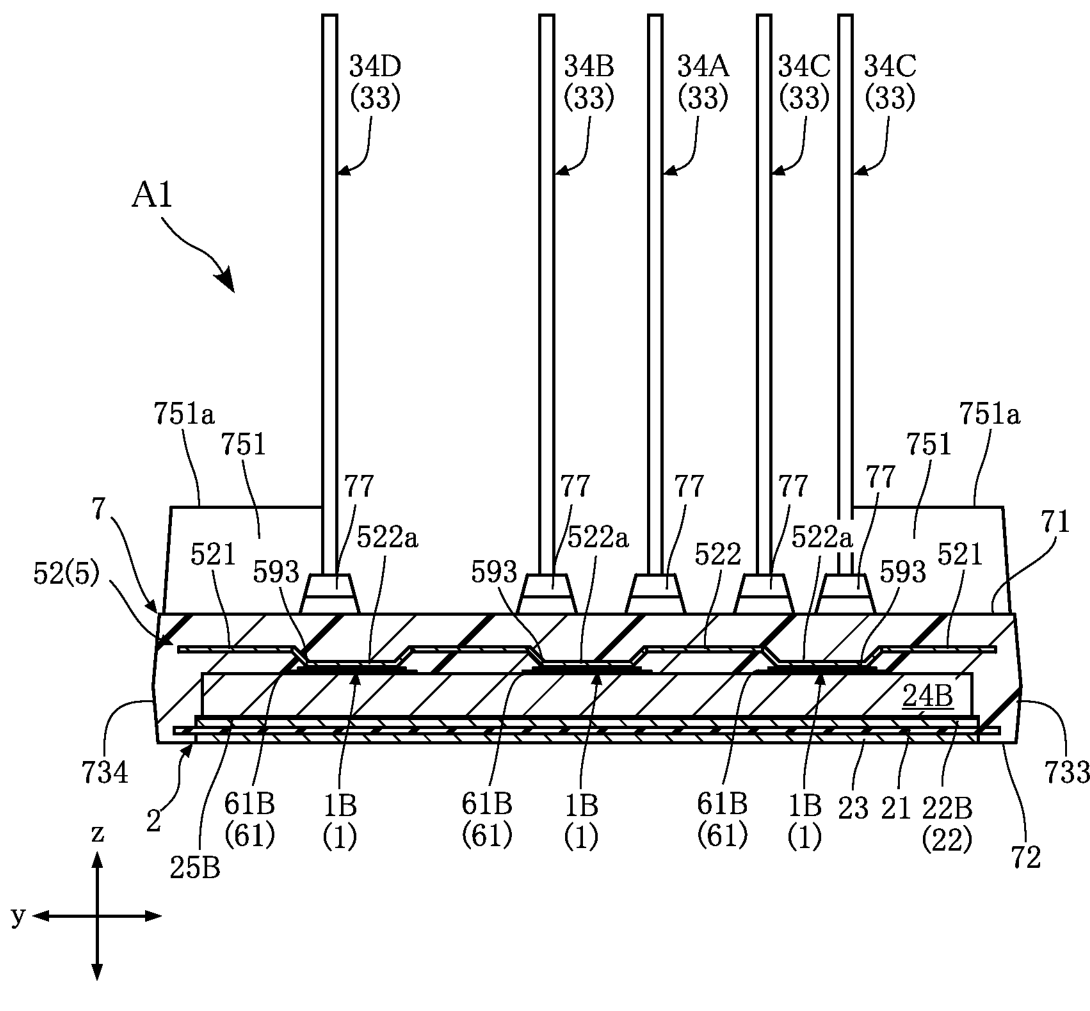
FIG. 17 is a cross-sectional view taken along a line XVII-XVII in FIG. 5.

The plurality of second semiconductor elements 1B are, as shown in FIG. 3, FIG. 7, and FIG. 17, mounted on the base substrate 2. In the example shown in FIG. 3, FIG. 7, and FIG. 17, the plurality of second semiconductor elements 1B are aligned in the second direction y, and spaced apart from each other. As shown in FIG. 14, the second semiconductor elements 1B are each conductively bonded to the base substrate 2 (second conductor 24B to be subsequently described), via the conductive bonding material 61 (conductive bonding material 61B to be subsequently described). As is apparent from FIG. 7, the plurality of first semiconductor elements 1A are respectively overlapping with the plurality of second semiconductor elements 1B, as viewed in the first direction x. Alternatively, the first semiconductor elements 1A may each be located so as not to overlap with any of the second semiconductor elements 1B, as viewed in the first direction x.

The plurality of semiconductor elements 1 (plurality of first semiconductor elements 1A and plurality of second semiconductor elements 1B) each include, as shown in FIG. 15, an element obverse face 10*a* and an element reverse face 10*b*. Although FIG. 15 only illustrates the configuration of the first semiconductor elements 1A, the second semiconductor elements 1B also have the same configuration. As shown in FIG. 15, in each of the semiconductor elements 1, the element obverse face 10*a* and the element reverse face 10*b* are spaced apart from each other, in the thickness direction z. The element obverse face 10*a* is oriented to one side (upper side) in the thickness direction z, and the element reverse face 10*b* is oriented to the other side (lower side) in the thickness direction z. When the first semiconductor elements 1A are bonded to the first conductor 24A, the element reverse faces 10*b* of the respective first semiconductor elements 1A are opposed to the first conductor 24A. When the second semiconductor elements 1B are bonded to the second conductor 24B, the element reverse faces 10*b* of the respective second semiconductor elements 1B are opposed to the second conductor 24B.

The plurality of semiconductor elements 1 (plurality of first semiconductor elements 1A and plurality of second semiconductor elements 1B) each include, as shown in FIG. 7 and FIG. 15, a first obverse-face electrode 11, a second obverse-face electrode 12, and a reverse face electrode 15. The first obverse-face electrode 11, the second obverse-face electrode 12, and the reverse face electrode 15 are arranged in the same way, in all of the semiconductor elements 1. The first obverse-face electrode 11 and the second obverse-face electrode 12 are located on the element obverse face 10*a* of each of the semiconductor elements 1. The first obverse-face electrode 11 and the second obverse-face electrode 12 are insulated from each other, via a non-illustrated insulation film. The reverse face electrode 15 is located on the element reverse face 10*b* of each of the semiconductor elements 1.

In each of the semiconductor elements 1, the first obverse-face electrode 11 serves, for example, as a gate, to which a drive signal (e.g., a gate voltage) for driving the semiconductor element 1 is inputted. In each of the semiconductor elements 1, the second obverse-face electrode 12 serves, for example, as a source, through which a source current runs. The reverse face electrode 15 serves, for example, as a drain, through which a drain current runs. The reverse face electrode 15 covers the entirety, or generally the entirety, of the element reverse face 10*b*. The reverse face electrode 15 is, for example, formed by Ag plating.

When the switching action unit Q1 inputs the drive signal (gate voltage) to the first obverse-face electrode 11 (gate), an electrically connected state and a disconnected state are switched between each other according to the drive signal, in the semiconductor element 1. The operation of switching between the electrically connected state and the disconnected state will be referred to as switching action. In the electrically connected state, the current runs from the reverse face electrode 15 (drain) to the second obverse-face electrode 12 (source), which no such current runs in the disconnected state. Thus, the semiconductor elements 1 each perform the switching action, by means of the switching action unit Q1. The semiconductor device A1 converts a first source voltage (e.g., DC voltage) to a second source voltage (e.g., AC voltage), with the respective switching action units Q1 of the plurality of semiconductor elements 1. The first source voltage is inputted to the first power terminal 31, and the second source voltage is inputted to the second power terminal 32.

Some of the plurality of semiconductor elements 1 (two in the semiconductor device A1) further include a diode function unit D1 (see FIG. 22), in addition to the switching action unit Q1. In the example shown in FIG. 7, one of the plurality of first semiconductor elements 1A (uppermost first semiconductor element 1A in the second direction y in FIG. 7) and one of the plurality of second semiconductor elements 1B (lowermost second semiconductor element 1B in the second direction y in FIG. 7) each include the diode function unit D1. Although the function and the purpose of the diode function unit D1 are not specifically limited, the diode function unit D1 may be used, for example, for temperature detection. Here, the diode D2 shown in FIG. 22 is, for example, constituted of a parasitic diode component of the switching action unit Q1. In a variation of the semiconductor device A1, the plurality of semiconductor elements 1 may all be without the diode function unit D1.

Each of the semiconductor elements 1 that includes the diode function unit D1 further includes, as shown in FIG. 7, a pair of third obverse-face electrodes 13, in addition to the first obverse-face electrode 11, the second obverse-face electrode 12, and the reverse face electrode 15. The third obverse-face electrodes 13 are arranged in the same way, in the semiconductor elements 1 that include the diode function unit D1. The pair of third obverse-face electrodes 13 are formed on the element obverse face 10*a*, as is apparent from FIG. 7. The pair of third obverse-face electrodes 13 are electrically connected to the diode function unit D1, in each of the semiconductor elements 1 that include the diode function unit D1.

The configuration of the plurality of semiconductor elements 1 (plurality of first semiconductor elements 1A and plurality of second semiconductor elements 1B) is not limited to the foregoing example. For example, an additional electrode of the same potential as the second obverse-face electrode 12 (e.g., source sense) may be formed on the element obverse face 10*a*.

The base substrate 2 supports the plurality of semiconductor elements 1. The base substrate 2 constitutes the path for a main circuit current to be switched by the semiconductor elements 1, in collaboration with the conduction member 5. The base substrate 2 includes an insulation layer 21, a obverse face metal layer 22, a bonding layer 221, a reverse face metal layer 23, a first conductor 24A, a second conductor 24B, and a pair of conductive bonding materials 25A and 25B.

The insulation layer 21 is, for example, formed of a ceramic having high thermal conductivity. Examples of such ceramic include aluminum nitride (AlN), silicon nitride (SiN), and aluminum oxide ($Al_2O_3$). The insulation layer 21 may be formed of an insulative resin sheet, instead of the ceramic. The insulation layer 21 has, for example, a rectangular shape in a plan view.

Figure 13:
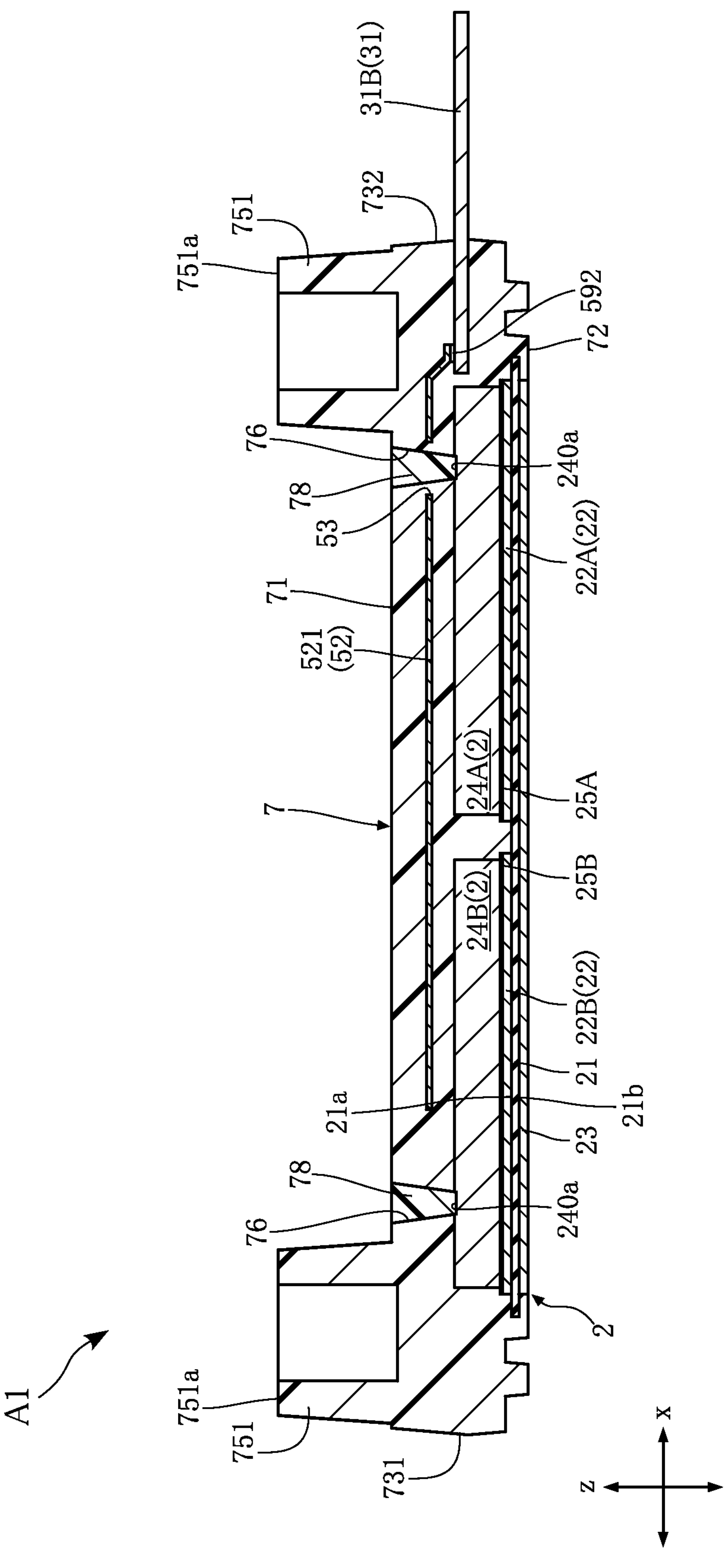
FIG. 13 is a cross-sectional view taken along a line XIII-XIII in FIG. 5.

As shown in FIG. 13 to FIG. 15, the insulation layer 21 includes a obverse face 21*a* and a reverse face 21*b*. The obverse face 21*a* and the reverse face 21*b* are spaced apart from each other, in the thickness direction z. The obverse face 21*a* is oriented upward in the thickness direction z, and the reverse face 21*b* is oriented downward in the thickness direction z. The obverse face 21*a* and the reverse face 21*b* are flat (or generally flat).

The obverse face metal layer 22 is, as shown in FIG. 13 to FIG. 15, formed on the obverse face 21*a*. The obverse face metal layer 22 is formed of, for example, Cu or a Cu-based alloy. The obverse face metal layer 22 may be formed of Al or an Al-based alloy, instead of either of Cu or the Cu-based alloy.

As shown in FIG. 13 and FIG. 14, the obverse face metal layer 22 includes a first supporting portion 22A and a second supporting portion 22B. The first supporting portion 22A and the second supporting portion 22B are spaced apart from each other, in the first direction x. The first conductor 24A is bonded to the first supporting portion 22A, thus to be supported thereby. The second conductor 24B is bonded to the second supporting portion 22B, thus to be supported thereby. The first supporting portion 22A and the second supporting portion 22B each have, for example, a rectangular shape in a plan view.

The bonding layer 221 is, as shown in FIG. 15, formed on the upper face of the obverse face metal layer 22 (each of the first supporting portion 22A and the second supporting portion 22B). The bonding layer 221 may be formed, for example, by Ag plating. The bonding layer 221 is provided, for example, to facilitate the solid-phase diffusion bonding with the conductive bonding materials 25A and 25B.

The reverse face metal layer 23 is formed on the reverse face 21*b*, as shown in FIG. 13 to FIG. 15. The reverse face metal layer 23 is formed of the same material as the obverse face metal layer 22. The lower face of the reverse face metal layer 23 (face oriented to the other side in the thickness direction z) is, for example, exposed from the resin member 7, as shown in FIG. 10 and FIG. 13 to FIG. 15. Alternatively, the lower face of the reverse face metal layer 23 may be covered with the resin member 7. In the case where the lower face of the reverse face metal layer 23 is exposed from the resin member 7, a non-illustrated heat dissipation member (e.g., heatsink) may be attached to the lower face. The reverse face metal layer 23 is overlapping with both of the first supporting portion 22A and the second supporting portion 22B, in a plan view.

In the case where the obverse face metal layer 22 and the reverse face metal layer 23 of the base substrate 2 are formed of Cu or a Cu-based alloy, the insulation layer 21, the obverse face metal layer 22, and the reverse face metal layer 23 are, for example, formed of a direct bonded copper (DBC) substrate. When the obverse face metal layer 22 and the reverse face metal layer 23 are formed of Al or an Al-based alloy instead, the insulation layer 21, the obverse face metal layer 22, and the reverse face metal layer 23 are, for example, formed of a direct bonded aluminum (DBA) substrate.

The first conductor 24A and the second conductor 24B are each a plate-shaped member formed of a metal. The metal is, for example, Cu or a Cu-based alloy. The first conductor 24A and the second conductor 24B constitute, with the first power terminal 31 and the second power terminal 32, the conduction path to the plurality of semiconductor elements 1. The first conductor 24A and the second conductor 24B are spaced apart from each other in the first direction x, as shown in FIG. 7, FIG. 13, and FIG. 14. The first conductor 24A and the second conductor 24B each have a rectangular shape in a plan view, as shown in FIG. 7. The first conductor 24A and the second conductor 24B are overlapping with each other, as viewed in the first direction x. The first conductor 24A and the second conductor 24B may each have a size of 15 mm to 25 mm both ends inclusive (preferably, 20 mm), in the first direction x, 30 mm to 40 mm both ends inclusive (preferably, 35 mm) in the second direction y, and 1.5 mm to 3.0 mm both ends inclusive (preferably, 2.0 mm), in the thickness direction z. Such sizes of the first conductor 24A and the second conductor 24B may be modified depending on the specification of the semiconductor device A1, without limitation to the mentioned values.

The first conductor 24A includes, as shown in FIG. 15, a base material 241, a obverse face bonding layer 242, and a reverse face bonding layer 243. The second conductor 24B also includes, like the first conductor 24A, the base material 241, the obverse face bonding layer 242, and the reverse face bonding layer 243. The base material 241, the obverse face bonding layer 242, and the reverse face bonding layer 243 are configured in the same way, in both of the first conductor 24A and the second conductor 24B. The base material 241 is a plate-shaped member formed of a metal. The metal is, for example, Cu or a Cu-based alloy. The obverse face bonding layer 242 is formed on the upper face of the base material 241 (face oriented upward in the thickness direction z). The obverse face bonding layer 242 constitutes the surface layer of each of the first conductor 24A and the second conductor 24B, on the upper side in the thickness direction z. The obverse face bonding layer 242 is formed, for example, by Ag plating. The reverse face bonding layer 243 is formed on the lower face of the base material 241 (face oriented downward in the thickness direction z). The reverse face bonding layer 243 constitutes the surface layer of each of the first conductor 24A and the second conductor 24B, on the lower side in the thickness direction z. The reverse face bonding layer 243 is formed, for example, by Ag plating, like the obverse face bonding layer 242.

As shown in FIG. 13 to FIG. 16 and FIG. 20, the first conductor 24A is bonded to the first supporting portion 22A, via the conductive bonding material 25A. As shown in FIG. 14 to FIG. 16 and FIG. 20, the plurality of first semiconductor elements 1A are bonded to the upper face of the first conductor 24A (face oriented upward in the thickness direction z), via the conductive bonding material 61 (conductive bonding material 61A to be subsequently described). The respective reverse face electrodes 15 (drain) of the plurality of first semiconductor element 1A are electrically connected to each other, via the first conductor 24A.

As shown in FIG. 13, FIG. 14, FIG. 17, and FIG. 18, the second conductor 24B is bonded to the second supporting portion 22B, via the conductive bonding material 25B. As shown in FIG. 14 and FIG. 17, the plurality of second semiconductor elements 1B are bonded to the upper face of the second conductor 24B (face oriented upward in the thickness direction z), via the conductive bonding material 61 (conductive bonding material 61A to be subsequently described). The respective reverse face electrodes 15 (drain) of the plurality of second semiconductor elements 1B are electrically connected to each other, via the second conductor 24B.

As shown in FIG. 7 and FIG. 13, a plurality of recesses 240*a* are formed in the upper face in the thickness direction z, of each of the first conductor 24A and second conductor 24B. Each of the recesses 240*a* is recessed in the thickness direction z, from the upper face of the first conductor 24A or second conductor 24B, in the thickness direction z. The recesses 240*a* are formed at the time of molding the resin member 7. The two recesses 240*a* formed on the upper face of the first conductor 24A in the thickness direction z, are spaced apart from each other in the second direction y, and overlapping with each other as viewed in the second direction y. The two recesses 240*a* formed on the upper face of the second conductor 24B in the thickness direction z, are spaced apart from each other in the second direction y, and overlapping with each other as viewed in the second direction y.

As shown in FIG. 13 to FIG. 15 and FIG. 20, the conductive bonding material 25A is interposed between the first supporting portion 22A and the first conductor 24A. The conductive bonding material 25A serves to adhere the first conductor 24A to the first supporting portion 22A. The conductive bonding material 25B is, as shown in FIG. 13, FIG. 14, FIG. 17, and FIG. 18, interposed between the second supporting portion 22B and the second conductor 24B. The conductive bonding material 25B serves to adhere the second conductor 24B to the second supporting portion 22B.

The conductive bonding material 25A includes, as shown in FIG. 15, a base layer 251, an upper layer 252, and a lower layer 253. The conductive bonding material 25B also includes, like the conductive bonding material 25A, the base layer 251, the upper layer 252, and the lower layer 253. In each of the conductive bonding materials 25A and 25B, the base layer 251, the upper layer 252, and the lower layer 253 are stacked on each other. The base layer 251, the upper layer 252, and the lower layer 253 are configured in the same way, in both of the conductive bonding materials 25A and 25B.

The base layer 251 is formed of a metal, which is, for example, Al or an Al-based alloy. The base layer 251 is, for example, formed of a sheet material.

The upper layer 252 is formed on the upper face of the base layer 251. The upper layer 252 is formed, for example, by Ag plating. In the conductive bonding material 25A, the upper layer 252 is interposed between the base layer 251 and the first conductor 24A. The upper layer 252 of the conductive bonding material 25A is bonded to the reverse face bonding layer 243 of the first conductor 24A, for example by solid-phase diffusion of the metal. In the conductive bonding material 25B, the upper layer 252 is interposed between the base layer 251 and the second conductor 24B. The upper layer 252 of the conductive bonding material 25B is bonded to the reverse face bonding layer 243 of the second conductor 24B, for example by solid-phase diffusion of the metal. Accordingly, the respective upper layers 252 of the pair of conductive bonding materials 25A and 25B, and the respective reverse face bonding layers 243 of the first conductor 24A and the second conductor 24B, are bonded to each other, in direct contact at the bonding interface. Here, the expression "A and B are bonded together by solid-phase diffusion" used herein, refers to the state where, as result of the solid-phase diffusion bonding, A and B are adhered to each other in direct contact at the bonding interface, which can also be expressed as "A and B constitute a solid-phase diffusion bonding layer". When the solid-phase diffusion bonding has been performed under an ideal condition, the bonding interface may become non-existent, owing to the diffusion of the metal elements. On the other hand, when an inclusion such as an oxide film is present in the surface layer of A and B, or when a void is formed between A and B, such inclusion or void may be present at the bonding interface.

The lower layer 253 is formed on the lower face of the base layer 251. The lower layer 253 is formed, for example, by Ag plating. In the conductive bonding material 25A, the lower layer 253 is interposed between the base layer 251 and the first supporting portion 22A. The lower layer 253 of the conductive bonding material 25A is bonded to the bonding layer 221 on the first supporting portion 22A, for example by solid-phase diffusion of the metal. In the conductive bonding material 25B, the lower layer 253 is interposed between the base layer 251 and the second supporting portion 22B. The lower layer 253 of the conductive bonding material 25B is bonded to the bonding layer 221 on the second supporting portion 22B, for example by solid-phase diffusion of the metal. Accordingly, the respective lower layers 253 of the pair of conductive bonding materials 25A and 25B, and the respective bonding layers 221 on the first supporting portion 22A and the second supporting portion 22B, are bonded to each other, in direct contact at the bonding interface.

The conductive bonding materials 25A and 25B may be constituted, for example, of a solder, a metal paste, or a sintered metal, without limitation to the base layer 251, the upper layer 252, and the lower layer 253 described above.

The first power terminal 31 and the second power terminal 32 are plate-shaped material formed of a metal. The metal is, for example, Cu or a Cu-based alloy. The first power terminal 31 includes an input terminal 31A and two input terminals 31B, and the second power terminal 32 includes two output terminals 32A. The input terminal 31A exemplifies the "first input terminal" in the present disclosure, and the input terminals 31B exemplify the "second input terminal" in the present disclosure.

Between the input terminal 31A and the two input terminals 31B, a first source voltage is applied. In other words, the first source voltage is inputted to the first power terminal 31. The input terminal 31A is, for example, a positive electrode (P-terminal), and each of the two input terminals 31B is, for example, a negative electrode (N-terminal). Alternatively, the input terminal 31A may be the negative electrode (N-terminal), and each of the two input terminals 31B may be the positive electrode (P-terminal). In this case, the wiring arrangement in the package may be modified as necessary, in accordance with the change in polarity of the terminals. To each of the two output terminals 32A, a second source voltage is applied. In other words, the second source voltage is inputted to the second power terminal 32. The plurality of input terminals 31A and 31B, and the two output terminals 32A each include a portion covered with the resin member 7, and a portion exposed from the resin member 7.

The input terminal 31A is, for example, formed integrally with the first conductor 24A, as shown in FIG. 14. Alternatively, the input terminal 31A may be separated from the first conductor 24A, but conductively bonded thereto. The input terminal 31A is, as shown in FIG. 7, located on the opposite side of the plurality of second semiconductor elements 1B with respect to the plurality of first semiconductor elements LA, in the first direction x. The input terminal 31A is electrically connected to the first conductor 24A, and also with the reverse face electrode 15 (drain) of each of the semiconductor elements 1, via the first conductor 24A.

The two input terminals 31B are each spaced apart from the first conductor 24A, as shown in FIG. 13. To each of the two input terminals 31B, the second conduction member 52 is bonded. The two input terminals 31B are, as shown in FIG. 7, located at the same position as the input terminal 31A in the first direction x, with respect to the plurality of first semiconductor elements 1A. The two input terminals 31B are each electrically connected to the second conduction member 52, and also with the second obverse-face electrode 12 (source) of each of the second semiconductor elements 1B, via the second conduction member 52.

The first power terminal 31 (input terminal 31A and each of two input terminals 31B) is sticking out from the resin member 7 to one side in the first direction x, in the semiconductor device A1. The input terminal 31A and the two input terminals 31B are spaced apart from each other. The two input terminals 31B are located on the opposite sides to each other in the second direction y, across the input terminal 31A. The input terminal 31A and the two input terminals 31B are overlapping with each other, as viewed in the second direction y.

The two output terminals 32A are, for example, formed integrally with the second conductor 24B, as is apparent from FIG. 7 and FIG. 14. Alternatively, the two output terminals 32A may be separated from the second conductor 24B, but conductively bonded thereto. The two output terminals 32A are, for example as shown in FIG. 7, located on the opposite side of the plurality of first semiconductor elements 1A in the first direction x, with respect to the plurality of second semiconductor elements 1B. The output terminals 32A are each electrically connected to the second conductor 24B, and also with the reverse face electrode 15 (drain) of the second semiconductor element 1B, via the second conductor 24B. In the semiconductor device A1, the number of output terminals 32A is not limited to two, but may be one, or three or more. For example, in the case where the semiconductor device A1 includes one output terminal

32A, it is preferable that the one output terminal 32A is connected to the central position of the second conductor 24B in the second direction y, to minimize a difference in length of the conduction paths leading to the first obverse-face electrode 11 (drain) of each of the second semiconductor elements 1B, through the second conductor 24B.

Figure 4:
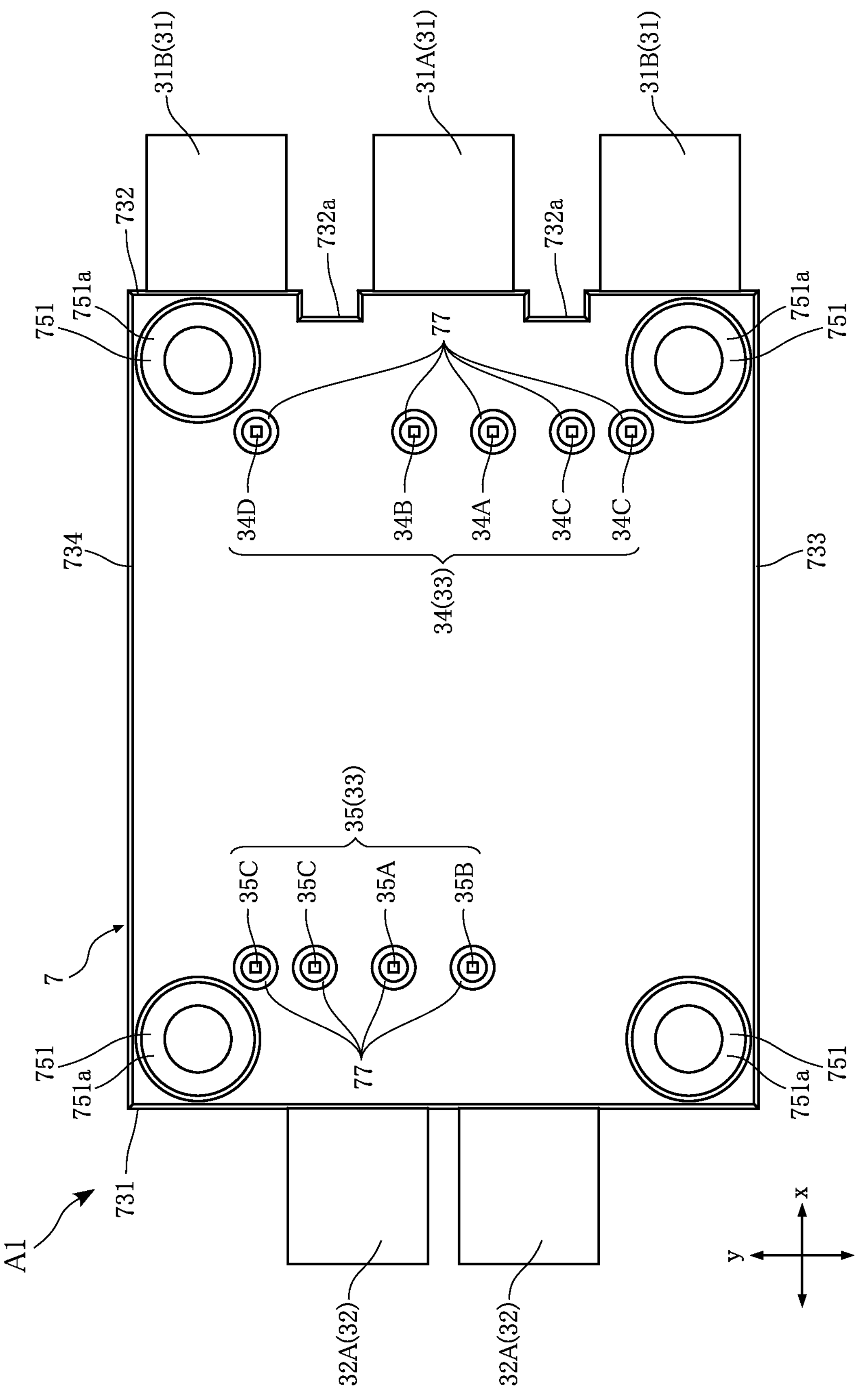
FIG. 4 is a plan view showing the semiconductor device according to the embodiment.

The plurality of control terminals 33 are pin-shaped terminals for controlling the corresponding semiconductor element 1. The plurality of control terminals 33 include, as shown in FIG. 1 and FIG. 4, a plurality of first control terminals 34 and a plurality of second control terminals 35.

The plurality of first control terminals 34 serve to control the plurality of first semiconductor elements 1A. The plurality of first control terminals 34 include, as shown in FIG. 1 and FIG. 4, a first drive terminal 34A and a plurality of first detection terminals 34B to 34D.

Figure 20:
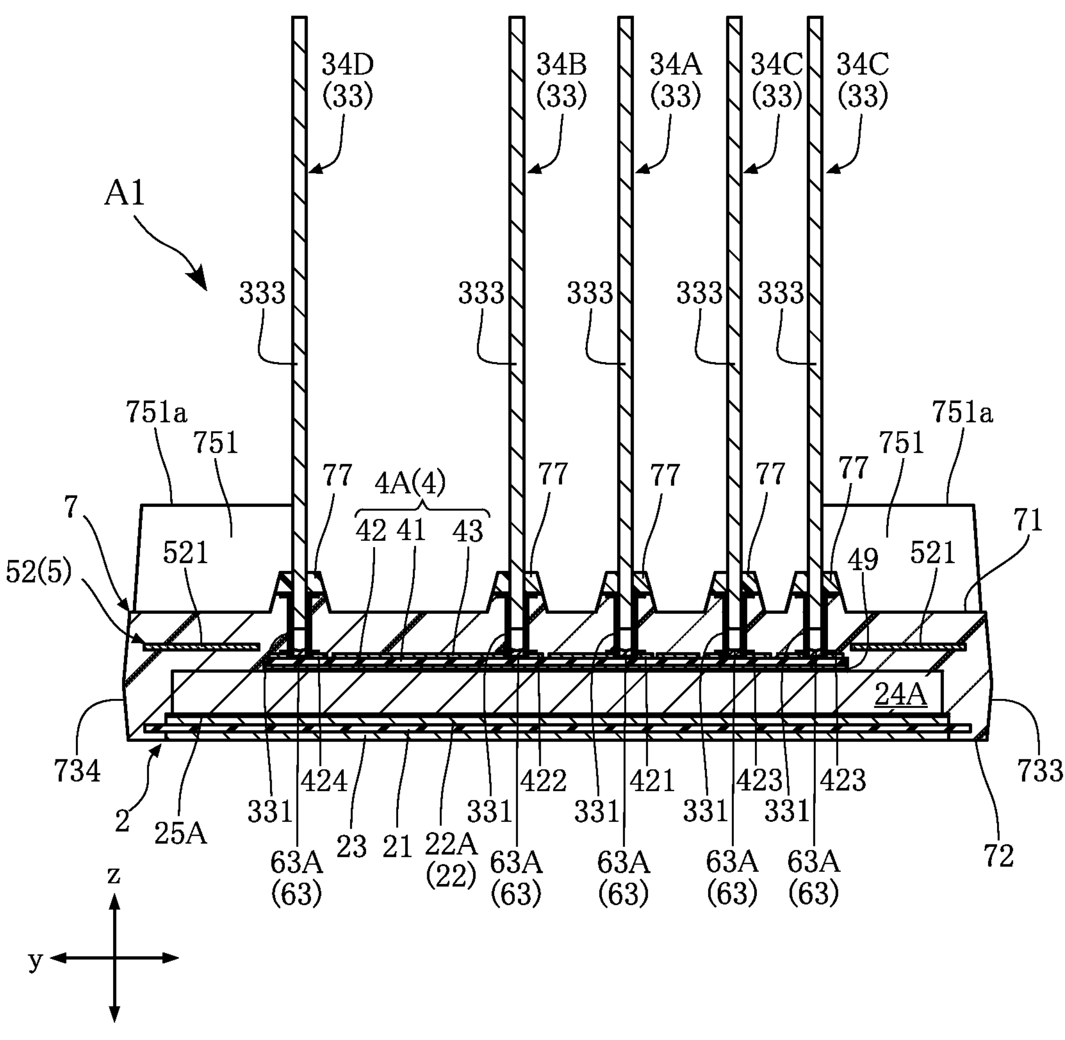
FIG. 20 is a cross-sectional view taken along a line XX-XX in FIG. 5.

The first drive terminal 34A is, as shown in FIG. 7 and FIG. 20, bonded to the first conductive substrate 4A. The first drive terminal 34A is electrically connected to the respective first obverse-face electrodes 11 (gate) of the plurality of first semiconductor elements 1A. The first drive terminal 34A serves as the input terminal of the first drive signal. The first drive signal is an electrical signal for driving each of the plurality of first semiconductor elements 1A, and is a gate voltage, in the example where the first semiconductor element 1A is a MOSFET.

The first detection terminal 34B is bonded to the first conductive substrate 4A, as shown in FIG. 7 and FIG. 20. The first detection terminal 34B is electrically connected to the respective second obverse-face electrodes 12 (source) of the plurality of first semiconductor elements 1A. The first detection terminal 34B serves as the output terminal first detection signal. The first detection signal is an electrical signal for detecting the conduction status of the plurality of first semiconductor elements 1A.

A pair of first detection terminals 34C are each bonded to the first conductive substrate 4A, as shown in FIG. 7 and FIG. 20. The pair of first detection terminals 34C are respectively electrically connected to the pair of third obverse-face electrodes 13 of the first semiconductor element 1A having the diode function unit D1. The pair of first detection terminals 34C are electrically connected to the diode function unit D1 of the first semiconductor element 1A.

The first detection terminal 34D is bonded to the first conductive substrate 4A, as shown in FIG. 7 and FIG. 20. The first detection terminal 34D is electrically connected to the respective reverse face electrodes 15 (drain) of the plurality of first semiconductor elements 1A. To the first detection terminal 34D, the voltage of the reverse face electrode 15 of each of the plurality of first semiconductor elements 1A (voltage corresponding to the drain current) is applied. The first detection terminal 34D serves as the terminal for detecting the drain signal of the plurality of semiconductor elements 1 (drain sense terminal).

The plurality of second control terminals 35 are for controlling the plurality of second semiconductor elements 1B. The plurality of second control terminals 35 include, as shown in FIG. 1 and FIG. 4, a second drive terminal 35A and a plurality of second detection terminals 35B and 35C.

Figure 18:
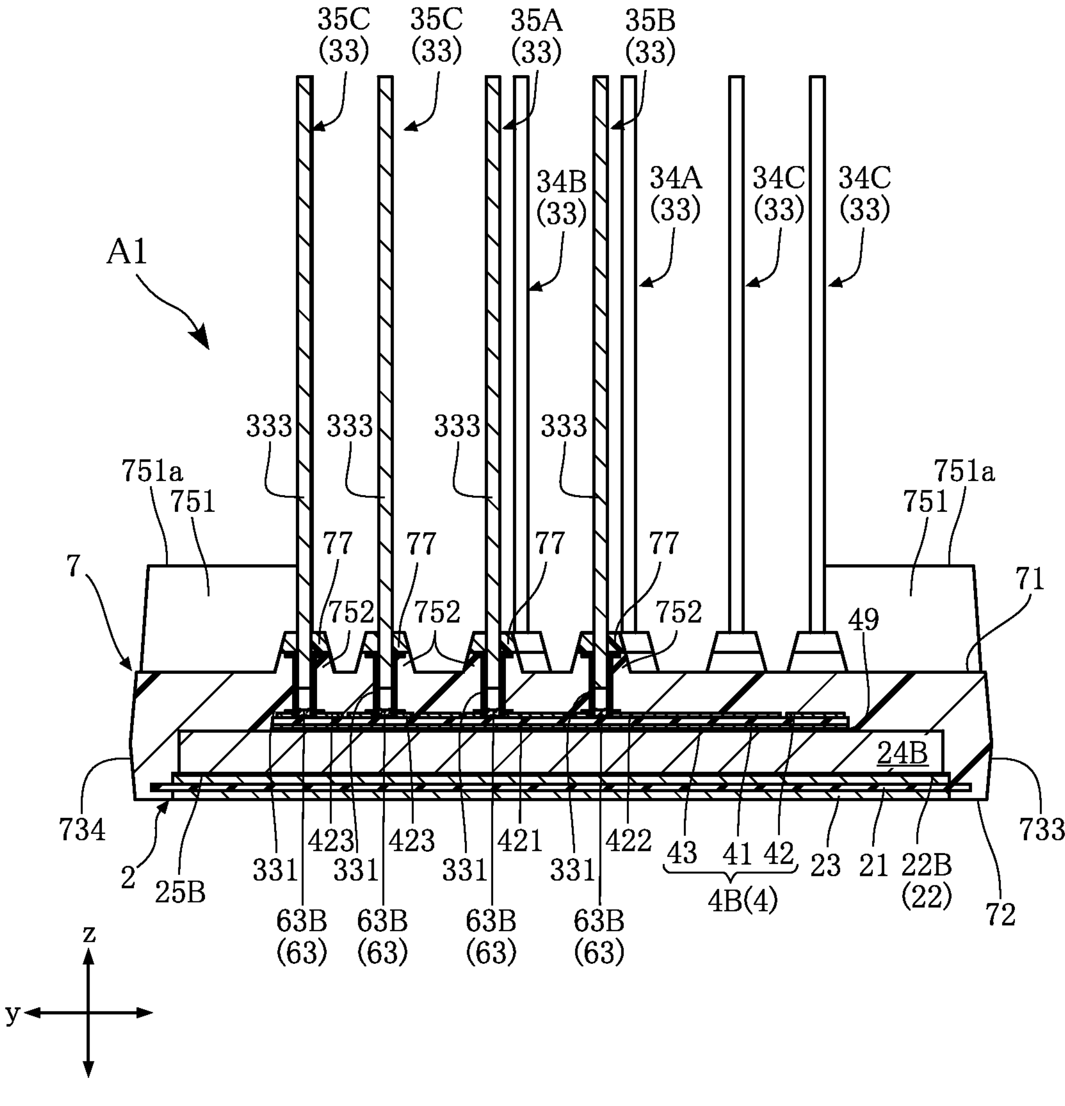
FIG. 18 is a cross-sectional view taken along a line XVIII-XVIII in FIG. 5.
Figure 19:
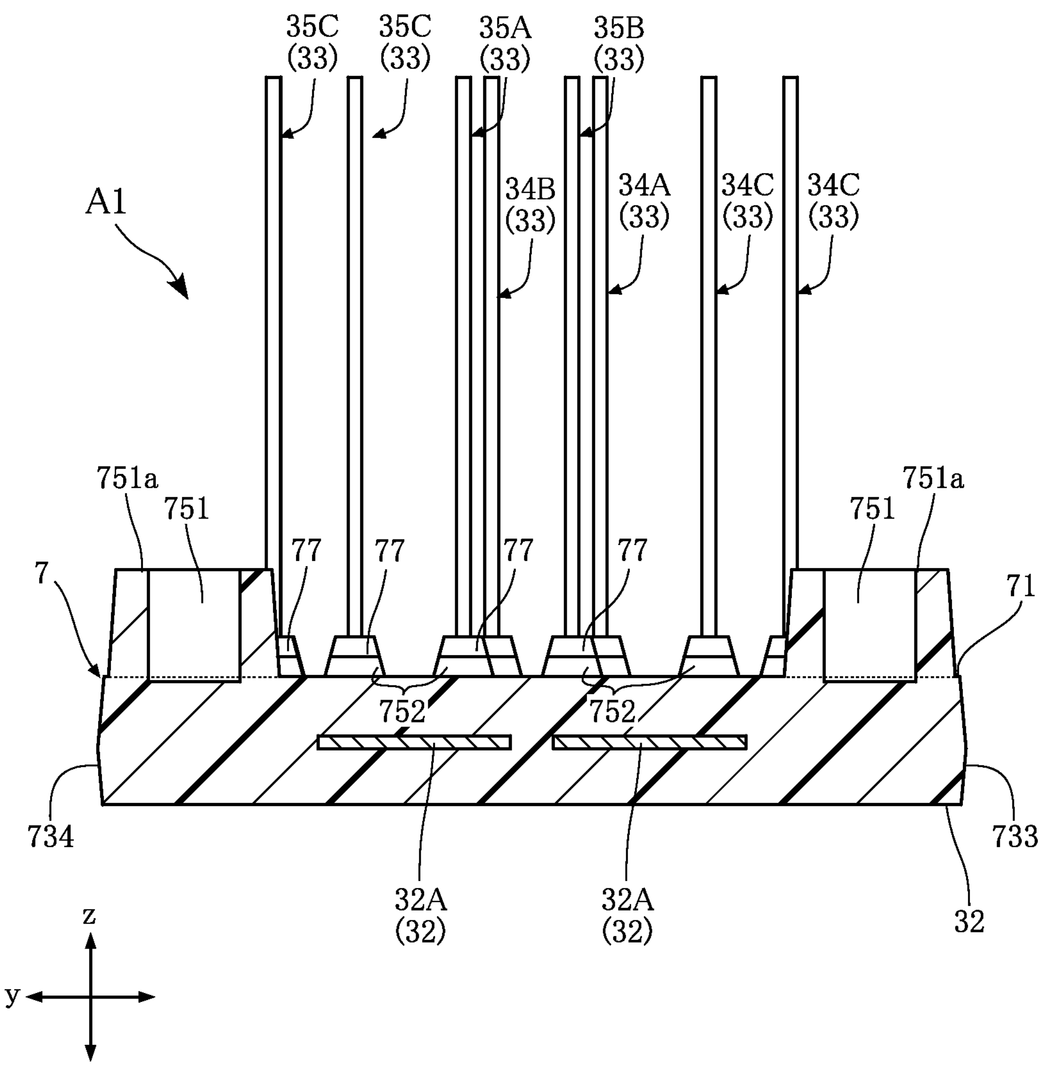
FIG. 19 is a cross-sectional view taken along a line XIX-XIX in FIG. 5.

The second drive terminal 35A is, as shown in FIG. 7 and FIG. 18, bonded to the second conductive substrate 4B. The second drive terminal 35A is electrically connected to the respective first obverse-face electrodes 11 (gate) of the plurality of second semiconductor elements 1B. The second drive terminal 35A serves as the input terminal of the second drive signal. The second drive signal is an electrical signal for driving each of the plurality of second semiconductor elements 1B, and is a gate voltage, in the example where the second semiconductor element 1B is a MOSFET.

The second detection terminal 35B is, as shown in FIG. 7 and FIG. 18, bonded to the second conductive substrate 4B. The second detection terminal 35B is electrically connected to the respective second obverse-face electrodes 12 (source) of the plurality of second semiconductor elements 1B. The second detection terminal 35B serves as the output terminal of the second detection signal. The second detection signal is an electrical signal for detecting the conduction status of each of the plurality of second semiconductor elements 1B, The pair of second detection terminals 35C are each bonded to the second conductive substrate 4B, as shown in FIG. 7 and FIG. 18. The pair of second detection terminals 35C are respectively electrically connected to the pair of third obverse-face electrodes 13 of the second semiconductor element 1B having the diode function unit D1. The pair of second detection terminals 35C are electrically connected to the diode function unit D1 of the second semiconductor element 1B.

The plurality of control terminals 33 (first drive terminal 34A, plurality of first detection terminals 34B to 34D, second drive terminal 35A, and plurality of second detection terminals 35B and 35C) each include a holder 331 and a metal pin 333. The holder 331 and the metal pin 333 are formed in the same way, in all of the control terminals 33.

Figure 21:
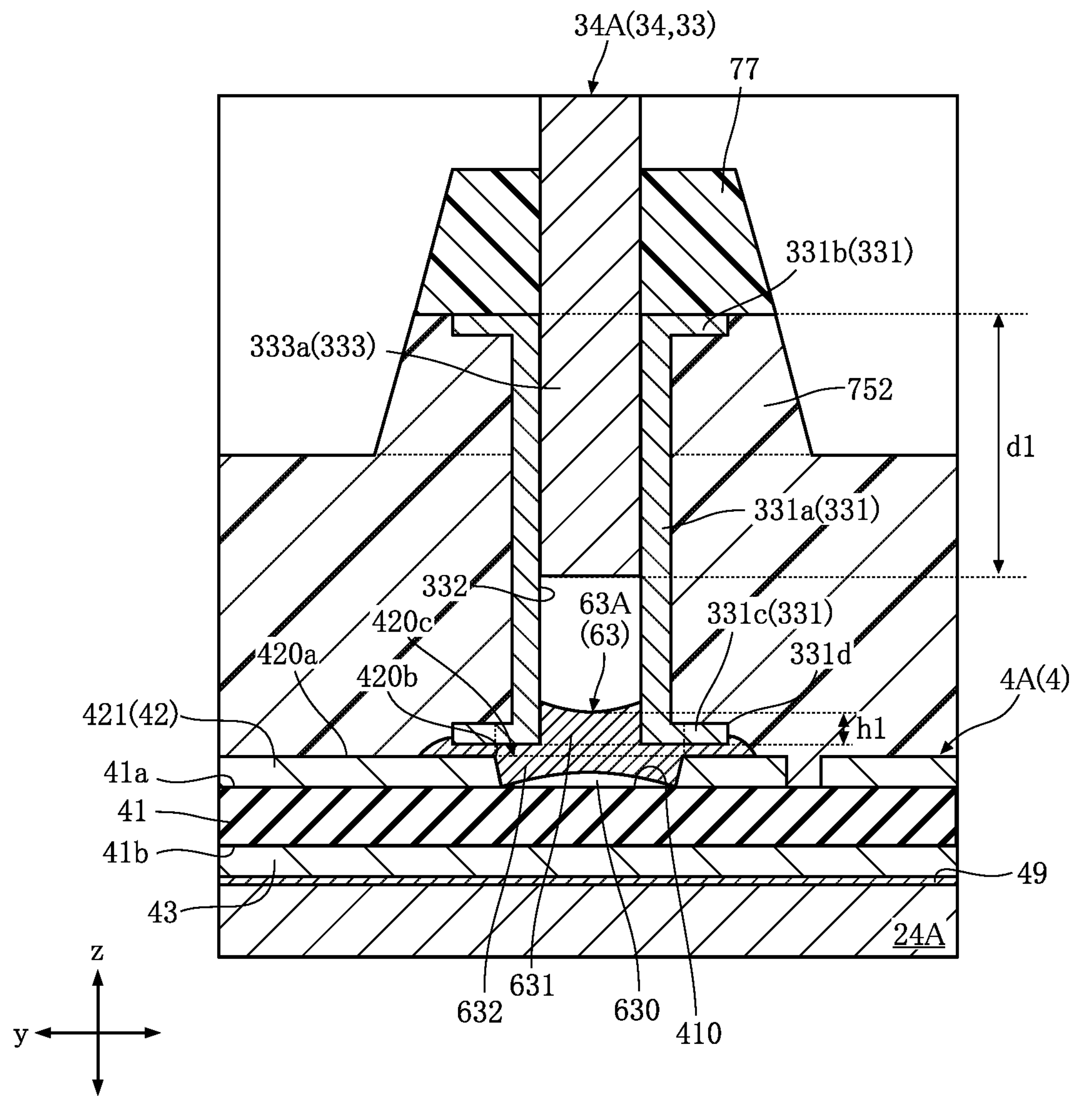
FIG. 21 is a partially enlarged cross-sectional view from FIG. 20, showing the junction structure according to the present disclosure.

The holder 331 is formed of a conductive material. As shown in FIG. 18, FIG. 20, and FIG. 21, the holder 331 is bonded to the conductive substrate 4 (either of first conductive substrate 4A and second conductive substrate 4B), via the conductive bonding material 63. In the holder 331, the metal pin 333 is inserted.

Figure 8:
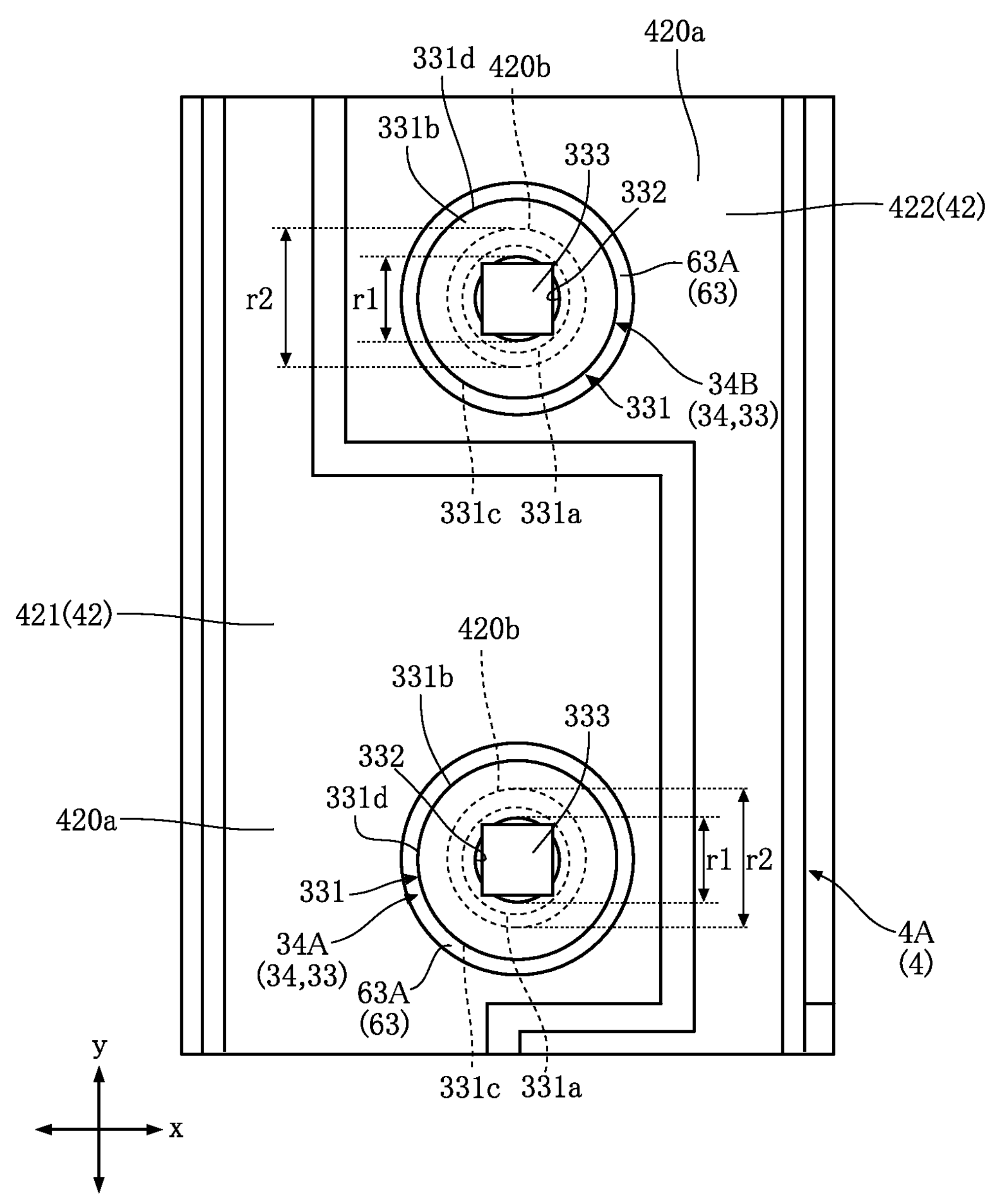
FIG. 8 is a partially enlarged plan view from FIG. 7, showing a junction structure according to the present disclosure.

As shown in FIG. 8 and FIG. 21, the holder 331 includes a tubular portion 331*a*, an upper-end flange portion 331*b*, and a lower-end flange portion 331*c*. The tubular portion 331*a* has, for example, a circular cylindrical shape and, in the semiconductor device A1, mounted so as to show a circular shape in a plan view. The metal pin 333 is inserted into the tubular portion 331*a*. The upper-end flange portion 331*b* and the lower-end flange portion 331*c* are formed with the tubular portion 331*a* interposed therebetween, in the thickness direction z. The upper-end flange portion 331*b* and the lower-end flange portion 331*c* each have, for example, a circular shape in a plan view. Alternatively, the upper-end flange portion 331*b* and the lower-end flange portion 331*c* may have an elliptical shape or a polygonal shape (including rectangular), in a plan view. The upper-end flange portion 331*b* and the lower-end flange portion 331*c* have the same shape and the same size as each other, in a plan view. The upper-end flange portion 331*b* and the lower-end flange portion 331*c* are larger in size than the tubular portion 331*a*, in a plan view. The upper-end flange portion 331*b* is connected to the upper peripheral edge on the tubular portion 331*a*, in the thickness direction z. The upper face of the upper-end flange portion 331*b* is exposed from the resin member 7 (second protruding portion 752 to be subsequently described), and covered with a resin portion 77. The lower-end flange portion 331*c* is connected to the lower peripheral edge of the tubular portion 331*a* in the thickness direction z. The lower-end flange portion 331*c* is bonded to the conductive substrate 4, via the conductive bonding material 63.

The holder 331 includes, as shown in FIG. 8 and FIG. 21, a through-hole 332. The through-hole 332 is, as shown in FIG. 21, formed so as to penetrate through the holder 331 in the thickness direction z, in other words to penetrate through the tubular portion 331*a*, the upper-end flange portion 331*b*, and the lower-end flange portion 331*c*, in the thickness direction z. The metal pin 333 is inserted into the through-hole 332. The through-hole 332 has a circular shape in a plan view. The inner diameter of the holder 331, in other words the diameter r1 of the through-hole 332 (see FIG. 8) in a plan view is, for example, between 0.5 mm and 1.0 mm, both ends inclusive. The through-hole 332 exemplifies the "first through-hole" in the present disclosure.

The metal pin 333 is a bar-shaped member extending in the thickness direction z. The metal pin 333 is press-inserted into the holder 331, thus to be supported thereby. The metal pin 333 is inserted from the upper side of the holder 331, in the thickness direction z. The metal pin 333 is electrically connected to the conductive substrate 4 (obverse face metal layer 42 to be subsequently described), via the holder 331. The metal pin 333 is, for example, a pin for a press-fit terminal. In the semiconductor device A1, although the metal pin 333 straightly extends from the holder 331 in the thickness direction z, a part of the metal pin 333 may be bent at an upper position of the holder 331, in the thickness direction z.

The metal pin 333 includes a straight portion 333*a*. The straight portion 333*a* extends along the thickness direction z. The straight portion 333*a* corresponds to the portion of the metal pin 333 inserted into the through-hole 332. At least a part of the straight portion 333*a* is in contact with the inner surface of the holder 331.

In each of the control terminals 33, the size dl of the straight portion 333*a* in the thickness direction z (see FIG. 21) is between 20% and 90%, both ends inclusive, of the size of the holder 331 in the thickness direction z. In each of the control terminals 33, when the size of the holder 331 in the thickness direction z is 2.8 mm for example, the size dl of the straight portion 333*a* in the thickness direction z may be, for example, 2.0 mm. Here, the size dl of the straight portion 333*a* in the thickness direction z corresponds to the insertion depth of the metal pin 333 into the holder 331.

The conductive substrate 4 serves to support the plurality of control terminals 33. The conductive substrate 4 is interposed between the base substrate 2 and the plurality of control terminals 33. The conductive substrate 4 is, for example, formed of a DBC substrate. Alternatively, the conductive substrate 4 may be formed of a DBA substrate. Further, the conductive substrate 4 may be formed of a printed circuit board, instead of the DBC substrate.

The conductive substrate 4 includes, as shown in FIG. 7 and FIG. 14, a first conductive substrate 4A and a second conductive substrate 4B. The first conductive substrate 4A is located on the first conductor 24A of the base substrate 2. The first conductive substrate 4A supports the plurality of first control terminals 34 out of the plurality of control terminals 33, in other words the first drive terminal 34A and the plurality of first detection terminals 34B to 34D. The first conductive substrate 4A is, as shown in FIG. 15, FIG. 20, and FIG. 21, bonded to the first conductor 24A via the bonding material 49. The bonding material 49 is formed of solder for example, which may be either conductive or insulative. The second conductive substrate 4B is located on the second conductor 24B of the base substrate 2. The second conductive substrate 4B supports the plurality of second control terminals 35 out of the plurality of control terminals 33, in other words the second drive terminal 35A and the plurality of second detection terminals 35B and 35C. The second conductive substrate 4B is, as shown in FIG. 18, bonded to the second conductor 24B via the bonding material 49.

The conductive substrate 4 (each of first conductive substrate 4A and second conductive substrate 4B) includes, as shown in FIG. 18 and FIG. 20, an insulation layer 41, a obverse face metal layer 42, and a reverse face metal layer 43. The insulation layer 41, the obverse face metal layer 42, and the reverse face metal layer 43 are formed in the same way in both of the first conductive substrate 4A and the second conductive substrate 4B, unless otherwise specifically noted.

The insulation layer 41 is, for example, formed of a ceramic. Examples of the ceramic include AlN, SiN, and $Al_2O_3$. The insulation layer 41 has, for example, a rectangular shape in a plan view. The insulation layer 41 includes a obverse face 41*a* and a reverse face 41*b*, as shown in FIG. 21. The obverse face 41*a* and the reverse face 41*b* are spaced apart from each other, in the thickness direction z. The obverse face 41*a* is oriented upward in the thickness direction z, and the reverse face 41*b* is oriented downward in the thickness direction z. The obverse face 41*a* and the reverse face 41*b* are flat (or generally flat).

The obverse face metal layer 42 is, as shown in FIG. 21, formed on the obverse face 41*a* of the insulation layer 41. The plurality of control terminals 33 are each erected on the obverse face metal layer 42. The obverse face metal layer 42 is constituted of, for example, Cu or a Cu-based alloy. The material may be Al or an Al-based alloy, instead of either of Cu or the Cu-based alloy. The thickness of the obverse face metal layer 42 (size along the thickness direction z) is, for example, between 200 μm and 500 μm, both ends inclusive. As shown in FIG. 7, the obverse face metal layer 42 includes a plurality of conductive sections 421 to 424.

The plurality of conductive sections 421 to 424 are spaced, and insulated, from each other. The thickness direction of each of the conductive sections 421 to 424 is aligned with the thickness direction z. In each of the first conductive substrate 4A and the second conductive substrate 4B, the shape of the plurality of conductive sections 421 to 424 in a plan view is not limited to the illustrated example, but may be modified as desired, depending on the specification of the semiconductor device A1 (e.g., location of semiconductor element 1, location of first power terminal 31 and second power terminal 32). The conductive sections 421 to 424 of the first conductive substrate 4A each exemplify the "first conductive section" in the present disclosure, and the conductive sections 421 to 424 of the second conductive substrate 4B each exemplify the "second conductive section".

The conductive section 421, to which a plurality of wires 651 are connected, is electrically connected to the respective first obverse-face electrodes 11 (gate) of the semiconductor elements 1, via the wires 651. As shown in FIG. 7, FIG. 18, and FIG. 20, the first drive terminal 34A is bonded to the conductive section 421 of the first conductive substrate 4A, and the second drive terminal 35A is bonded to the conductive section 421 of the second conductive substrate 4B.

The conductive section 422, to which a plurality of wires 652 are connected, is electrically connected to the respective second obverse-face electrode 12 (source) of the semiconductor elements 1, via the wires 652. As shown in FIG. 7, FIG. 18, and FIG. 20, the first detection terminal 34B is bonded to the conductive section 422 of the first conductive substrate 4A, and the second detection terminal 35B is bonded to the conductive section 422 of the second conductive substrate 4B.

A pair of conductive sections 423, to each of which the wire 653 is connected, is electrically connected to the respective third obverse-face electrodes 13 of the semiconductor elements 1 having the diode function unit D1, via the wire 653. As shown in FIG. 7, FIG. 18, and FIG. 20, the first detection terminals 34C are respectively bonded to the conductive sections 423 of the first conductive substrate 4A, and the second detection terminals 35C are respectively bonded to the conductive sections 423 of the second conductive substrate 4B.

The conductive section 424 of the first conductive substrate 4A, to which the wire 654 is connected as shown in FIG. 7, is electrically connected to the first conductor 24A, via the wire 654. To the conductive section 424 of the first conductive substrate 4A, the first detection terminal 34D is bonded, as shown in FIG. 7 and FIG. 20. To the conductive section 424 of the second conductive substrate 4B, none of the plurality of wires 641 to 645 are connected. Likewise, to the conductive section 424 of the second conductive substrate 4B, none of the plurality of control terminals 33 are bonded.

In each of the first conductive substrate 4A and the second conductive substrate 4B, the plurality of conductive sections 421 to 424 each include a terminal bonding face 420*a*, an opening 420*b*, and a through-hole 420*c*. The terminal bonding face 420*a*, the opening 420*b*, and the through-hole 420*c* are formed in the same way, in all of the conductive sections 421 to 424 of the first conductive substrate 4A and the second conductive substrate 4B.

The terminal bonding face 420*a* is oriented upward in the thickness direction z. To the terminal bonding face 420*a*, the respective holders 331 of the control terminals 33 are bonded via the conductive bonding material 63 to be subsequently described. The terminal bonding face 420*a* is flat (or generally flat).

The opening 420*b* is formed in the terminal bonding face 420*a*. As shown in FIG. 8, at least a part of the outer peripheral edge of the opening 420*b* is located on the inner side of the outer peripheral edge 331*d* of the holder 331, in a plan view. Here, the outer peripheral edge 331*d* of the holder 331 corresponds to the outer peripheral edge at the end portion of the holder 331 on the side of the terminal bonding face 420*a*, in the thickness direction z. Accordingly, in the configuration where the holder 331 includes the lower-end flange portion 331*c*, the outer peripheral edge 331*d* of the holder 331 in a plan view corresponds to the outer peripheral edge of the lower-end flange portion 331*c* in a plan view. In the semiconductor device A1, as shown in FIG. 8, the opening 420*b* is formed such that the outer peripheral edge in a plan view becomes concentric with the outer peripheral edge 331*d* of the holder 331 in a plan view. Further, as is apparent from FIG. 8 and FIG. 21, the entire outer peripheral edge of the opening 420*b* is overlapping with the lower-end flange portion 331*c*, in a plan view. The diameter r2 of the opening 420*b* in a plan view (see FIG. 8) is, for example, between 0.8 mm and 1.6 mm, both ends inclusive.

The through-hole 420*c* is connected to the opening 420*b*, and penetrating through each of the conductive sections 421 to 424 in the thickness direction z, from the opening 420*b*. As shown in FIG. 21, the conductive bonding material 63 is formed in a part of the through-hole 420*c*, and the inner surface of the through-hole 420*c* is in contact with the conductive bonding material 63. In the example shown in FIG. 21, the inner surface of the through-hole 420*c* is inclined in a tapered shape in the thickness direction z, from the side of the opening 420*b* toward the side of the insulation layer 41. However, the inner surface of the through-hole 420*c* does not have to be inclined in the tapered shape. As result of forming the through-hole 420*c* in each of the conductive sections 421 to 424, the insulation layer 41 includes an exposed portion 410 overlapping with the through-hole 420*c* in a plan view, and uncovered with the obverse face metal layer 42, as shown in FIG. 21. The through-hole 420*c* exemplifies the "second through-hole" in the present disclosure.

The reverse face metal layer 43 is, as shown in FIG. 21, formed on the reverse face 41*b* of the insulation layer 41. The reverse face metal layer 43 of the first conductive substrate 4A is, as shown in FIG. 14, FIG. 20, and FIG. 21, bonded to the first conductor 24A via the bonding material 49. The reverse face metal layer 43 of the second conductive substrate 4B is, as shown in FIG. 14 and FIG. 18, bonded to the second conductor 24B via the bonding material 49.

The conduction member 5 constitutes, with the base substrate 2, the path for a main circuit current to be switched by the plurality of semiconductor elements 1. The conduction member 5 is spaced apart from the base substrate 2 in the thickness direction z, and overlapping with the base substrate 2, in a plan view. The conduction member 5 is formed of a plate-shaped member made of a metal.

Examples of such metal include Cu and a Cu-based alloy. The conduction member 5 is partly bent. The conduction member 5 includes a plurality of first conduction members 51 and a second conduction member 52. The main circuit current includes a first main circuit current and a second main circuit current. The first main circuit current runs between the input terminal 31A and the output terminal 32A. The second main circuit current runs between the output terminal 32A and the input terminal 31B.

The plurality of first conduction members 51 are bonded to the respective second obverse-face electrodes 12 (source) of the plurality of first semiconductor elements 1A and the second conductor 24B, to make the respective second obverse-face electrodes 12 of the plurality of first semiconductor elements 1A and the second conductor 24B electrically connected to each other. The first conduction members 51 and the respective second obverse-face electrodes 12 of the plurality of first semiconductor elements 1A, and the first conduction members 51 and the second conductor 24B, are bonded to each other via a conductive bonding material 591, as shown in FIG. 14. The conductive bonding material 591 may be, for example, one of solder, a metal paste, and a sintered metal. The first conduction members 51 are, as shown in FIG. 7, each formed in a belt-like shape extending in the first direction x, in a plan view.

In the illustrated example, the number of first conduction members 51 is three, in correspondence with the number of first semiconductor elements 1A. Alternatively, for example, a single piece of first conduction member 51 may be provided in common for the plurality of first semiconductor elements 1A, regardless of the number thereof.

The second conduction member 52 provides the conduction path between the respective second obverse-face electrode 12 (source) of the plurality of second semiconductor elements 1B and the input terminals 31B. The maximum size of the second conduction member 52 in the first direction x is, for example, between 25 mm and 40 mm, both ends inclusive (preferably, 32 mm), and the maximum size in the second direction y is, for example, between 30 mm and 45 mm, both ends inclusive (preferably, 38 mm). However, such sizes of the second conduction member 52 are not limited to the mentioned example, but may be modified depending on the specification of the semiconductor device A1. The second conduction member 52 includes, as shown in FIG. 5 and FIG. 6, a pair of first wiring sections 521, a second wiring section 522, a third wiring section 523, and a plurality of fourth wiring sections 524.

One of the pair of first wiring sections 521 is connected to one of the pair of input terminals 31B, and the other of the pair of first wiring sections 521 is connected to the other of the pair of input terminals 31B. The first wiring section 521 and the corresponding input terminal 31B are bonded to each other via a conductive bonding material 592, as shown in FIG. 6 and FIG. 13. The conductive bonding material 592 may be, for example, solder, a metal paste, or a sintered metal. As shown in FIG. 5 and FIG. 6, the pair of first wiring sections 521 are each formed in a belt-like shape extending in the first direction x, in a plan view. The pair of first wiring sections 521 are spaced apart from each other in the second direction y, and parallel (or generally parallel) to each other.

Figure 5:
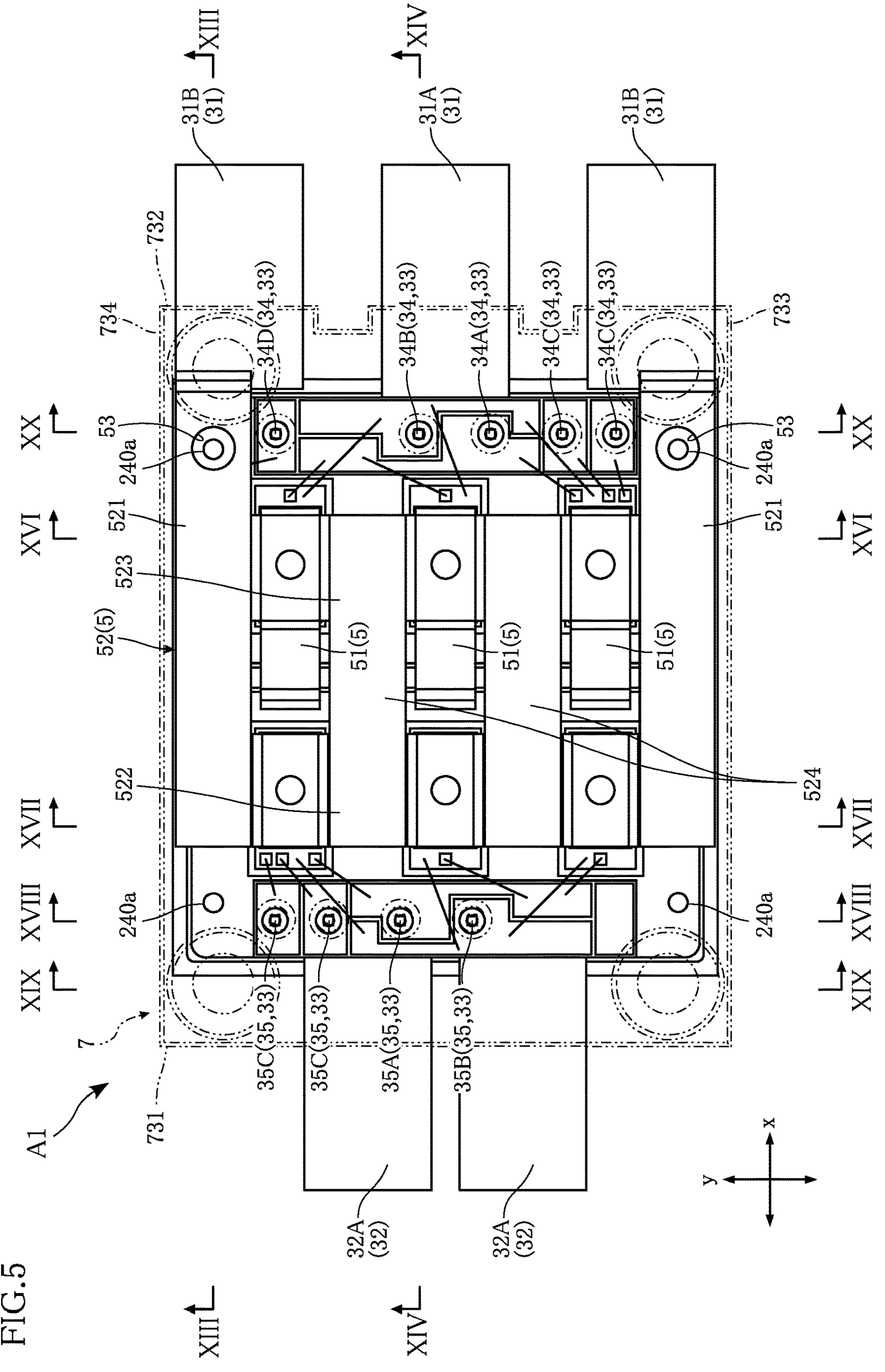
FIG. 5 is a plan view corresponding to FIG. 4, in which the resin member, the resin portion, and the resin filling are indicated by imaginary lines.
Figure 6:
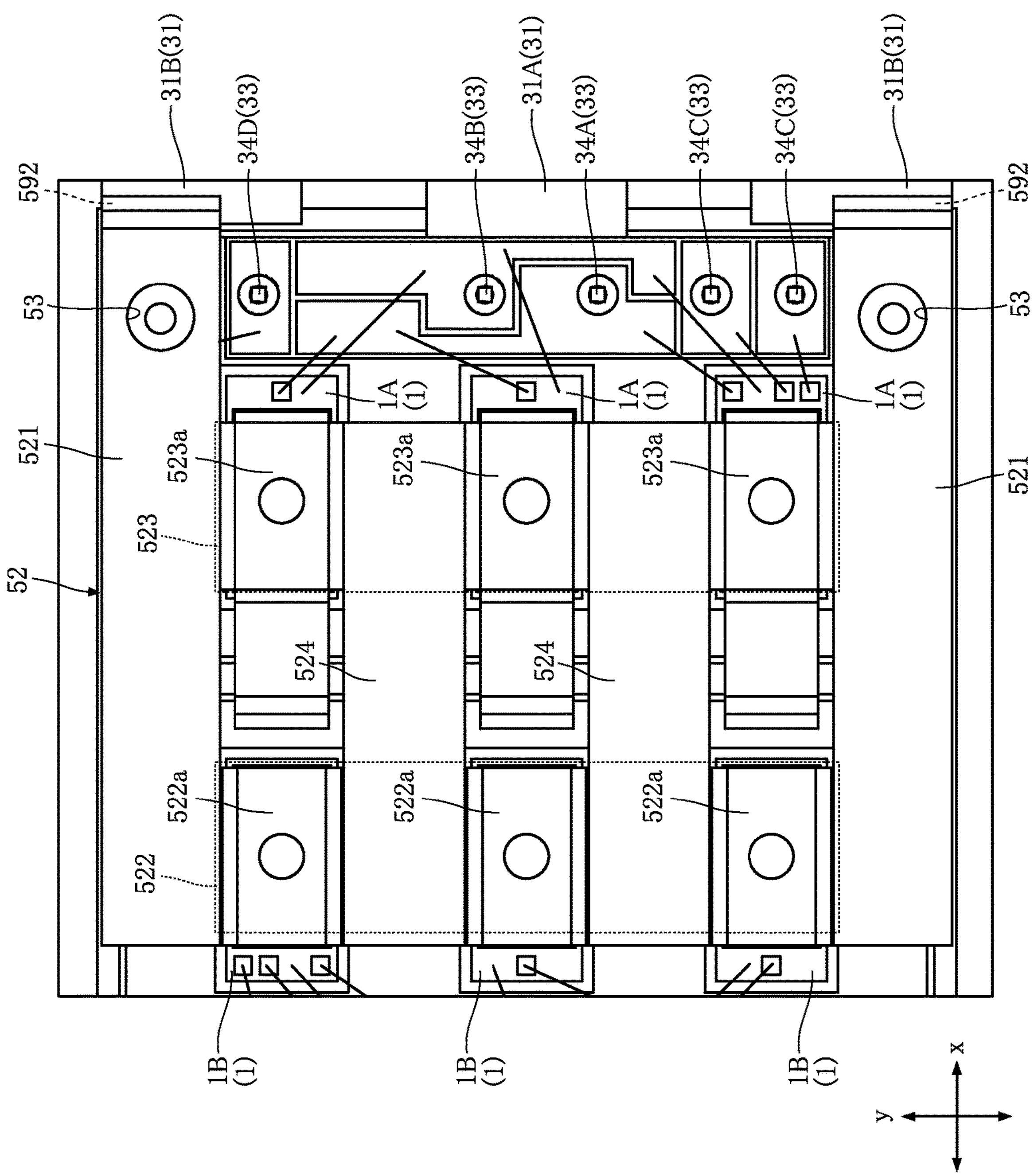
FIG. 6 is a partially enlarged plan view from FIG. 5, from which the resin member, the resin portion, and the resin filling are excluded.

The second wiring section 522 is, as shown in FIG. 5 and FIG. 6, connected to both of the pair of first wiring sections 521. The second wiring section 522 is formed in a belt-like shape extending in the second direction y, in a plan view. As is apparent from FIG. 5 and FIG. 6, the second wiring section 522 is overlapping with the plurality of second semiconductor elements 1B, in a plan view. As shown in FIG. 17, the second wiring section 522 is connected to each of the second semiconductor elements 1B. As shown in FIG. 6 and FIG. 17, the second wiring section 522 includes a plurality of recessed regions 522*a*. As shown in FIG. 17, the plurality of recessed regions 522*a* each protrude downward in the thickness direction z, with respect to the remaining portions of the second wiring section 522. As is apparent from FIG. 17, the recessed regions 522*a* of the second wiring section 522 and the respective second obverse-face electrodes 12 of the plurality of second semiconductor elements 1B are bonded to each other via a conductive bonding material 593. The conductive bonding material 593 may be, for example, solder, a metal paste, or a sintered metal.

The third wiring section 523 is, as shown in FIG. 5 and FIG. 6, connected to both of the pair of first wiring sections 521. The third wiring section 523 has a belt-like shape extending in the second direction y, in a plan view. The third wiring section 523 is spaced apart from the second wiring section 522, in the first direction x. The third wiring section 523 is parallelly (or generally parallelly) aligned with the second wiring section 522. The third wiring section 523 is overlapping with the plurality of first semiconductor elements 1A, in a plan view. As shown in FIG. 6 and FIG. 16, the third wiring section 523 includes a plurality of protruding regions 523*a*. The protruding regions 523*a* are, as shown in FIG. 16, each protruding upward in the thickness direction z, with respect to the remaining portions of the third wiring section 523. The protruding regions 523*a* are respectively overlapping with the first semiconductor elements 1A in a plan view, as shown in FIG. 6. Since the third wiring section 523 includes the plurality of protruding regions 523*a*, a region for bonding the first conduction member 51 is secured, on each of the first semiconductor elements 1A, as shown in FIG. 16. Such a configuration prevents the third wiring section 523 from contacting the first conduction member 51.

The plurality of fourth wiring sections 524 are, as shown in FIG. 5 and FIG. 6, connected to both of the second wiring section 522 and the third wiring section 523. The fourth wiring sections 524 each have a belt-like shape extending in the first direction x, in a plan view. The plurality of fourth wiring sections 524 are spaced apart from each other in the second direction y, and parallel (or generally parallel) to each other in a plan view. In each of the plurality of fourth wiring sections 524, an end portion in the first direction x is connected to a portion of the third wiring section 523 overlapping with a region between two first semiconductor elements 1A, adjacent to each other in the second direction y in a plan view, and the other end portion in the first direction x is connected to a portion of the second wiring section 522 overlapping with a region between two second semiconductor elements 1B, adjacent to each other in the second direction y in a plan view.

As shown in FIG. 5 to FIG. 7, the pair of first wiring sections 521 of the second conduction member 52 each include an opening 53. Each of the openings 53 is a portion of the first wiring sections 521 partially cut away, in a plan view. The opening 53 is located so as to overlap with the first conductor 24A, but not to overlap with the first semiconductor element 1A, in a plan view. The opening 53 is, as shown in FIG. 13, a through-hole penetrating through the first wiring sections 521 in the thickness direction z. Each of the openings 53 is located at a position overlapping with one of at least two corner portions of the first conductor 24A in a plan view and, for example, at a position on the first wiring section 521 closer to the first power terminal 31, in the first direction x. The plan-view shape of the opening 53 is not specifically limited. The opening 53 may be a hole as shown in FIG. 5 to FIG. 7, or a cut-away portion instead.

The plurality of conductive bonding materials 61 each serve to bond the semiconductor element 1 to the base substrate 2. The plurality of conductive bonding materials 61 I include a plurality of conductive bonding materials 61A and a plurality of conductive bonding materials 61B.

The plurality of conductive bonding materials 61A are, as shown in FIG. 14 to FIG. 16, each interposed between the first conductor 24A and the first semiconductor element 1A. The plurality of conductive bonding materials 61A each serve to adhere the first semiconductor element 1A to the first conductor 24A. The plurality of conductive bonding materials 61B are, as shown in FIG. 14 and FIG. 17, each interposed between the second conductor 24B and the second semiconductor element 1B. The plurality of conductive bonding materials 61B each serve to adhere the first semiconductor element 1B to the second conductor 24B.

The plurality of conductive bonding materials 61 (plurality of conductive bonding materials 61 and 61B) each include, as shown in FIG. 15, a base layer 611, an upper layer 612, and a lower layer 613. In each of the conductive bonding materials 61 (conductive bonding materials 61A and 61B), the base layer 611, the upper layer 612, and the lower layer 613 are stacked on each other. The base layer 611, the upper layer 612, and the lower layer 613 are formed in the same way in all of the conductive bonding materials 61 (conductive bonding materials 61A and 61B), unless otherwise specifically noted.

The base layer 611 is formed of a metal, which is, for example, Al or an Al-based alloy. The base layer 611 may be formed, for example, from a sheet material.

The upper layer 612 is formed on the upper face of the base layer 611, as shown in FIG. 15. In the conductive bonding material 61A, the upper layer 612 is interposed between the base layer 611 and the first semiconductor element 1A, as shown in FIG. 15. The upper layer 612 of the conductive bonding material 61A is bonded to the reverse face electrode 15 of the first semiconductor element 1A, for example by solid-phase diffusion of the metal. In the conductive bonding material 61B, the upper layer 612 is interposed between the base layer 611 and the second semiconductor element 1B. The upper layer 612 of the conductive bonding material 61B is bonded to the reverse face electrode 15 of the second semiconductor element 1B, for example by the solid-phase diffusion of the metal. Thus, the respective upper layers 612 of the pair of conductive bonding materials 61A and 61B, and the respective reverse face electrodes 15 of the first semiconductor element 1A and the second semiconductor element 1B, are bonded to each other, in direct contact at the bonding interface.

The lower layer 613 is formed on the lower face of the base layer 611, as shown in FIG. 15. In the conductive bonding material 61A, the lower layer 613 is interposed between the base layer 611 and the first conductor 24A, as shown in FIG. 15. The lower layer 613 of the conductive bonding material 61A is bonded to the obverse face bonding layer 242 of the first conductor 24A, for example by the solid-phase diffusion of the metal. Likewise, in the conductive bonding material 61B, the lower layer 613 is interposed between the base layer 611 and the second conductor 24B. The lower layer 613 of the conductive bonding material 61B is bonded to the obverse face bonding layer 242 of the second conductor 24B, for example by the solid-phase diffusion of the metal. Thus, the respective lower layers 613 of the pair of conductive bonding materials 61A and 61B, and the respective obverse face bonding layers 242 of the first conductor 24A and the second conductor 24B, are bonded to each other, in direct contact at the bonding interface.

The conductive bonding materials 61 (conductive bonding materials 61A and 61B) may each be formed of solder, a metal paste, or a sintered metal, instead of being composed of the base layer 611, the upper layer 612, and the lower layer 613 as described above.

The plurality of conductive bonding materials 63 each serve to conductively bond the respective holders 331 of the control terminals 33 to the corresponding obverse face metal layer 42 of the conductive substrates 4 (first conductive substrate 4A and second conductive substrate 4B). The plurality of conductive bonding materials 63 are, for example, constituted of solder. The plurality of conductive bonding materials 63 include a plurality of conductive bonding materials 63A and a plurality of conductive bonding materials 63B.

The conductive bonding materials 63A each serve to bond, as shown in FIG. 20, one of the plurality of first control terminals 34 (first drive terminal 34A and plurality of first detection terminals 34B to 34D) to the corresponding one of the conductive sections 421 to 424 of the obverse face metal layer 42 of the first conductive substrate 4A. In the semiconductor device A1, as shown in FIG. 20, by means of each of the conductive bonding materials 63A, the holder 331 of the first drive terminal 34A is bonded to the conductive section 421 of the obverse face metal layer 42 of the first conductive substrate 4A, the holder 331 of the first detection terminal 34B is bonded to the conductive section 422 of the obverse face metal layer 42 of the first conductive substrate 4A, the respective holders 331 of the pair of first detection terminals 34C are each bonded to the corresponding conductive section 423 of the obverse face metal layer 42 of the first conductive substrate 4A, and the holder 331 of the first detection terminal 34D is bonded to the conductive section 424 of the obverse face metal layer 42 of the first conductive substrate 4A.

The conductive bonding materials 63B each serve to bond one of the plurality of second control terminals 35 (second drive terminal 35A and plurality of second detection terminals 35B and 35C) to the corresponding one of the conductive sections 421 to 424 of the obverse face metal layer 42 of the second conductive substrate 4B. In the semiconductor device A1, as shown in FIG. 18, by means of each of the conductive bonding materials 63B, the holder 331 of the second drive terminal 35A is bonded to the conductive section 421 of the obverse face metal layer 42 of the second conductive substrate 4B, the second detection terminal 35B is bonded to the conductive section 422 of the obverse face metal layer 42 of the second conductive substrate 4B, and the pair of second detection terminals 35C are each bonded to the corresponding conductive section 423 of the obverse face metal layer 42 of the second conductive substrate 4B.

As shown in FIG. 15, at least a part of each of the plurality of conductive bonding materials 63 is interposed between the holder 331 (lower-end flange portion 331*c*) of the control terminal 33 and the obverse face metal layer 42 (one of conductive sections 421 to 424) of the conductive substrate 4 (first conductive substrate 4A or second conductive substrate 4B), in the thickness direction z. The thickness of such interposed portion (size in the thickness direction z) is, for example, between 20 μm and 70 μm both ends inclusive. The thickness in this range enables an appropriate bonding strength to be secured, while preventing the thickness from becoming excessive. As shown in FIG. 15, the outer peripheral edge of each of the plurality of conductive bonding materials 63 is located on the outer side of the outer peripheral edge 331*d* of the corresponding holder 331 of the control terminal 33, in a plan view.

In the example shown in FIG. 21, the plurality of conductive bonding materials 63 (plurality of conductive bonding materials 63A and plurality of conductive bonding materials 63B) each include an inflow portion 631 and a filling portion 632. The inflow portion 631 corresponds to a portion of the conductive bonding material 63 formed inside the through-hole 332 of the holder 331. For example, the upper face of the inflow portion 631 is, as shown in FIG. 21, formed in an arcuate shape, downwardly concave in the thickness direction z, as viewed in the direction orthogonal to the thickness direction z (e.g., first direction x). Alternatively, the upper face of the inflow portion 631 may be flat. The shape of the upper face of the inflow portion 631 may become arcuately curved or flat, depending on the type of the surface treatment of the holder 331, and the type of the conductive bonding material 63 (solder). A ratio of a size h1 of the inflow portion 631 in the thickness direction z, to the inner diameter of the holder 331 (diameter r1 of through-hole 332) (h1/r1×100) is, for example, between 10% and 65%, both ends inclusive. Further, the size h1 of the inflow portion 631 in the thickness direction z is, for example, between 100 μm and 500 μm, both ends inclusive. The filling portion 632 corresponds to a portion of the conductive bonding material 63 formed inside the through-hole 420*c*. The lower face of the filling portion 632 is arcuately curved. Here, the conductive bonding material 63 illustrated in FIG. 21 represents the case where the diameter r2 of the opening 420*b* in a plan view is, for example, 0.8 mm.

In the semiconductor device A1, since the conductive bonding material 63 is solder, and the respective insulation layers 41 of the first conductive substrate 4A and the second conductive substrate 4B are formed of a ceramic, the insulation layers 41 have low affinity (low wettability) with the conductive bonding material 63. Accordingly, as shown in FIG. 21, a void 630 is formed between the conductive bonding material 63 and the insulation layer 41. This is because it is difficult for the conductive bonding material 63 to make contact with the insulation layer 41, owing to the low affinity of the insulation layer 41 with the conductive bonding material 63, and therefore the void 630 remains after the conductive bonding material 63 is cured. Because of the presence of the void 630, at least a part of the exposed portion 410 of the insulation layer 41 is out of contact with the conductive bonding material 63, as shown in FIG. 21.

In the semiconductor device A1, further, since the conductive bonding material 63 is solder, and the respective obverse face metal layers 42 of the first conductive substrate 4A and the second conductive substrate 4B are formed of Cu or a Cu-based alloy, the obverse face metal layer 42 have high affinity (high wettability) with the conductive bonding material 63. Therefore, as shown in FIG. 21, the conductive bonding material 63 makes contact with the inner surface of the through-hole 420*c*.

In the semiconductor device A1, in addition, since the conductive bonding material 63 is solder, and the respective holders 331 of the plurality of control terminals 33 are also formed of Cu or a Cu-based alloy, the holders 331 have high affinity (high wettability) with the conductive bonding material 63. Therefore, as shown in FIG. 21, the conductive bonding material 63 flows into the through-hole 332 of the holder 331, thus to form the inflow portion 631. However, there may be cases where the inflow portion 631 is not formed, depending on the amount of the conductive bonding material 63 and the volume of the through-hole 420*c*.

The plurality of wires 651 to 654 each provide electrical connection between two components spaced apart from each other. The plurality of wires 651 to 654 are, for example, bonding wires. The material of the plurality of wires 651 to 654 contains, for example, one of gold (Au), A1, and Cu.

The plurality of wires 651 include a plurality of first wires 651A and a plurality of second wires 651B. As shown in FIG. 7, the plurality of first wires 651A are each bonded to one of the respective first obverse-face electrodes 11 (gate) of the first semiconductor elements 1A, and the conductive section 421 of the obverse face metal layer 42 of the first conductive substrate 4A, to provide electrical connection therebetween. As shown in FIG. 7, the plurality of second wires 651B are each bonded to one of the respective first obverse-face electrodes 11 (gate) of the second semiconductor elements 1B, and the conductive section 421 of the conductive section 421 of the second conductive substrate 4B, to provide electrical connection therebetween.

The plurality of wires 652 include a plurality of first wires 652A and a plurality of second wires 652B. As shown in FIG. 7, the plurality of first wires 652A are each bonded to one of the respective second obverse-face electrodes 12 (source) of the first semiconductor elements 1A, and the conductive section 422 of the obverse face metal layer 42 of the first conductive substrate 4A, to provide electrical connection therebetween. As shown in FIG. 7, the plurality of second wires 652B are each bonded to one of the respective second obverse-face electrodes 12 (source) of the first semiconductor elements 1B, and the conductive section 422 of the obverse face metal layer 42 of the second conductive substrate 4B, to provide electrical connection therebetween. In the case where the semiconductor elements 1 each include an additional electrode, serving as a source sense, the first wire 652A and the second wire 652B are bonded to the additional electrode serving as the source sense, instead of the second obverse-face electrode 12 (source).

The plurality of wires 653 include a pair of first wires 653A and a pair of second wires 653B. As shown in FIG. 7, the pair of first wires 653A are each bonded to one of the third obverse-face electrodes 13 of the first semiconductor element 1A having the diode function unit D1, and one of the conductive sections 423 of the obverse face metal layer 42 of the first conductive substrate 4A, to provide electrical connection therebetween. As shown in FIG. 7, the pair of second wires 654B are each bonded to one of the third obverse-face electrodes 13 of the second semiconductor element 1B having the diode function unit D1, and one of the conductive sections 423 of the obverse face metal layer 42 of the second conductive substrate 4B, to provide electrical connection therebetween.

The wire 654 is, as shown in FIG. 7, bonded to the first conductor 24A and the conductive section 424 of the first conductive substrate 4A, to provide electrical connection therebetween.

The resin member 7 covers the plurality of semiconductor elements 1, a part of the base substrate 2, a part of each of the first power terminal 31 and the second power terminal 32, the conductive substrate 4 (first conductive substrate 4A and second conductive substrate 4B), the conduction member 5 (first conduction member 51 and second conduction member 52), the plurality of conductive bonding materials 61 and 63, and the plurality of wires 651 to 654. The resin member 7 is, for example, formed of an insulative resin material, such as an epoxy resin. The resin member 7 is formed, for example, by molding. The size of the resin member 7 is, for example, between 35 mm and 60 mm both ends inclusive, in the first direction x, between 35 mm and 50 mm both ends inclusive, in the second direction y, and between 4 mm and 15 mm both ends inclusive, in the thickness direction z. The mentioned sizes each represent the size of the largest portion in the corresponding direction. The sizes of the resin member 7 are not limited to the mentioned example, but may be modified as desired, depending on the specification of the semiconductor device A1. The resin member 7 includes a resin obverse face 71, a resin reverse face 72, and a plurality of resin side faces 731 to 734.

Figure 9:
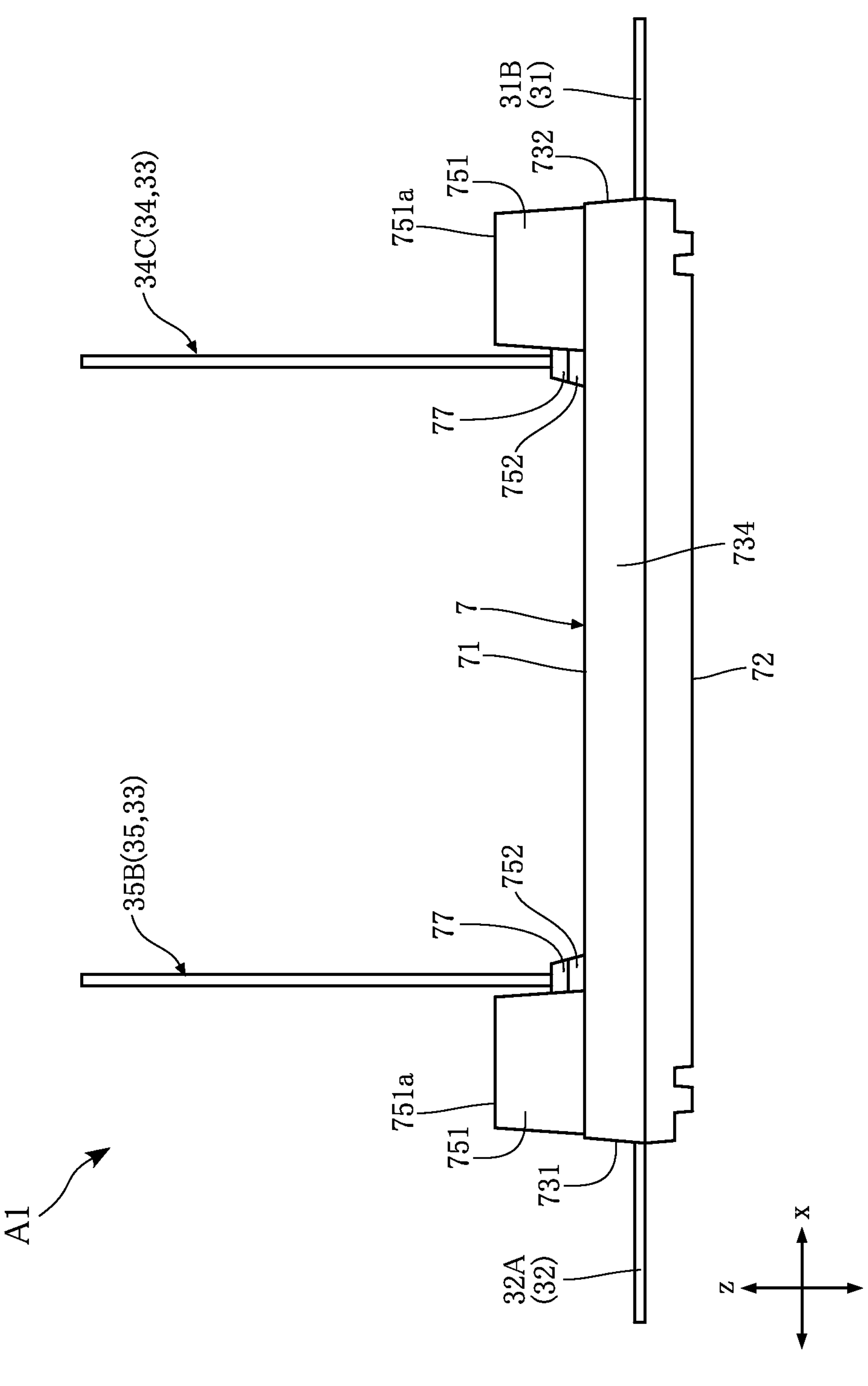
FIG. 9 is a front view showing the semiconductor device according to the embodiment.
Figure 10:
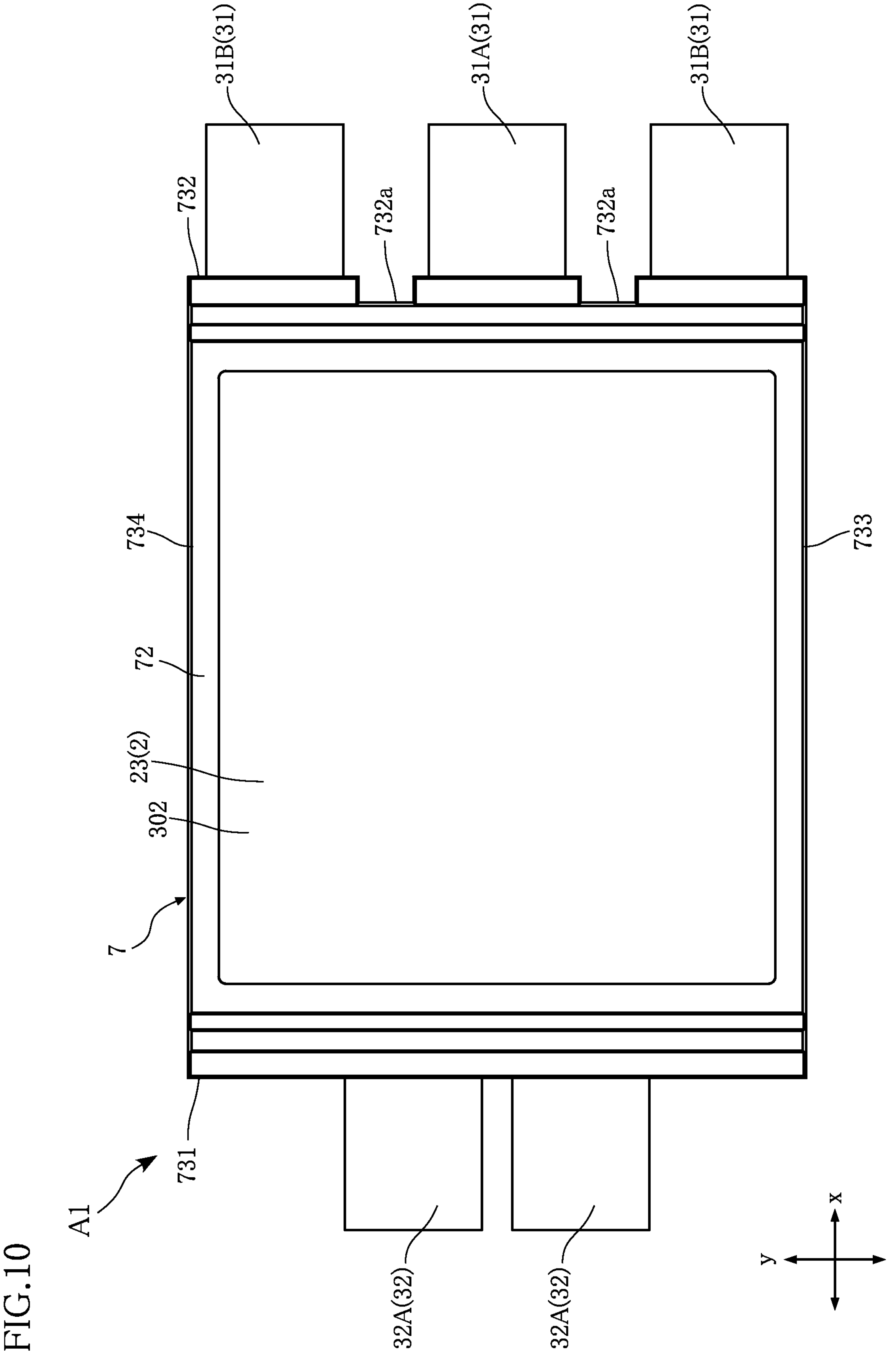
FIG. 10 is a bottom view showing the semiconductor device according to the embodiment.
Figure 11:
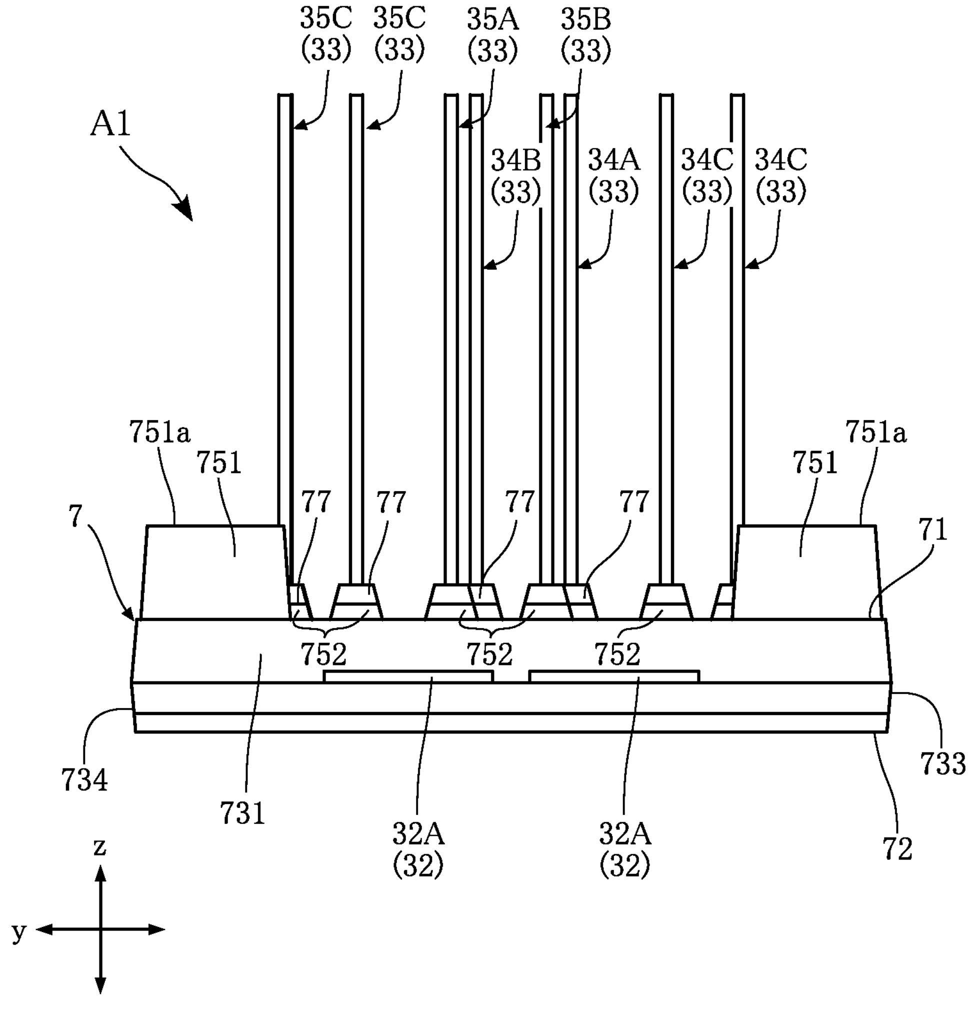
FIG. 11 is a left-side view showing the semiconductor device according to the embodiment.
Figure 12:
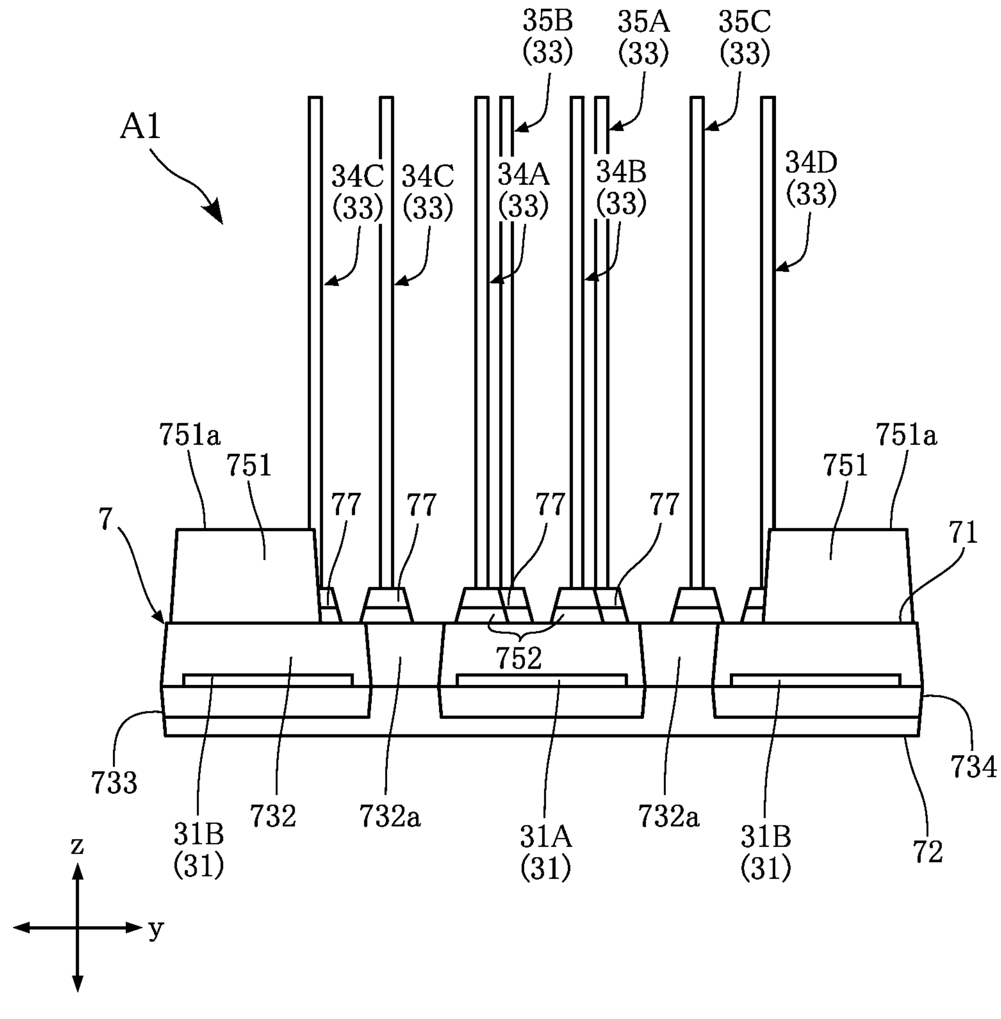
FIG. 12 is a right-side view showing the semiconductor device according to the embodiment.

The resin obverse face 71 and the resin reverse face 72 are, as shown in FIG. 9, FIG. 11, and FIG. 12, spaced apart from each other in the thickness direction z. The resin obverse face 71 is oriented upward in the thickness direction z, and the resin reverse face 72 is oriented downward in the thickness direction z. From the resin obverse face 71, the plurality of control terminals 33 (first drive terminal 34A, plurality of first detection terminals 34B to 34D, second drive terminal 35A, and plurality of second detection terminals 35B and 35C) are protruding. The resin reverse face 72 is, as shown in FIG. 10, formed in a frame shape surrounding the lower face (face oriented downward in the thickness direction z) of the obverse face metal layer 42 of the conductive substrate 4, in a plan view. From the resin reverse face 72, the lower face of the obverse face metal layer 42 is exposed. For example, the resin reverse face 72 is flush with the lower face of the obverse face metal layer 42. The plurality of resin side faces 731 to 734 are each connected to both of the resin obverse face 71 and the resin reverse face 72, and interposed therebetween in the thickness direction z. As shown in FIG. 4, FIG. 9, and FIG. 10, the resin side face 731 and the resin side face 732 are spaced apart from each other in the first direction x. The resin side face 732 is oriented to one side in the first direction x, and the resin side face 731 is oriented to the other side in the first direction x. Two output terminals 32A (second power terminal 32) are protruding from the resin side face 731, and three input terminals 31A and 31B (first power terminal 31) are protruding from the resin side face 732. As shown in FIG. 4 and FIG. 10 to FIG. 12, the resin side face 733 and the resin side face 734 are spaced apart from each other in the second direction y. The resin side face 734 is oriented to one side in the second direction y, and the resin side face 733 is oriented to the other side in the second direction y.

The resin side face 732 includes, as shown in FIG. 4 and FIG. 10, a plurality of recesses 732*a*. The recesses 732*a* are each recessed in the first direction x, in a plan view. The plurality of recesses 732*a* include one formed between the input terminal 31A and one of the pair of input terminals 31B in a plan view, and another one formed between the input terminal 31A and the other of the pair of input terminals 31B in a plan view. The plurality of recesses 732*a* are provided to increase the creepage distance along the resin side face 732 between the input terminal 31A and one of the pair of input terminals 31B, and the creepage distance along the resin side face 732 between the input terminal 31A and the other of the pair of input terminals 31B.

The resin member 7 also includes, as shown in FIG. 13 and FIG. 14, a plurality of first protruding portions 751, a plurality of second protruding portions 752, and a resin cavity 76.

The plurality of first protruding portions 751 are, as shown in FIG. 13, each protruding in the thickness direction z, from the resin obverse face 71. The plurality of first protruding portions 751 are each located close to one of four corners of the resin member 7, in a plan view. As shown in FIG. 13, a first protruding end face 751*a* is formed on the distal end portion (upper end portion in the thickness direction z) of each of the first protruding portions 751. The respective first protruding end faces 751*a* of the plurality of first protruding portions 751 are parallel (or generally parallel) to the resin obverse face 71, and located on the same plane (x-y plane). The first protruding portions 751 are, for example, each formed in a bottomed and hollow truncated conical shape. The plurality of first protruding portions 751 each serve as a spacer, in a device that utilizes the power generated by the semiconductor device A1, when the semiconductor device A1 is mounted, for example, on a control circuit board of the device. It suffices that the first protruding portion 751 is formed in a column shape, preferably in a circular column shape.

The plurality of second protruding portions 752 are, as shown in FIG. 14, each protruding in the thickness direction z, from the resin obverse face 71. In a plan view, the plurality of second protruding portions 752 are respectively overlapping with the plurality of control terminals 33. The metal pin 333 of each of the plurality of control terminals 33 is protruding from the second protruding portion 752. A part of the holder 331 (upper face of the upper-end flange portion 331*b*) is exposed from the upper end face of each of the second protruding portions 752. The second protruding portions 752 are each formed in a truncated conical shape. A resin portion 77 is located on each of the second protruding portions 752.

As shown in FIG. 14, the resin portion 77 is located on the second protruding portion 752 of the resin member 7. On each of the control terminals 33, the resin portion 77 covers a part of the holder 331 exposed from the resin member 7 (upper face of the upper-end flange portion 331*b*), and a part of the metal pin 333. While the resin portion 77 is formed of an insulative resin material (e.g., epoxy resin), for example like the resin member 7, the resin portion 77 may be formed of a material different from the resin member 7. The resin portion 77 is formed, for example, by a resin potting method, after the metal pin 333 is inserted into the holder 331.

The resin cavity 76 is, as shown in FIG. 13, formed so as to communicate between the resin obverse face 71 and the recess 240*a*, in the thickness direction z. The resin cavity 76 is formed in a tapered shape, such that the cross-sectional area is gradually reduced toward the recess 240*a* from the resin obverse face 71 in the thickness direction z.

The resin filling 78 is loaded in the resin cavity 76, so as to fill the resin cavity 76. While the resin filling 78 is formed of an insulative resin material (e.g., epoxy resin), for example like the resin member 7, the resin filling 78 may be formed of a material different from the resin member 7. The resin filling 78 is formed, for example, by a resin potting method. The lower end face of the resin filling 78 in the thickness direction z is in contact with the recess 240*a* of the first conductor 24A or the second conductor 24B.

The working and the advantageous effects of the semiconductor device A1 are as described hereunder.

The semiconductor device A1 is incorporated with the junction structure including the conductive substrate 4 (first conductive substrate 4A or second conductive substrate 4B), the control terminals 33, and the conductive bonding material 63. The conductive substrate 4 (first conductive substrate 4A or second conductive substrate 4B) includes the conductive sections 421 to 424. The control terminals 33 each include the holder 331 and the metal pin 333. The conductive bonding materials 63 serve to bond the conductive sections 421 to 424 and the control terminal 33. The holder 331 includes a through-hole 332. The through-hole 332 is formed so as to penetrate through the holder 331 in the thickness direction z, and a part of the metal pin 333 (straight portion 333*a*) is inserted into the through-hole 332. The conductive sections 421 to 424 each include the terminal bonding face 420*a* to which the holder 331 is bonded, and the opening 420*b* formed in the terminal bonding face 420*a*. In a junction structure where, unlike the above, the conductive sections 421 to 424 are without the opening 420*b*, the conductive bonding material 63 flows into the through-hole 332, when the holder 331 is bonded to each of the conductive sections 421 to 424, and therefore a sufficient terminal insertion depth may fail to be secured. In contrast, with the junction structure of the semiconductor device A1, the opening 420*b* serves to suppress the conductive bonding material 63 from flowing into the through-hole 332. Accordingly, the insertion depth of the metal pin 333 into the holder 331 can be properly secured. Consequently, the junction structure of the semiconductor device A1 enables the metal pin 333 to be properly inserted into the holder 331, thereby preventing the metal pin 333 from coming off from the holder 331. For example, when the size dl of the straight portion 333*a* of the metal pin 333 in the thickness direction z (see FIG. 21) is between 20% and 90% (preferably between 60% and 85%) both ends inclusive, of the size of the holder 331 in the thickness direction z, it can be assumed that the metal pin 333 is properly inserted into the holder 331.

The inventor of the present disclosure simulated the amount of upward intrusion of the conductive bonding material 63 into the through-hole 332, under the condition where the diameter r2 of the opening 420*b* was 0.8 mm, and the inner diameter holder 331 (diameter r1 of the through-hole 332) was 0.74 mm. The amount of upward intrusion corresponds to the size h1 of the inflow portion 631 formed in the through-hole 332, in the thickness direction z (see FIG. 21). As result, while the amount of upward intrusion of the conductive bonding material 63 in the structure without the opening 420*b* was 500 μm or more, the amount of upward intrusion in the structure with the opening 420*b* was 450 μm or less. Thus, it was proved that the presence of the opening 420*b* suppresses the amount of upward intrusion of the conductive bonding material 63 into the holder 331 (through-hole 332).

In the junction structure of the semiconductor device A1, the outer peripheral edge of the opening 420*b* is, at least partially, located on the inner side of the outer peripheral edge 331*d* of the holder 331, in a plan view. As described above, the outer peripheral edge 331*d* corresponds to the outer peripheral edge of the lower end portion of the holder 331 in the thickness direction z. In this case, at least a part of the lower end portion of the holder 331 in the thickness direction z is opposed to the terminal bonding face 420*a*, and therefore such lower end portion is restricted from entering into the opening 420*b*. If the lower end portion of the holder 331 in the thickness direction z entered into the opening 420*b*, the amount of upward intrusion of the conductive bonding material 63 into the through-hole 332 would be increased, which would disable the insertion depth of the metal pin 333 into the holder 331 from being properly secured. Thus, the junction structure of the semiconductor device A1 prevents the lower end portion of the holder 331 in the thickness direction z from entering into the opening 420*b*, thereby suppressing the conductive bonding material 63 from intruding upward into the through-hole 332, and allowing the insertion depth of the metal pin 333 into the holder 331 to be properly secured.

In the junction structure of the semiconductor device A1, the holder 331 includes the tubular portion 331*a* and the lower-end flange portion 331*c*. For example, the entirety of the outer peripheral edge of the lower-end flange portion 331*c* is located on the outer side of the outer peripheral edge of the tubular portion 331*a*, in a plan view. Such a configuration increases the volume of the through-hole 420*c* communicating with the opening 420*b*, and yet prevents the lower end portion of the holder 331 in the thickness direction z from entering into the opening 420*b*. In other words, the conductive bonding material 63 can be effectively suppressed from intruding upward into the through-hole 332.

In the junction structure of the semiconductor device A1, the conductive bonding materials 63 each include the inflow portion 631, formed in the through-hole 332 of the holder 331. Accordingly, the conductive bonding material 63 serves to increase, with the presence of the inflow portion 631, the bonding strength between the holder 331 and each of the conductive sections 421 to 424. In the junction structure of the semiconductor device A1, in particular, the ratio of the size h1 of the inflow portion 631 in the thickness direction z, to the diameter r1 of the through-hole 332 (h1/r1×100) is between 10% and 65%, both ends inclusive. With such ratio being 10% or higher, the bonding strength can be increased, and with the ratio being 65% or lower, a sufficient insertion depth of the metal pin 333 into the holder 331 can be secured.

In the junction structure of the semiconductor device A1, the outer peripheral edge of the conductive bonding material 63 is located on the outer side of the outer peripheral edge 331*d* of the holder 331 of the control terminal 33, in a plan view. Accordingly, the conductive bonding material 63 is interposed between the lower-end flange portion 331*c* of the holder 331 and the terminal bonding face 420*a* of each of the conductive sections 421 to 424, in the thickness direction z. Therefore, the holder 331 of the control terminal 33 can be properly bonded to each of the conductive sections 421 to 424.

In the semiconductor device A1, the plurality of control terminals 33 are each connected to a control circuit board, on which the semiconductor device A1 is mounted. In this case, the control circuit board may be located on the upper side of the semiconductor device A1, in the thickness direction z. In addition, the first power terminals 31 (plurality of input terminals 31A and 31B) and the second power terminals 32 (two output terminals 32A) are connected to a power circuit board on which the semiconductor device A1 is mounted. In this case, the power circuit board may be located adjacent to the semiconductor device A1, in the first direction x. Under such a configuration, the power circuit board to which the first power terminals 31 and the second power terminals 32 are connected, and the control circuit board to which the control terminals 33 (metal pins 333) are connected, can be located apart from each other in the thickness direction z. Therefore, first, the degree of freedom in arranging the location of signal terminals in the semiconductor device A1 can be increased. Second, the degree of freedom in designing the routing and the length of signal wirings in the semiconductor device A1 can be increased. Third, the degree of freedom for the user in locating the circuit board, when putting the semiconductor device A1 to use, can be increased.

Referring now to FIG. 23 to FIG. 30, variations of the junction structure according to the present disclosure will be described hereunder.

Figure 23:
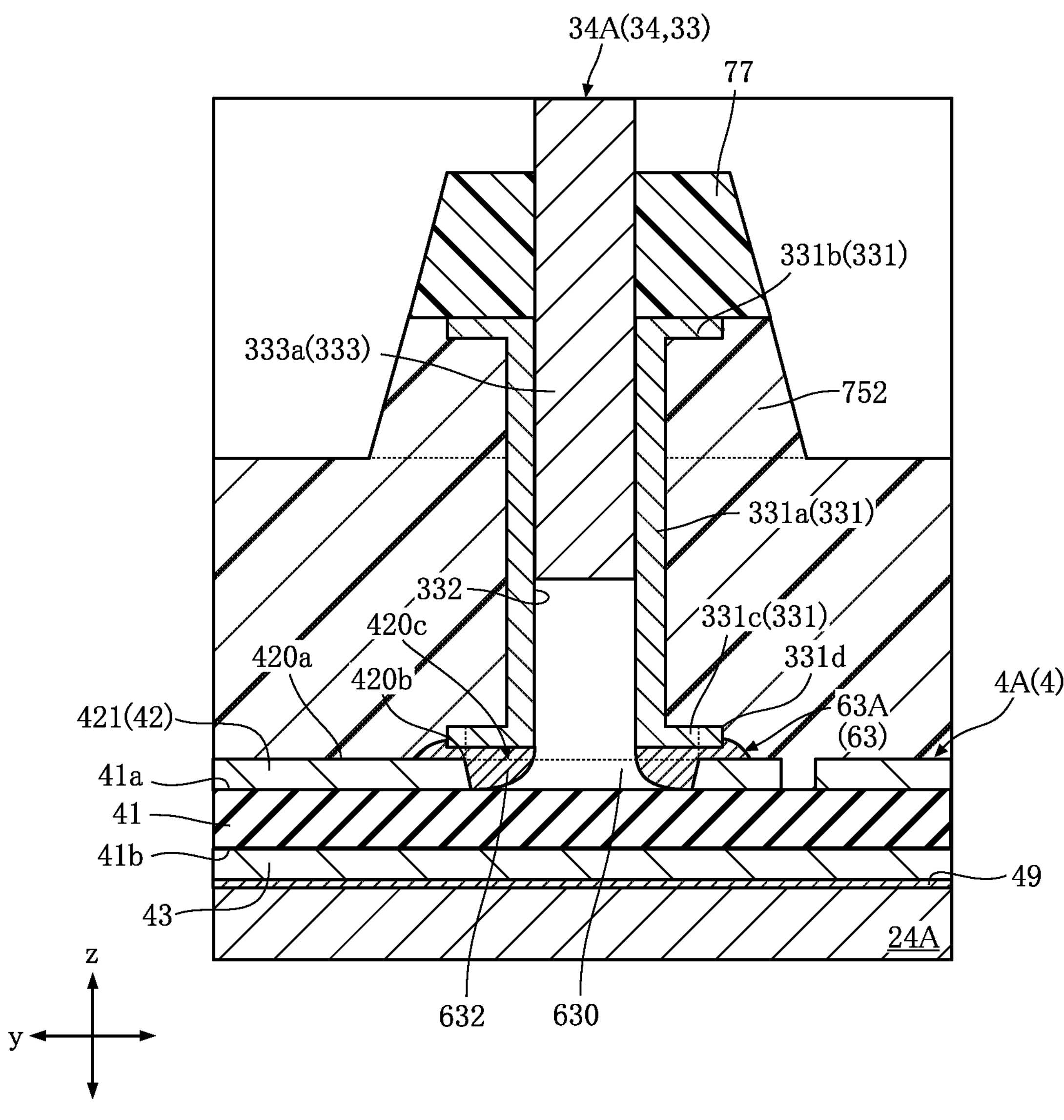
FIG. 23 is a partially enlarged cross-sectional view showing a variation of the junction structure according to the present disclosure.

FIG. 23 illustrates an example where, in the junction structure between each of the conductive sections 421 to 424 and the control terminal 33, the diameter r2 of the opening 420*b* is increased from the diameter r2 of the opening 420*b* of the foregoing semiconductor device A1. FIG. 23 is an enlarged partial cross-sectional view corresponding to FIG. 21. FIG. 23 illustrates the example of the conductive bonding material 63, in a configuration where the diameter r2 of the opening 420*b* in a plan view is, for example, approximately 1.6 mm. In the example shown in FIG. 23, the conductive bonding material 63 is without the inflow portion 631, and the void 630 is communicating with the through-hole 332. This is because the increase in diameter r2 of the opening 420*b* has resulted in an increase in volume of the through-hole 420*c*.

Figure 24:
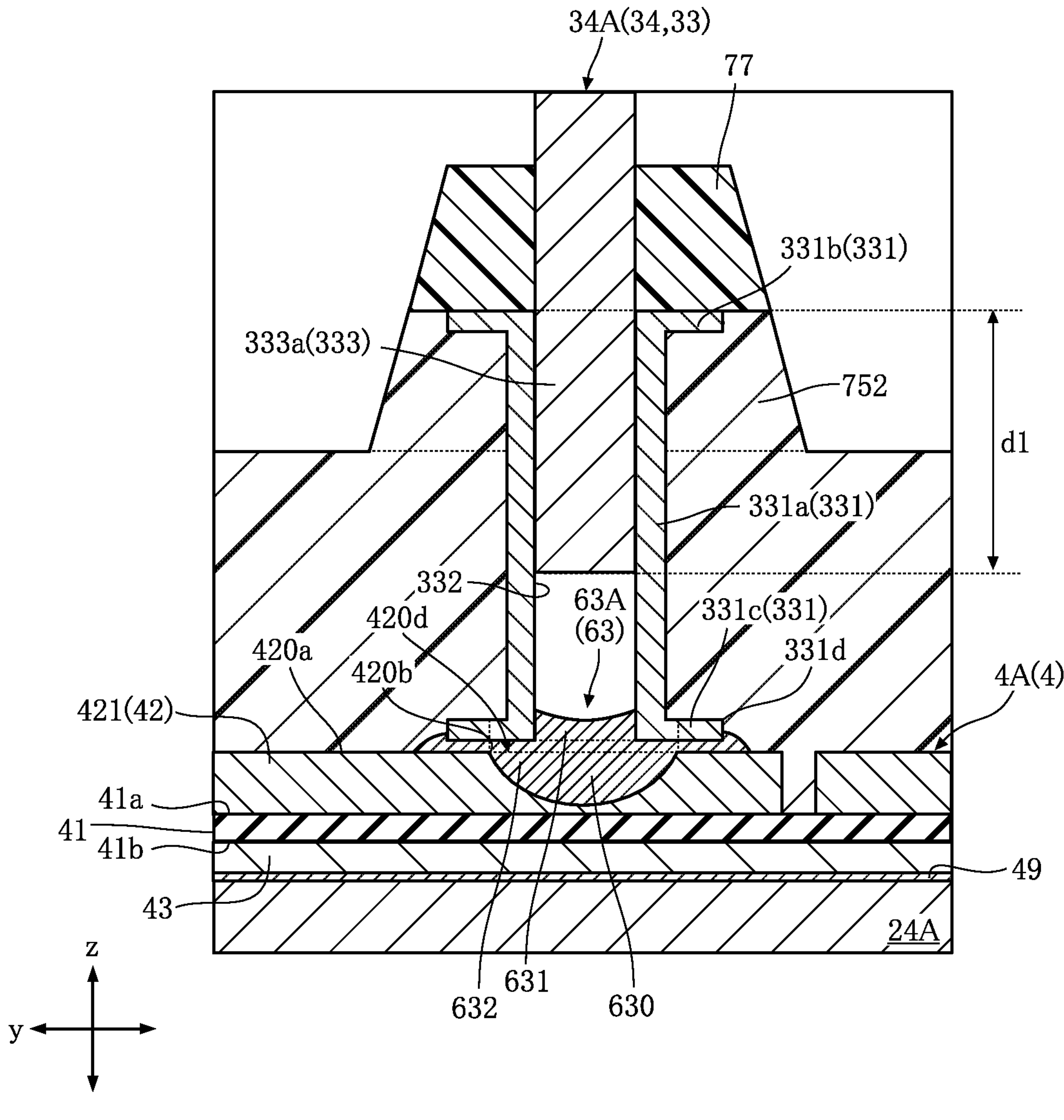
FIG. 24 is a partially enlarged cross-sectional view showing another variation of the junction structure according to the present disclosure.

FIG. 24 illustrates an example where, in the junction structure between each of the conductive sections 421 to 424 and the control terminal 33, a recess 420*d* is formed in each of the conductive sections 421 to 424, instead of the through-hole 420*c*. FIG. 24 is an enlarged partial cross-sectional view corresponding to FIG. 21. As shown in FIG. 24, the recess 420*d* is connected to the opening 420*b*, like the through-hole 420*c*. The depth of the recess 420*d* is, for example, between 50 μm and 200 μm, both ends inclusive. The depth of the recess 420*d* refers to the size between the terminal bonding face 420*a* and the bottom of the recess 420*d*, along the thickness direction z. For example, when the size of the conductive sections 421 to 424 in the thickness direction z (thickness of the obverse face metal layer 42) is large, the recess 420*d* may be formed instead of the through-hole 420*c*. This is because the recess 420*d* still allows a sufficient volume to be secured. When the thickness of the obverse face metal layer 42 (size of the conductive sections 421 to 424 in the thickness direction z) is, for example, 200 μm or more, the recess 420*d* may be formed. In the example shown in FIG. 24, the conductive bonding material 63 is kept from contacting the insulation layer 41, and therefore the recess 420*d* is completely filled with the filling portion 632. In other words, the void 630 is not formed, in the junction structure shown in FIG. 24.

FIG. 25 to FIG. 30 each illustrate an example where, in the junction structure between each of the conductive sections 421 to 424 and the control terminal 33, the opening 420*b* is formed in a different shape in a plan view. FIG. 25 to FIG. 30 are enlarged partial plan views corresponding to FIG. 8. In FIG. 25 to FIG. 30, however, the holder 331 of the control terminal 33 is indicated by imaginary lines, and the metal pin 333 of the control terminal 33 and the conductive bonding material 63 are omitted.

Figure 25:
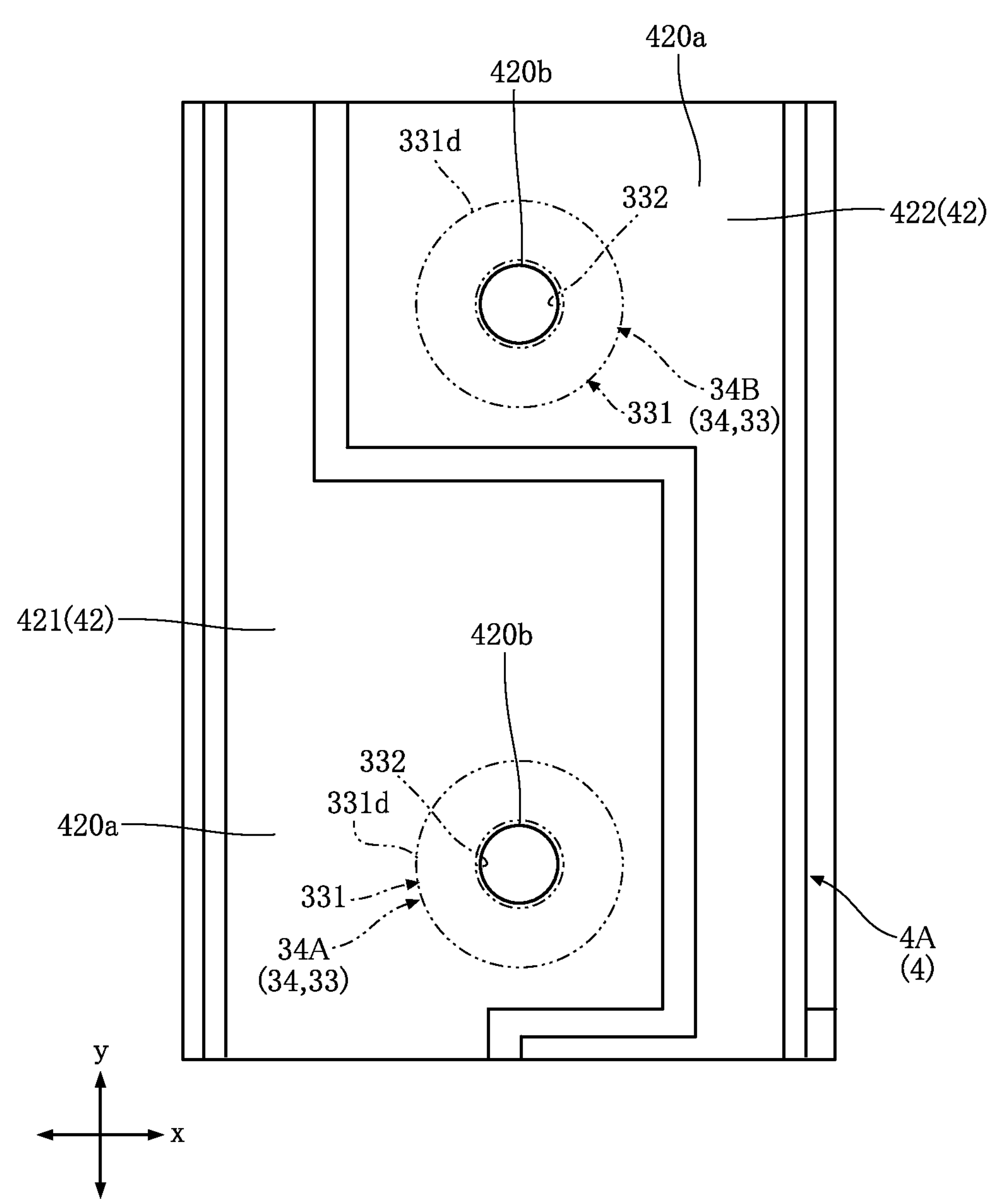
FIG. 25 is a partially enlarged plan view showing still another variation of the junction structure according to the present disclosure.

In the example shown in FIG. 25, the opening 420*b* of each of the conductive sections 421 to 424 is overlapping with the through-hole 332, in a plan view. In other words, in the junction structure shown in FIG. 25, the diameter r2 of the opening 420*b* in a plan view is smaller, compared with the junction structure of the foregoing semiconductor device A1.

Figure 26:
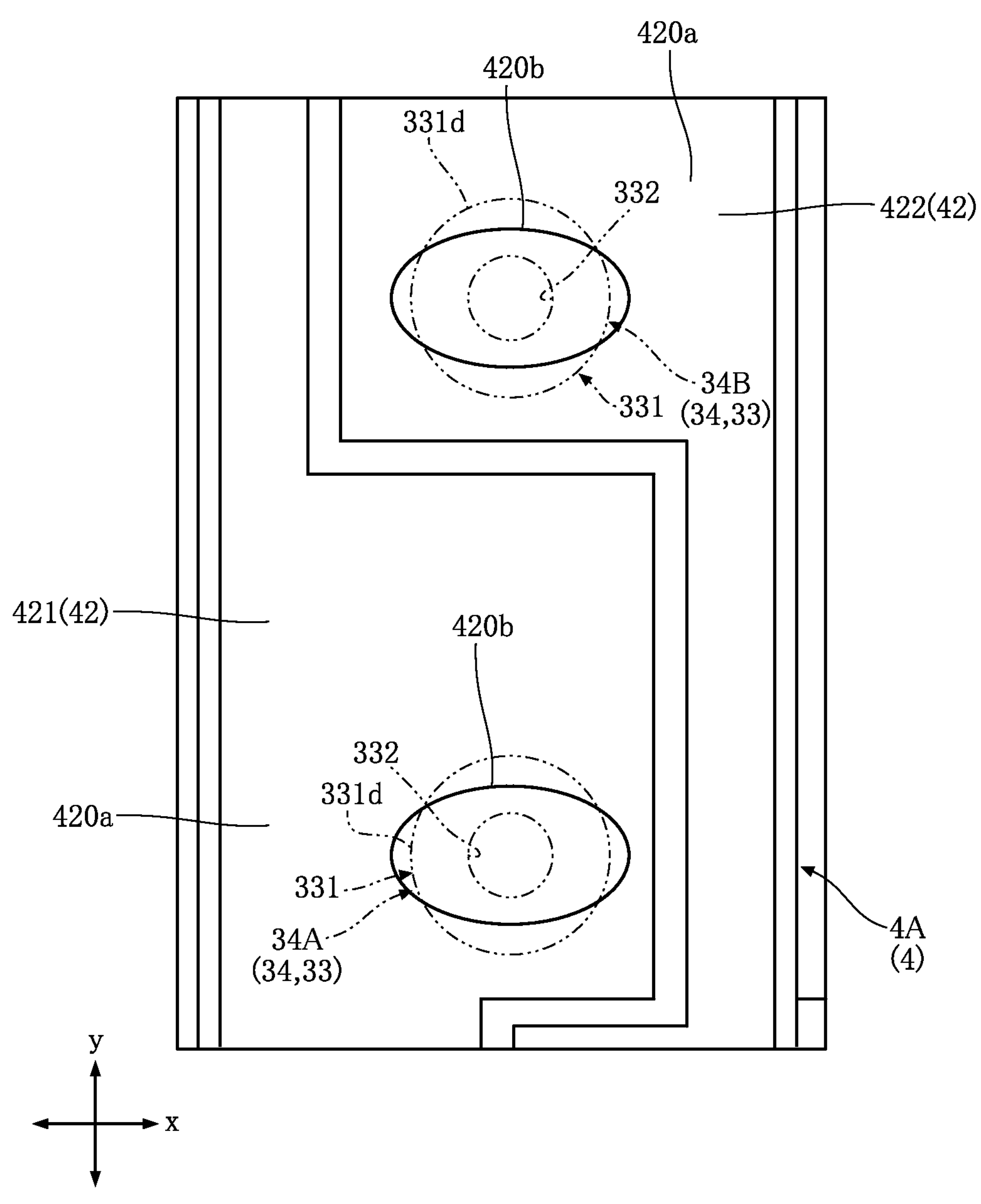
FIG. 26 is a partially enlarged plan view showing still another variation of the junction structure according to the present disclosure.

In the example shown in FIG. 26, the opening 420*b* of each of the conductive section 421 to 424 is formed in an elliptical shape in a plan view, and a part of the outer peripheral edge of the opening 420*b* is located on the outer side of the outer peripheral edge 331*d* of the holder 331, in a plan view. In the example shown in FIG. 26, although the major axis of the opening 420*b* extends along the first direction x in a plan view, the major axis may instead extend along any of the directions orthogonal to the thickness direction z.

Figure 27:
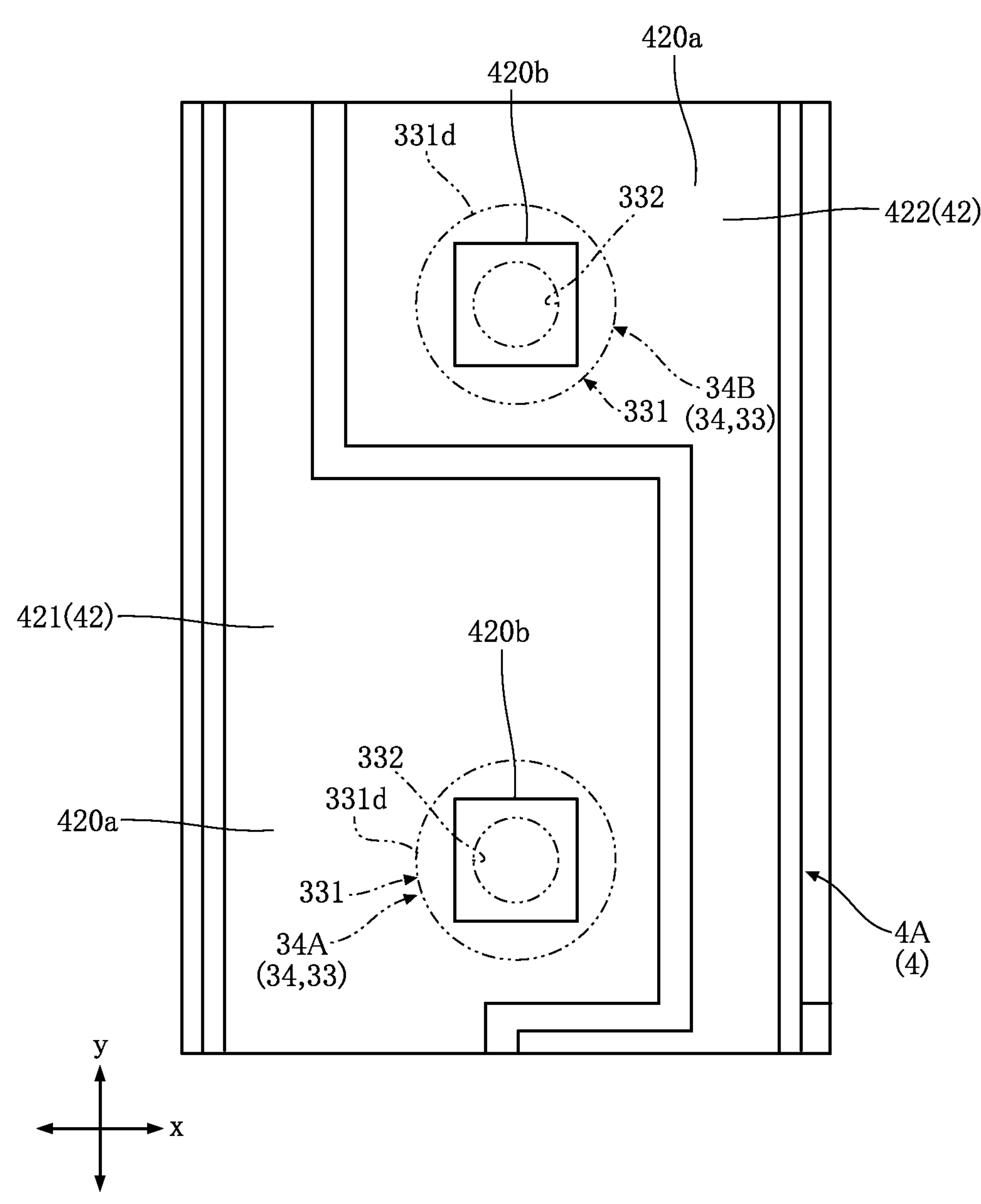
FIG. 27 is a partially enlarged plan view showing still another variation of the junction structure according to the present disclosure.

In the example shown in FIG. 27, the opening 420*b* of each of the conductive section 421 to 424 is formed in a rectangular shape, in a plan view.

Figure 28:
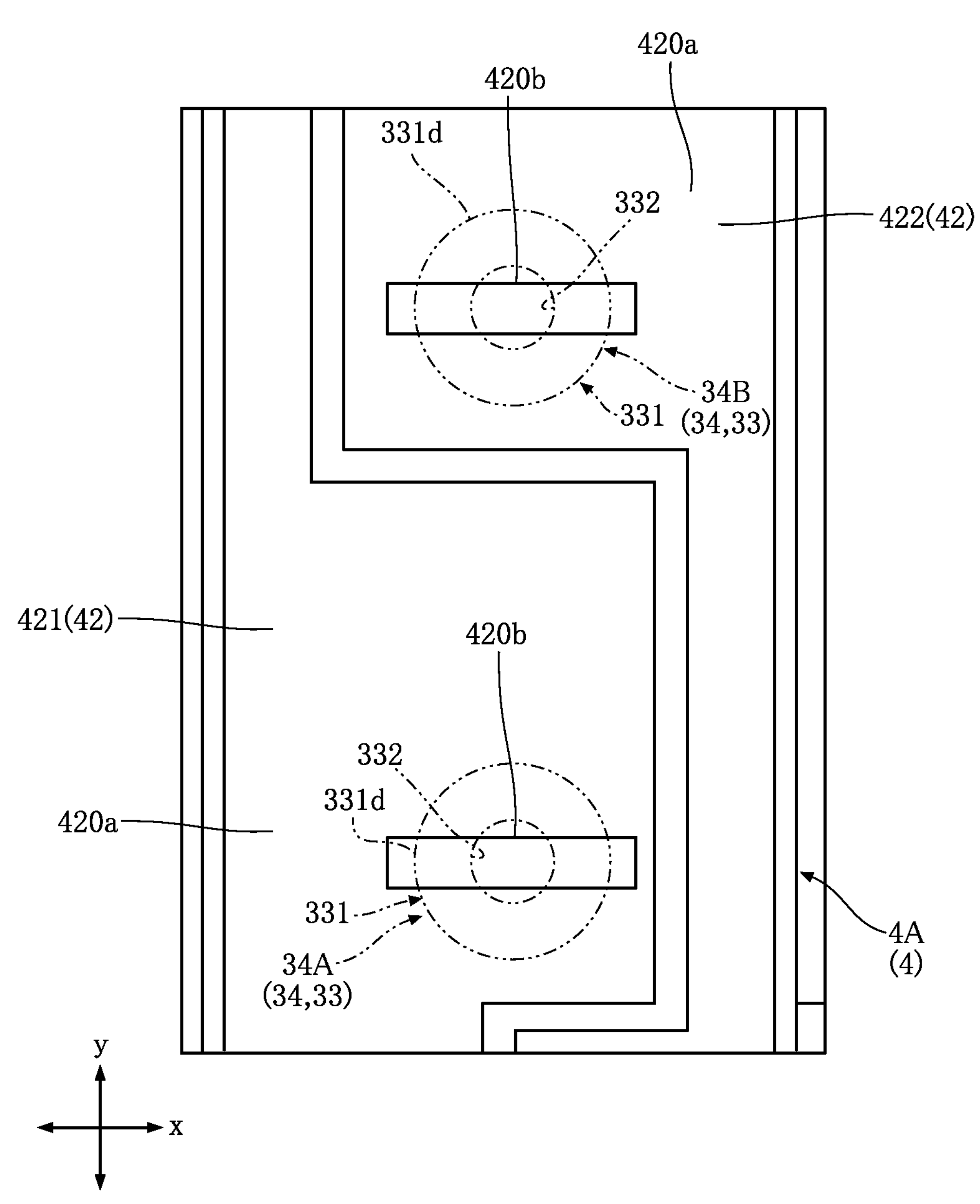
FIG. 28 is a partially enlarged plan view showing still another variation of the junction structure according to the present disclosure.

In the example shown in FIG. 28, the opening 420*b* of each of the conductive sections 421 to 424 is formed in a rectangular shape, in a plan view, like the example show in FIG. 27. However, unlike the example show in FIG. 27, a part of the outer peripheral edge of the opening 420*b* is located on the outer side of the outer peripheral edge 331*d* of the holder 331, in a plan view. In the example shown in FIG. 28, the long sides of the opening 420*b* extend along the first direction x, in a plan view. Alternatively, the long sides may extend along any of the directions orthogonal to the thickness direction z.

Figure 29:
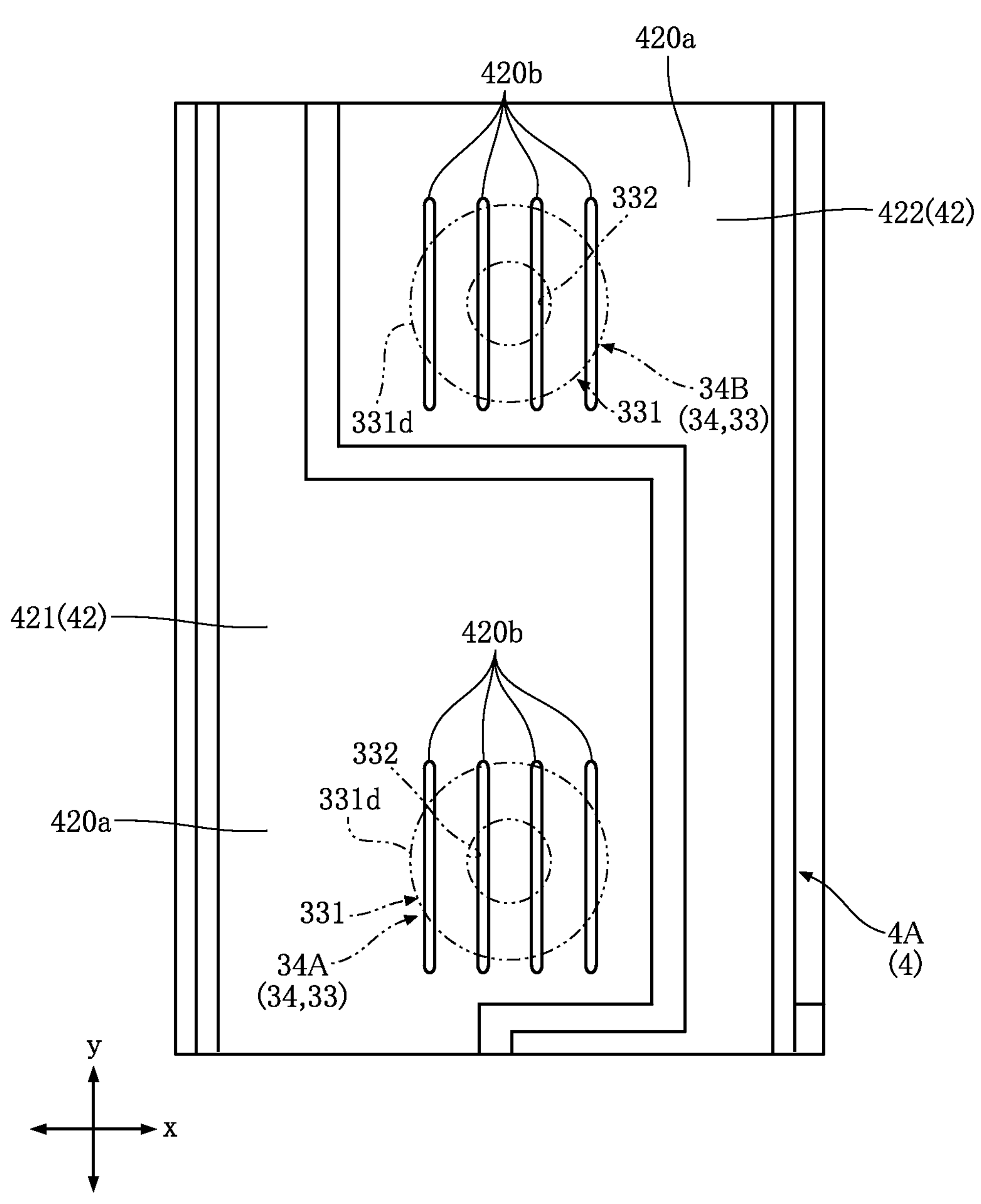
FIG. 29 is a partially enlarged plan view showing still another variation of the junction structure according to the present disclosure.

In the example shown in FIG. 29, the conductive sections 421 to 424 each include a plurality of openings 420*b*, each of which is formed in a linear shape, in a plan view. In each of the conductive sections 421 to 424, the plurality of openings 420*b* each extend in the second direction y, and are parallel to each other. Although the plurality of openings 420*b* each extend in the second direction y, in the example shown in FIG. 29, the openings 420*b* may extend along any of the directions orthogonal to the thickness direction z.

Figure 30:
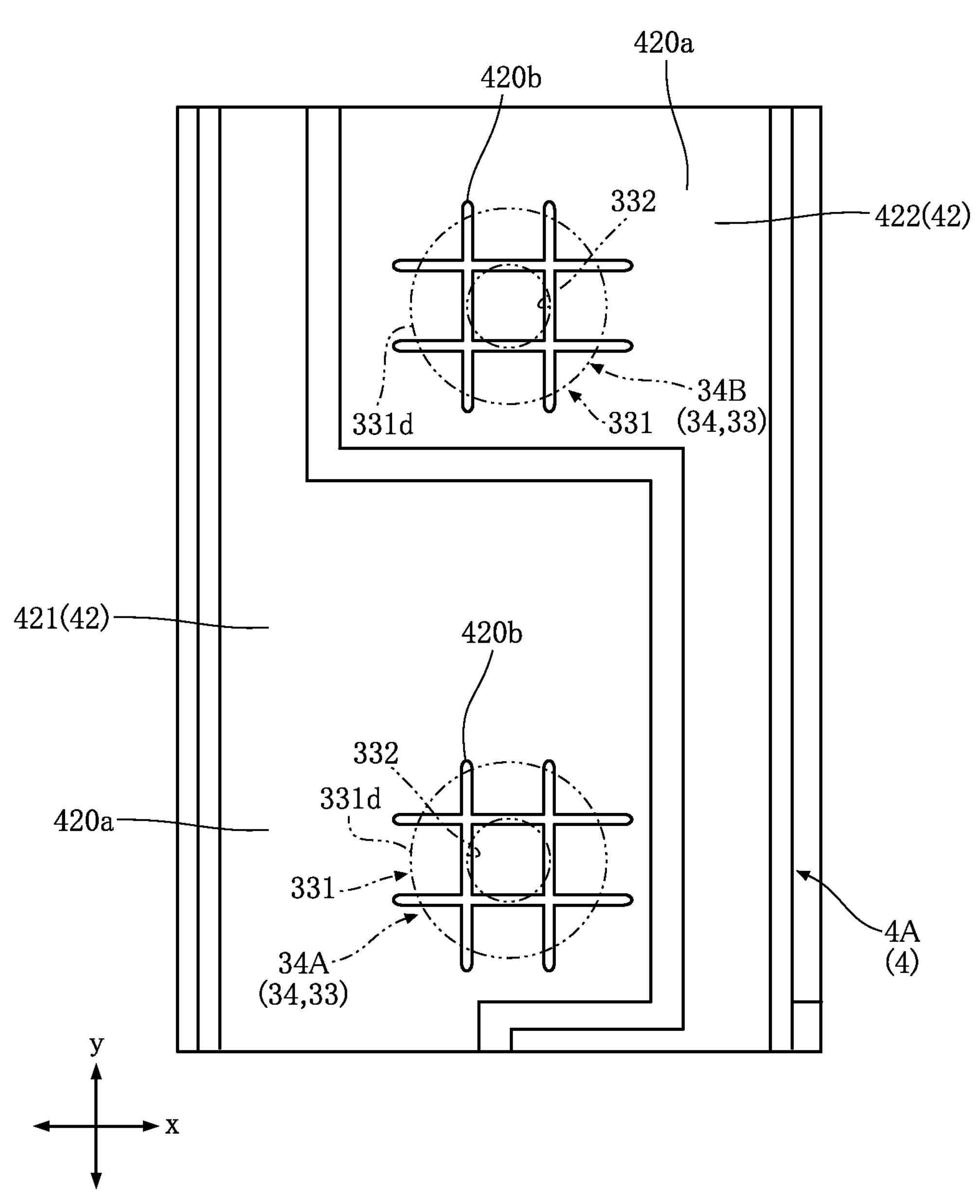
FIG. 30 is a partially enlarged plan view showing still another variation of the junction structure according to the present disclosure.

In the example shown in FIG. 30, the opening 420*b* of each of the conductive sections 421 to 424 is formed in a grid shape in a plan view, including two lines extending in the first direction x, and two lines extending in the second direction y so as to intersect the first mentioned two lines. Unlike the example shown in FIG. 30, the number of lines extending in the first direction x and the number of lines extending in the second direction y may each be three or more. Further, it is not mandatory that the lines extending in the first direction x and the lines extending in the second direction y are orthogonal to each other in a plan view, as shown in FIG. 30. It suffices that the lines intersect each other.

In all the junction structures shown in FIG. 23 to FIG. 30 also, at least a part of the outer peripheral edge of the opening 420*b* is located on the inner side of the outer peripheral edge 331*d* of the holder 331, in a plan view, like the junction structure between each of the conductive sections 421 to 424 and the control terminal 33, in the semiconductor device A1 according to the embodiment. Therefore, the conductive bonding material 63 is suppressed from intruding upward into the through-hole 332, and an adequate insertion depth of the metal pin 331 into the holder 331 can be secured.

Figure 31:
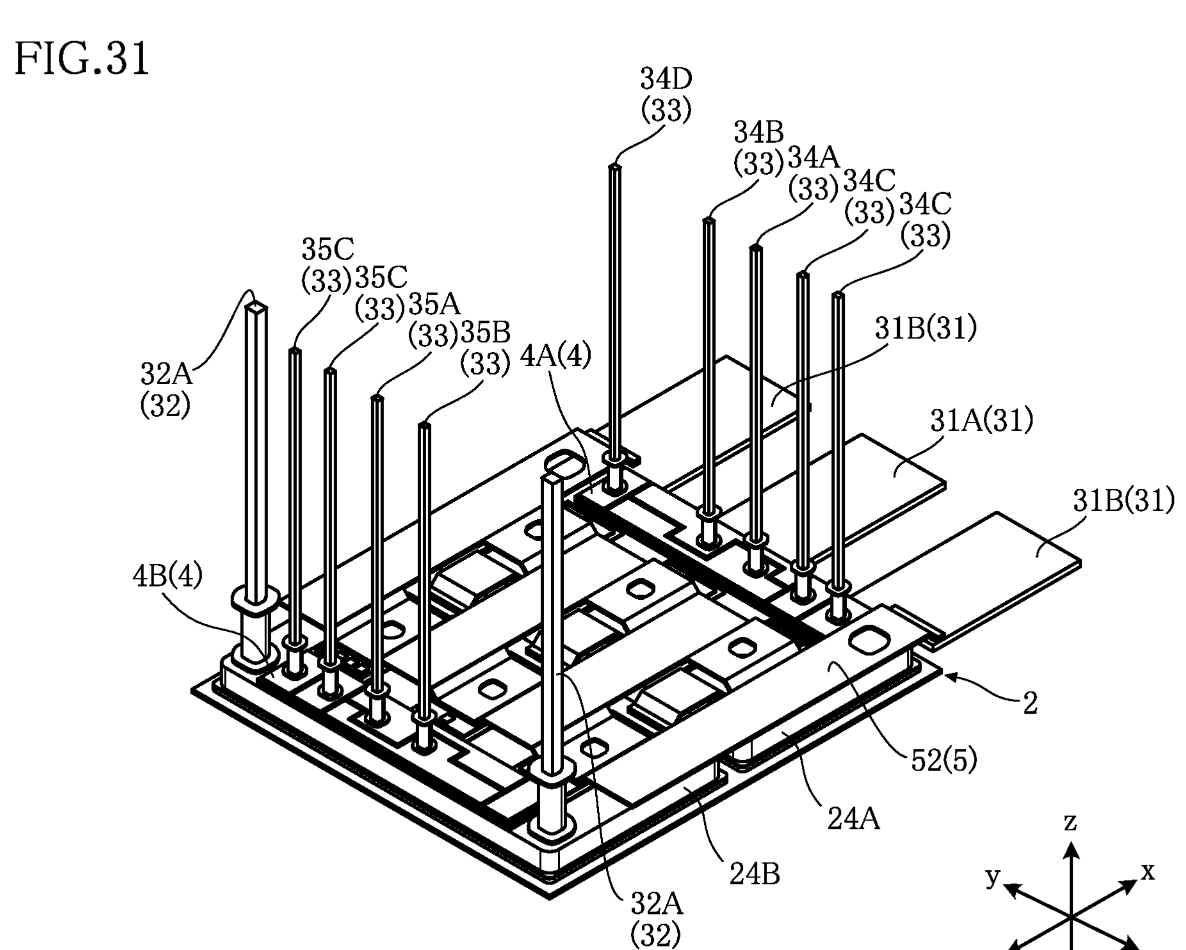
FIG. 31 is a perspective view showing a variation of the semiconductor device according to the present disclosure, from which the plurality of wires, the resin member, the resin portion, and the resin filling are excluded.

Whereas the plurality of control terminals 33 in the semiconductor device A1 each include the holder 331 and the metal pin 333, either or both of the first power terminal 31 and the second power terminal 32 may be configured in the same way as the control terminal 33. In the semiconductor device A1, for example, the second power terminal 32 (output terminal 32A) may include a holder and a metal pin, similar to the holder 331 and the metal pin 333 of the control terminal 33. FIG. 31 illustrates a semiconductor device according to such a variation. In the example shown in FIG. 31, the holder of each of the output terminals 32A is, for example, bonded to the second conductor 24B. In this case, a through-hole or a recess, similar to the through-hole 420*c* or the recess 420*d*, may be formed at a position on the second conductor 24B where the holder of the output terminal 32A is to be bonded. Here, since the main circuit current runs through the first power terminal 31 and the second power terminal 32, it is preferable to make the metal pin of the second power terminal 32 thicker than the metal pin 333 of the plurality of control terminals 33, as shown in FIG. 31. As described above, the junction structure according to the present disclosure is also applicable to the power terminal, without limitation to the signal terminal.

Although the foregoing embodiment represents the case where the junction structure according to the present disclosure is applied to the semiconductor device including the switching element, the junction structure according to the present disclosure may be applied to a semiconductor device including a semiconductor element other than the switching element (e.g., a diode), or to an electronic device including an electronic component other than the semiconductor element, such as a resistor, an inductor, a transformer, a capacitor, or an IC.

The junction structure and the semiconductor device according to the present disclosure are not limited to the foregoing embodiment and the variations thereof. The specific configuration of each of the elements of the junction structure and the semiconductor device according to the present disclosure may be modified in various manners. For example, the present disclosure encompasses embodiments defined in the following clauses.

Clause 1.

A junction structure including:

a conductive substrate having a conductive section;

a terminal including an electro-conductive tubular holder, and a metal pin inserted into the holder; and a conductive bonding material bonding the conductive section and the holder to each other, in which the metal pin includes a straight portion extending along a thickness direction of the conductive section, the holder includes a first through-hole extending in the thickness direction, and in which the straight portion of the metal pin is inserted, the conductive section includes a terminal bonding face to which the holder is bonded, and an opening formed in the terminal bonding face, and at least a part of an outer peripheral edge of the opening is located on an inner side of an outer peripheral edge of the holder, as viewed in the thickness direction.

Clause 2.

The junction structure according to clause 1, in which the holder includes a tubular portion, and an upper-end flange portion and a lower-end flange portion located on respective sides of the tubular portion in the thickness direction, the first through-hole penetrates through the tubular portion, the upper-end flange portion, and the lower-end flange portion in the thickness direction, and the lower-end flange portion is bonded to the conductive section.

Clause 3.

The junction structure according to clause 2, in which the outer peripheral edge of the holder corresponds to an outer peripheral edge of the lower-end flange portion, as viewed in the thickness direction.

Clause 4.

The junction structure according to clause 3, in which an entirety of the outer peripheral edge of the opening is overlapping with the lower-end flange portion, as viewed in the thickness direction.

Clause 5.

The junction structure according to any one of clause 2 to clause 4, in which the tubular portion and the first through-hole each have a circular shape, as viewed in the thickness direction.

Clause 6.

The junction structure according to clause 5, in which the conductive bonding material includes an inflow portion formed in the first through-hole, and the inflow portion extends in the thickness direction, from an end of the holder located on a side of the conductive section.

Clause 7.

The junction structure according to clause 6, in which a ratio of a size of the inflow portion in the thickness direction to a diameter of the first through-hole is between 10% and 65%, both ends inclusive.

Clause 8.

The junction structure according to any one of clause 1 to clause 7, in which an outer peripheral edge of the conductive bonding material is located on an outer side of the outer peripheral edge of the holder, as viewed in the thickness direction.

Clause 9.

The junction structure according to any one of clause 1 to clause 8, in which the conductive section includes a second through-hole connected to the opening, and the conductive bonding material is in contact with an inner surface of the second through-hole.

Clause 10.

The junction structure according to clause 9, in which the conductive substrate includes an insulation layer, the conductive section is stacked on one side of the insulation layer in the thickness direction, the insulation layer includes an exposed portion overlapping with the second through-hole as viewed in the thickness direction, and at least a part of the exposed portion is out of contact with the conductive bonding material.

Clause 11.

The junction structure according to any one of clause 1 to clause 8, in which the conductive section includes a recess connected to the opening.

Clause 12.

The junction structure according to clause 11, in which the conductive bonding material includes a filling portion formed in the recess.

Clause 13.

A semiconductor device including:

the junction structure according to any one of clause 1 to clause 12; and a semiconductor element electrically connected to the terminal.

Clause 14.

The semiconductor device according to clause 13, in which the terminal includes a control terminal that controls the semiconductor element.

Clause 15.

The semiconductor device according to clause 14, further including a first power terminal and a second power terminal, each electrically connected to the semiconductor element, in which a first source voltage is inputted to the first power terminal, and a second source voltage is inputted to the second power terminal.

Clause 16.

The semiconductor device according to clause 15, further including a first conductor and a second conductor, spaced apart from each other in a first direction orthogonal to the thickness direction, in which the semiconductor element includes a first semiconductor element bonded to the first conductor, and a second semiconductor element bonded to the second conductor, the conductive substrate includes a first conductive substrate bonded to the first conductor, and a second conductive substrate bonded to the second conductor, the conductive section includes a first conductive section bonded to the first conductive substrate, and a second conductive section bonded to the second conductive substrate, the first power terminal includes a first input terminal connected to the first conductor, and a second input terminal connected to the second semiconductor element, the second power terminal is an output terminal connected to the second conductor, and the control terminal includes a first control terminal bonded to the first conductive section, and configured to control the first semiconductor element, and a second control terminal bonded to the second conductive section, and configured to control the second semiconductor element.

Clause 17.

The semiconductor device according to clause 16, in which each of the first semiconductor element and the second semiconductor element is a switching element that performs a switching action, the first control terminal includes a first drive terminal that controls the switching action of the first semiconductor element, and a first detection terminal that detects a conduction status of the first semiconductor element, and the second control terminal includes a second drive terminal that controls the switching action of the second semiconductor element, and a second detection terminal that detects a conduction status of the second semiconductor element.

Clause 18.

The semiconductor device according to clause 17, further including a resin member covering a part of each of the first control terminal and the second control terminal, the first conductive substrate and the second conductive substrate, and the first semiconductor element and the second semiconductor element, in which the first control terminal and the second control terminal each protrude from the resin member in the thickness direction.

Clause 19.

The semiconductor device according to clause 18, in which the resin member includes a resin obverse face and a resin reverse face spaced apart from each other in the thickness direction, and a resin side face interposed between the resin obverse face and the resin reverse face in the thickness direction, the resin side face is oriented in the first direction, and the first power terminal and the second power terminal each protrude from the resin side face in the first direction.

REFERENCE NUMERALS

A1: Semiconductor device 1: Semiconductor element
1A: First semiconductor element
1B: Second semiconductor element
10*a*: Element obverse face 10*b*: Element reverse face
11: First obverse-face electrode
12: Second obverse-face electrode
13: Third obverse-face electrode
15: Reverse face electrode
Q1: Switching action unit D1: Diode function unit
D2: Diode 2: Base substrate 21: Insulation layer
21*a*: Obverse face 21*b*: Reverse face
22: Obverse face metal layer
22A: First supporting portion
22B: Second supporting portion
221: Bonding layer 23: Reverse face metal layer
24A: First conductor 24B: Second conductor
240*a*: Recess
241: Base material 242: Obverse face bonding layer
243: Reverse face bonding layer
25A, 25B: Conductive bonding material
251: Base layer 252: Upper layer 253: Lower layer
31: First power terminal 31A: Input terminal
31B: Input terminal 32: Second power terminal
32A: Output terminal 33: Control terminal 331: Holder
331*a*: Tubular portion 331*b*: Upper-end flange portion
331*c*: Lower-end flange portion
331*d*: Outer peripheral edge
332: Through-hole 333: Metal pin
333*a*: Straight portion
34: First control terminal 34A: First drive terminal
34B, 34C, 34D: First detection terminal
35: Second control terminal 35A: Second drive terminal
35B, 35C: Second detection terminal
4: Conductive substrate 4A: First conductive substrate
4B: Second conductive substrate
41: Insulation layer 41*a*: Obverse face
41*b*: Reverse face
410: Exposed portion 42: Obverse face metal layer
420*a*: Terminal bonding face 420*b*: Opening
420*c*: Through-hole 420*d*: Recess
421, 422, 423, 424: Conductive section
43: Reverse face metal layer 49: Bonding material
5: Conduction member 51: First conduction member
52: Second conduction member 521: First wiring section
522: Second wiring section 522*a*: Recessed region
523: Third wiring section 523*a*: Protruding region
524: Fourth wiring section 53: Opening
591, 592, 593: Conductive bonding material
61, 61A, 61B: Conductive bonding material
611: Base layer 612: Upper layer 613: Lower layer
63, 63A, 63B: Conductive bonding material
630: Void 631: Inflow portion 32: Filling portion
651: Wire 651A: Girst wire 651B: Second wire
652: Wire 652A: First wire 652B: Second wire
653: Wire 653A: First wire 653B: Second wire
654: Wire 654B: Second wire 7: Resin member
71: Resin obverse face 72: Resin reverse face
731 to 734: Resin side face 732*a*: Recess
751: First protruding portion
751*a*: First protruding end face
752: Second protruding portion 76: Resin cavity
77: Resin portion 78: Resin filling

The invention claimed is:

1. A junction structure comprising:

a conductive substrate including a conductive section;

a terminal including an electro-conductive tubular holder, and a metal pin inserted into the holder; and a conductive bonding material bonding the conductive section and the holder to each other, wherein the metal pin includes a straight portion extending along a thickness direction of the conductive section, the holder includes a first through-hole extending in the thickness direction, and in which the straight portion of the metal pin is inserted, the conductive section includes a terminal bonding face to which the holder is bonded, and an opening formed in the terminal bonding face, at least a part of an outer peripheral edge of the opening is located on an inner side of an outer peripheral edge of the holder, as viewed in the thickness direction, the holder includes a tubular portion, and an upper-end flange portion and a lower-end flange portion located on respective sides of the tubular portion in the thickness direction, the first through-hole penetrates through the tubular portion, the upper-end flange portion, and the lower-end flange portion in the thickness direction, and the lower-end flange portion is bonded to the conductive section.

2. The junction structure according to claim 1, wherein the outer peripheral edge of the holder corresponds to an outer peripheral edge of the lower-end flange portion, as viewed in the thickness direction.

3. The junction structure according to claim 2, wherein an entirety of the outer peripheral edge of the opening is overlapping with the lower-end flange portion, as viewed in the thickness direction.

4. The junction structure according to claim 1, wherein the tubular portion and the first through-hole each have a circular shape, as viewed in the thickness direction.

5. The junction structure according to claim 4, wherein the conductive bonding material includes an inflow portion formed in the first through-hole, and the inflow portion extends in the thickness direction, from an end of the holder located on a side of the conductive section.

6. The junction structure according to claim 5, wherein a ratio of a size of the inflow portion in the thickness direction to a diameter of the first through-hole is between 10% and 65%, both ends inclusive.

7. The junction structure according to claim 1, wherein the conductive section includes a second through-hole connected to the opening, and the conductive bonding material is in contact with an inner surface of the second through-hole.

8. The junction structure according to claim 7, wherein the conductive substrate includes an insulation layer, the conductive section is stacked on one side of the insulation layer in the thickness direction, the insulation layer includes an exposed portion overlapping with the second through-hole as viewed in the thickness direction, and at least a part of the exposed portion is out of contact with the conductive bonding material.

9. The junction structure according to claim 1, wherein the conductive section includes a recess connected to the opening.

10. The junction structure according to claim 9, wherein the conductive bonding material includes a filling portion formed in the recess.

11. A semiconductor device comprising:

a junction structure according to claim 1; and a semiconductor element electrically connected to the terminal.

12. The semiconductor device according to claim 11, wherein the terminal includes a control terminal that controls the semiconductor element.

13. The semiconductor device according to claim 12, further comprising:

a first power terminal; and a second power terminal, each electrically connected to the semiconductor element, wherein a first source voltage is inputted to the first power terminal, and a second source voltage is inputted to the second power terminal.

14. The semiconductor device according to claim 13, further comprising:

a first conductor; and a second conductor, spaced apart from each other in a first direction orthogonal to the thickness direction, wherein the semiconductor element includes a first semiconductor element bonded to the first conductor, and a second semiconductor element bonded to the second conductor, the conductive substrate includes a first conductive substrate bonded to the first conductor, and a second conductive substrate bonded to the second conductor, the conductive section includes a first conductive section bonded to the first conductive substrate, and a second conductive section bonded to the second conductive substrate, the first power terminal includes a first input terminal connected to the first conductor, and a second input terminal connected to the second semiconductor element, the second power terminal is an output terminal connected to the second conductor, and the control terminal includes a first control terminal bonded to the first conductive section, and configured to control the first semiconductor element, and a second control terminal bonded to the second conductive section, and is configured to control the second semiconductor element.

15. The semiconductor device according to claim 14, wherein each of the first semiconductor element and the second semiconductor element is a switching element that performs a switching action, the first control terminal includes a first drive terminal that controls the switching action of the first semiconductor element, and a first detection terminal that detects a conduction status of the first semiconductor element, and the second control terminal includes a second drive terminal that controls the switching action of the second semiconductor element, and a second detection terminal that detects a conduction status of the second semiconductor element.

16. The semiconductor device according to claim 15, further comprising:

a resin member covering a part of each of the first control terminal and the second control terminal, the first conductive substrate and the second conductive substrate, and the first semiconductor element and the second semiconductor element, wherein the first control terminal and the second control terminal each protrude from the resin member in the thickness direction.

17. The semiconductor device according to claim 16, wherein the resin member includes a resin obverse face and a resin reverse face spaced apart from each other in the thickness direction, and a resin side face interposed between the resin obverse face and the resin reverse face in the thickness direction, the resin side face is oriented in the first direction, and the first power terminal and the second power terminal each protrude from the resin side face in the first direction.

18. A junction structure, comprising:

a conductive substrate including a conductive section;

a terminal including an electro-conductive tubular holder, and a metal pin inserted into the holder; and a conductive bonding material bonding the conductive section and the holder to each other, wherein the metal pin includes a straight portion extending along a thickness direction of the conductive section, the holder includes a first through-hole extending in the thickness direction, and in which the straight portion of the metal pin is inserted, the conductive section includes a terminal bonding face to which the holder is bonded, and an opening formed in the terminal bonding face, at least a part of an outer peripheral edge of the opening is located on an inner side of an outer peripheral edge of the holder, as viewed in the thickness direction, and an outer peripheral edge of the conductive bonding material is located on an outer side of the outer peripheral edge of the holder, as viewed in the thickness direction.

19. A semiconductor device comprising:

a junction structure according to claim 18; and a semiconductor element electrically connected to the terminal.

20. A junction structure comprising:

a conductive substrate including a conductive section;

a terminal including an electro-conductive tubular holder, and a metal pin inserted into the holder; and a conductive bonding material bonding the conductive section and the holder to each other, wherein the metal pin includes a straight portion extending along a thickness direction of the conductive section, the holder includes a first through-hole extending in the thickness direction, and in which the straight portion of the metal pin is inserted, the conductive section includes a terminal bonding face to which the holder is bonded, and an opening formed in the terminal bonding face, at least a part of an outer peripheral edge of the opening is located on an inner side of an outer peripheral edge of the holder, as viewed in the thickness direction, the conductive section includes a second through-hole connected to the opening, the conductive bonding material is in contact with an inner surface of the second through-hole, the conductive substrate includes an insulation layer, the conductive section is stacked on one side of the insulation layer in the thickness direction, the insulation layer includes an exposed portion overlapping with the second through-hole as viewed in the thickness direction, and at least a part of the exposed portion is out of contact with the conductive bonding material.

* * * * *